United States Patent
Hashimoto et al.

(10) Patent No.: US 12,063,803 B2
(45) Date of Patent: Aug. 13, 2024

(54) LIGHT-EMITTING ELEMENT INCLUDING LIGHT-EMITTING LAYER HAVING HOST MATERIAL

(71) Applicant: Semiconductor Energy Laboratory Co., Ltd., Atsugi (JP)

(72) Inventors: Naoaki Hashimoto, Kanagawa (JP); Tsunenori Suzuki, Kanagawa (JP); Satoshi Seo, Kanagawa (JP); Hiromi Seo, Kanagawa (JP); Hiromitsu Kido, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/356,716

(22) Filed: Jun. 24, 2021

(65) Prior Publication Data
US 2021/0391553 A1   Dec. 16, 2021

Related U.S. Application Data

(63) Continuation of application No. 16/791,231, filed on Feb. 14, 2020, now Pat. No. 11,050,032, which is a (Continued)

(30) Foreign Application Priority Data

Dec. 1, 2015 (JP) .................................. 2015-234485
Mar. 15, 2016 (JP) .................................. 2016-051071

(51) Int. Cl.
*H10K 50/11* (2023.01)
*H10K 50/15* (2023.01)
(Continued)

(52) U.S. Cl.
CPC .............. *H10K 50/11* (2023.02); *H10K 50/15* (2023.02); *H10K 50/16* (2023.02); *H10K 59/38* (2023.02);
(Continued)

(58) Field of Classification Search
CPC ............ H01L 51/5016; H01L 51/5056; H01L 51/5072; H01L 51/5284; H01L 51/5012;
(Continued)

(56) References Cited

U.S. PATENT DOCUMENTS

| | | | |
|---|---|---|---|
| 7,015,324 B2 | 3/2006 | Nomura et al. | |
| 7,061,270 B2 | 6/2006 | Karaki | |

(Continued)

FOREIGN PATENT DOCUMENTS

| | | |
|---|---|---|
| CN | 101258621 A | 9/2008 |
| CN | 102428589 A | 4/2012 |

(Continued)

OTHER PUBLICATIONS

Taiwanese Office Action (Application No. 110122031) dated Jan. 13, 2022.
(Continued)

*Primary Examiner* — Ida M Soward
(74) *Attorney, Agent, or Firm* — Fish & Richardson P.C.

(57) ABSTRACT

A light-emitting element that includes a fluorescent material and has a high emission efficiency is provided. A light-emitting element in which a delayed fluorescence component due to TTA accounts for a high proportion of emissive components is provided. A novel light-emitting device with a high emission efficiency and a low power consumption is provided. A light-emitting element includes an anode, a cathode, and an EL layer. The EL layer includes a light-emitting layer including a host material and an electron-transport layer including a first material in contact with the
(Continued)

light-emitting layer. The LUMO level of the first material is lower than that of the host material. The proportion of a delayed fluorescence component due to TTA is greater than or equal to 10 percent of the light emission from the EL layer. The proportion of the delayed fluorescence component due to TTA may be greater than or equal to 15 percent of the light emission.

20 Claims, 26 Drawing Sheets

Related U.S. Application Data continuation of application No. 15/985,748, filed on May 22, 2018, now Pat. No. 10,573,837, which is a continuation of application No. 15/362,932, filed on Nov. 29, 2016, now Pat. No. 9,985,233.

(51) Int. Cl.
| | |
|---|---|
| *H10K 50/16* | (2023.01) |
| *H10K 59/38* | (2023.01) |
| *G09G 3/3266* | (2016.01) |
| *G09G 3/3275* | (2016.01) |
| *H01L 27/146* | (2006.01) |
| *H10K 50/14* | (2023.01) |
| *H10K 50/17* | (2023.01) |
| *H10K 50/818* | (2023.01) |
| *H10K 50/842* | (2023.01) |
| *H10K 50/856* | (2023.01) |
| *H10K 50/86* | (2023.01) |
| *H10K 59/121* | (2023.01) |
| *H10K 59/126* | (2023.01) |
| *H10K 59/131* | (2023.01) |
| *H10K 59/32* | (2023.01) |
| *H10K 59/35* | (2023.01) |
| *H10K 59/40* | (2023.01) |
| *H10K 85/60* | (2023.01) |
| *H10K 101/00* | (2023.01) |
| *H10K 101/10* | (2023.01) |

(52) U.S. Cl.
CPC ......... *G09G 3/3266* (2013.01); *G09G 3/3275* (2013.01); *G09G 2300/0408* (2013.01); *G09G 2300/0804* (2013.01); *H01L 27/14678* (2013.01); *H10K 50/14* (2023.02); *H10K 50/17* (2023.02); *H10K 50/171* (2023.02); *H10K 50/818* (2023.02); *H10K 50/8426* (2023.02); *H10K 50/856* (2023.02); *H10K 50/865* (2023.02); *H10K 59/1216* (2023.02); *H10K 59/126* (2023.02); *H10K 59/131* (2023.02); *H10K 59/32* (2023.02); *H10K 59/35* (2023.02); *H10K 59/40* (2023.02); *H10K 85/615* (2023.02); *H10K 85/622* (2023.02); *H10K 85/626* (2023.02); *H10K 85/633* (2023.02); *H10K 85/654* (2023.02); *H10K 85/6572* (2023.02); *H10K 85/6576* (2023.02); *H10K 2101/10* (2023.02); *H10K 2101/90* (2023.02)

(58) Field of Classification Search
CPC ............ H01L 51/5246; H01L 51/5048; H01L 51/5088; H01L 51/5092; H01L 51/5218; H01L 51/5271; H01L 2251/552; H01L 2251/5384; H01L 27/3211; H01L 27/3272; H01L 27/323; H01L 27/14678; H01L 27/3276; H01L 27/3265; G09G 2300/0408; G09G 2300/0804; G09G 3/3266; G09G 2300/3275; H10K 50/11; H10K 50/15; H10K 50/16; H10K 50/14; H10K 50/17; H10K 50/171; H10K 50/818; H10K 50/8426; H10K 50/856; H10K 50/865; H10K 59/38; H10K 59/1216; H10K 59/126; H10K 59/131; H10K 59/32; H10K 59/35; H10K 59/40; H10K 2101/10; H10K 2101/90; H10K 2101/40; H10K 59/30

See application file for complete search history.

(56) References Cited

U.S. PATENT DOCUMENTS

| | | | |
|---|---|---|---|
| 7,175,922 B2 | 2/2007 | Jarikov et al. | |
| 7,183,010 B2 | 2/2007 | Jarikov | |
| 7,332,857 B2 | 2/2008 | Seo et al. | |
| 7,597,967 B2 | 10/2009 | Kondakova et al. | |
| 7,608,993 B2 | 10/2009 | Matsuura et al. | |
| 7,683,536 B2 | 3/2010 | Forrest et al. | |
| 7,768,194 B2 | 8/2010 | Forrest et al. | |
| 7,929,200 B2 | 4/2011 | Miteva et al. | |
| 7,943,925 B2 * | 5/2011 | Yamazaki | H10K 50/11 313/504 |
| 7,993,760 B2 | 8/2011 | Komori et al. | |
| 8,034,465 B2 | 10/2011 | Liao et al. | |
| 8,274,214 B2 | 9/2012 | Ikeda et al. | |
| 8,299,458 B2 | 10/2012 | Terao et al. | |
| 8,354,674 B2 | 1/2013 | Kimura | |
| 8,643,268 B2 | 2/2014 | Ogiwara et al. | |
| 8,853,680 B2 | 10/2014 | Yamazaki et al. | |
| 8,883,323 B2 | 11/2014 | Kawamura et al. | |
| 8,920,020 B2 | 12/2014 | Noishiki et al. | |
| 8,963,127 B2 | 2/2015 | Pieh et al. | |
| 8,981,355 B2 | 3/2015 | Seo | |
| 8,993,129 B2 | 3/2015 | Endo et al. | |
| 8,994,013 B2 * | 3/2015 | Seo | H10K 50/15 257/89 |
| 8,994,263 B2 | 3/2015 | Shitagaki et al. | |
| 9,054,317 B2 | 6/2015 | Monkman et al. | |
| 9,059,430 B2 * | 6/2015 | Seo | C09K 11/06 |
| 9,065,066 B2 * | 6/2015 | Seo | H10K 50/171 |
| 9,076,976 B2 * | 7/2015 | Seo | H10K 85/6572 |
| 9,115,119 B2 | 8/2015 | Wong et al. | |
| 9,127,032 B2 | 9/2015 | Inoue et al. | |
| 9,142,710 B2 | 9/2015 | Seo et al. | |
| 9,159,942 B2 * | 10/2015 | Seo | H10K 50/11 |
| 9,175,213 B2 | 11/2015 | Seo et al. | |
| 9,224,963 B2 | 12/2015 | Li et al. | |
| 9,269,906 B2 * | 2/2016 | Suzuki | H10K 50/11 |
| 9,293,709 B2 | 3/2016 | Pillow | |
| 9,324,950 B2 | 4/2016 | Kawamura et al. | |
| 9,356,250 B2 | 5/2016 | Ohsawa et al. | |
| 9,406,894 B2 | 8/2016 | Inoue et al. | |
| 9,493,613 B2 | 11/2016 | Humphries et al. | |
| 9,508,949 B2 | 11/2016 | Jeong et al. | |
| 9,515,279 B2 | 12/2016 | Ishisone et al. | |
| 9,525,149 B2 | 12/2016 | Seo et al. | |
| 9,534,006 B2 | 1/2017 | Inoue et al. | |
| 9,548,468 B2 | 1/2017 | Seo et al. | |
| 9,559,324 B2 | 1/2017 | Seo et al. | |
| 9,562,136 B2 | 2/2017 | Humphries et al. | |
| 9,604,928 B2 | 3/2017 | Shitagaki et al. | |
| 9,653,705 B2 | 5/2017 | Uesaka et al. | |
| 9,663,711 B2 | 5/2017 | Takeda et al. | |
| 9,666,822 B2 | 5/2017 | Forrest et al. | |
| 9,676,900 B2 | 6/2017 | Heidenhain et al. | |
| 9,735,370 B2 | 8/2017 | Middleton | |
| 9,761,820 B2 | 9/2017 | Pillow et al. | |
| 9,859,499 B2 | 1/2018 | Pegington et al. | |
| 9,887,369 B2 | 2/2018 | Ishiguro et al. | |
| 9,911,936 B2 | 3/2018 | Seo et al. | |
| 10,069,076 B2 | 9/2018 | Hamada et al. | |
| 10,121,984 B2 | 11/2018 | Seo et al. | |
| 10,128,455 B2 | 11/2018 | Nonaka et al. | |
| 10,158,077 B2 | 12/2018 | Middleton et al. | |

(56) References Cited

U.S. PATENT DOCUMENTS

| | | | |
|---|---|---|---|
| 10,270,037 B2 | 4/2019 | Humphries et al. | |
| 10,276,819 B2 | 4/2019 | Tsukamoto et al. | |
| 10,312,453 B2 | 6/2019 | Qiu et al. | |
| 10,374,166 B2 | 8/2019 | Hatakeyama et al. | |
| 10,396,287 B2 | 8/2019 | Pillow et al. | |
| 10,454,054 B2 | 10/2019 | Ishisone et al. | |
| 10,535,830 B2 * | 1/2020 | Sasaki | H10K 50/19 |
| 10,580,992 B2 | 3/2020 | Pegington et al. | |
| 10,879,482 B2 | 12/2020 | Ogiwara et al. | |
| 2003/0015960 A1 * | 1/2003 | Seo | H10K 50/11 |
| | | | 313/504 |
| 2003/0175553 A1 | 9/2003 | Thompson et al. | |
| 2004/0202893 A1 * | 10/2004 | Abe | H10K 50/125 |
| | | | 313/506 |
| 2005/0048310 A1 | 3/2005 | Cocchi et al. | |
| 2005/0221116 A1 | 10/2005 | Cocchi et al. | |
| 2006/0063032 A1 | 3/2006 | Matsusue | |
| 2006/0134464 A1 | 6/2006 | Nariyuki | |
| 2007/0090756 A1 | 4/2007 | Okada et al. | |
| 2007/0145885 A1 * | 6/2007 | Tadokoro | A63H 31/00 |
| | | | 257/E51.026 |
| 2007/0222376 A1 * | 9/2007 | Ohsawa | H10K 50/13 |
| | | | 428/917 |
| 2009/0208776 A1 | 8/2009 | Liu et al. | |
| 2010/0059741 A1 * | 3/2010 | Ohsawa | H10K 50/11 |
| | | | 257/40 |
| 2010/0193785 A1 | 8/2010 | Kimura | |
| 2010/0301319 A1 | 12/2010 | Kuma et al. | |
| 2011/0121320 A1 | 5/2011 | Pieh et al. | |
| 2012/0097982 A1 * | 4/2012 | Wakimoto | H01L 33/36 |
| | | | 257/E33.076 |
| 2012/0097998 A1 | 4/2012 | Pieh et al. | |
| 2012/0126205 A1 | 5/2012 | Kawamura et al. | |
| 2012/0126208 A1 | 5/2012 | Kawamura et al. | |
| 2012/0153268 A1 | 6/2012 | Kawamura et al. | |
| 2012/0211743 A1 | 8/2012 | Ito et al. | |
| 2012/0217487 A1 | 8/2012 | Yamazaki et al. | |
| 2012/0248421 A1 * | 10/2012 | Yamazaki | H10K 50/13 |
| | | | 257/E51.024 |
| 2012/0330025 A1 * | 12/2012 | Osaka | H10K 85/342 |
| | | | 548/219 |
| 2013/0048964 A1 * | 2/2013 | Takeda | H10K 85/626 |
| | | | 257/E51.026 |
| 2013/0060033 A1 * | 3/2013 | Seo | C07D 403/10 |
| | | | 544/343 |
| 2013/0105777 A1 | 5/2013 | Adamovich et al. | |
| 2013/0187147 A1 | 7/2013 | King et al. | |
| 2014/0084273 A1 * | 3/2014 | Nakayama | C07D 487/14 |
| | | | 257/40 |
| 2014/0084274 A1 * | 3/2014 | Yamazaki | H10K 50/11 |
| | | | 257/40 |
| 2014/0103329 A1 | 4/2014 | Ogiwara et al. | |
| 2014/0231786 A1 | 8/2014 | Shin | |
| 2014/0252339 A1 | 9/2014 | King et al. | |
| 2014/0339522 A1 | 11/2014 | Nonaka et al. | |
| 2015/0001515 A1 | 1/2015 | Steudel | |
| 2015/0060824 A1 | 3/2015 | Ishiguro et al. | |
| 2015/0069352 A1 | 3/2015 | Kim et al. | |
| 2015/0311449 A1 | 10/2015 | Yeh et al. | |
| 2015/0311454 A1 | 10/2015 | Inoue et al. | |
| 2015/0318495 A1 | 11/2015 | Kawakami et al. | |
| 2016/0064684 A1 * | 3/2016 | Seo | H01L 51/5012 |
| | | | 257/40 |
| 2016/0093823 A1 * | 3/2016 | Seo | H01L 51/5028 |
| | | | 257/40 |
| 2016/0118625 A1 | 4/2016 | Uesaka et al. | |
| 2016/0126463 A1 * | 5/2016 | Kadoma | H01L 51/0054 |
| | | | 548/445 |
| 2016/0248032 A1 | 8/2016 | Seo et al. | |
| 2016/0254459 A1 | 9/2016 | Kawamura et al. | |
| 2016/0268516 A1 | 9/2016 | Tanaka et al. | |
| 2016/0268536 A1 | 9/2016 | Ohsawa et al. | |
| 2016/0329502 A1 | 11/2016 | Dyatkin et al. | |
| 2016/0380223 A1 | 12/2016 | Nonaka et al. | |
| 2017/0053970 A1 | 2/2017 | Ishisone et al. | |
| 2017/0092878 A1 | 3/2017 | Seo et al. | |
| 2017/0263872 A1 | 9/2017 | Ma et al. | |
| 2018/0145273 A1 | 5/2018 | Seo et al. | |
| 2019/0140204 A1 | 5/2019 | Seo et al. | |
| 2019/0157314 A1 | 5/2019 | Kimura | |
| 2019/0173037 A1 | 6/2019 | Seo et al. | |
| 2019/0214567 A1 | 7/2019 | Kadoma et al. | |
| 2020/0144513 A1 | 5/2020 | Hatakeyama et al. | |
| 2020/0144514 A1 | 5/2020 | Hatakeyama et al. | |
| 2020/0144515 A1 | 5/2020 | Hatakeyama et al. | |
| 2021/0074941 A1 | 3/2021 | Ogiwara et al. | |

FOREIGN PATENT DOCUMENTS

| | | | |
|---|---|---|---|
| CN | 102473857 A | 5/2012 | |
| CN | 102574797 A | 7/2012 | |
| CN | 102668159 A | 9/2012 | |
| CN | 103579515 A | 2/2014 | |
| CN | 104247077 A | 12/2014 | |
| CN | 105098086 A | 11/2015 | |
| EP | 1202608 A | 5/2002 | |
| EP | 1923930 A | 5/2008 | |
| EP | 2067839 A | 6/2009 | |
| EP | 2075304 A | 7/2009 | |
| EP | 2434559 A | 3/2012 | |
| EP | 2525425 A | 11/2012 | |
| EP | 2626346 A | 8/2013 | |
| EP | 2643866 A | 10/2013 | |
| EP | 2690681 A | 1/2014 | |
| EP | 2887417 A | 6/2015 | |
| EP | 3109253 A | 12/2016 | |
| EP | 3345911 A | 7/2018 | |
| EP | 3598520 A | 1/2020 | |
| JP | 2004281274 A * | 10/2004 | H10K 50/125 |
| JP | 2008-288344 A | 11/2008 | |
| JP | 5208271 | 6/2013 | |
| JP | 5238889 | 7/2013 | |
| JP | 2014-503979 | 2/2014 | |
| JP | 2015-109407 A | 6/2015 | |
| JP | 5909179 | 4/2016 | |
| JP | 2016-092417 A | 5/2016 | |
| KR | 2012-0024624 A | 3/2012 | |
| KR | 2012-0092550 A | 8/2012 | |
| KR | 2012-0100709 A | 9/2012 | |
| KR | 2013-0025858 A | 3/2013 | |
| KR | 2016-0008570 A | 1/2016 | |
| TW | 200504997 | 2/2005 | |
| TW | 200917419 | 4/2009 | |
| TW | 200935639 | 8/2009 | |
| TW | 201101922 | 1/2011 | |
| TW | 201144406 | 12/2011 | |
| TW | 201215659 | 4/2012 | |
| TW | 201232864 | 8/2012 | |
| TW | 201248965 | 12/2012 | |
| TW | 201336968 | 9/2013 | |
| TW | 201507546 | 2/2015 | |
| TW | 201538513 | 10/2015 | |
| WO | WO-2007/029426 | 3/2007 | |
| WO | WO-2009069535 A1 * | 6/2009 | C09K 11/06 |
| WO | WO-2010026859 A1 * | 3/2010 | H01L 51/5012 |
| WO | WO-2010/134352 | 11/2010 | |
| WO | WO-2011/086941 | 7/2011 | |
| WO | WO-2012/046389 | 4/2012 | |
| WO | WO-2012/046839 | 4/2012 | |
| WO | WO-2012/070233 | 5/2012 | |
| WO | WO-2012/070234 | 5/2012 | |
| WO | WO-2012/104579 | 8/2012 | |
| WO | WO-2012/104628 | 8/2012 | |
| WO | WO-2013/005026 | 1/2013 | |
| WO | WO-2013/005028 | 1/2013 | |
| WO | WO-2013/005029 | 1/2013 | |
| WO | WO-2013/005031 | 1/2013 | |
| WO | WO-2013/064793 | 5/2013 | |
| WO | WO-2013/064794 | 5/2013 | |
| WO | WO-2013/064814 | 5/2013 | |
| WO | WO-2013/093400 | 6/2013 | |
| WO | WO-2013/093490 | 6/2013 | |
| WO | WO-2013/108022 | 7/2013 | |

(56) References Cited

FOREIGN PATENT DOCUMENTS

| WO | WO-2013/108023 | 7/2013 |
| WO | WO-2013/157506 | 10/2013 |
| WO | WO-2014/185434 | 11/2014 |

OTHER PUBLICATIONS

Suzuki.T et al., "Highly efficient long-life blue fluorescent organic light-emitting diode exhibiting triplet-triplet annihilation effects enhanced by a novel hole-transporting material", Jpn. J. Appl. Phys. (Japanese Journal of Applied Physics), 2014, vol. 53, pp. 052102-1-052102-6.

Kondakov.D et al., "Triplet annihilation exceeding spin statistical limit in highly efficient fluorescent organic light-emitting diodes", J. Appl. Phys. (Journal of Applied Physics), Dec. 15, 2009, vol. 106, No. 12, pp. 124510-1-124510-7.

International Search Report (Application No. PCT/IB2016/056990) dated Mar. 21, 2017.

Written Opinion (Application No. PCT/IB2016/056990) dated Mar. 21, 2017.

Yersin.H et al., Highly Efficient OLEDs with Phosphorescent Materials, 2008, pp. 1-97,283-309, Wiley-VCH Verlag GmbH & Co.

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(Flrpic):Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics), Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different p. Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy On Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

Chinese Office Action (Application No. 201680070596.X) dated Dec. 2, 2019.

Taiwanese Office Action (Application No. 105139266) dated Jun. 16, 2020.

Li.B, "Efficient Thermally Activated Delayed Fluorescence Molecules Utilizing Donor-Acceptor Structure and Their Application for Highly Efficient Organic Light Emitting Diodes", 2014, pp. 1-84, Kyushu University.

German Office Action (Application No. 112016005489.0) Dated Nov. 24, 2023.

* cited by examiner

LIGHT-EMITTING ELEMENT INCLUDING LIGHT-EMITTING LAYER HAVING HOST MATERIAL

CROSS-REFERENCE TO RELATED APPLICATIONS

This application is a continuation of U.S. application Ser. No. 16/791,231, filed Feb. 14, 2020, now allowed, which is a continuation of U.S. application Ser. No. 15/985,748, filed May 22, 2018, now U.S. Pat. No. 10,573,837, which is a continuation of U.S. application Ser. No. 15/362,932, filed Nov. 29, 2016, now U.S. Pat. No. 9,985,233, which claims the benefit of foreign priority applications filed in Japan as Serial No. 2015-234485 on Dec. 1, 2015, and Serial No. 2016-051071 on Mar. 15, 2016, all of which are incorporated by reference.

TECHNICAL FIELD

One embodiment of the present invention relates to a light-emitting element, a display module, a lighting module, a display device, a light-emitting device, an electronic device, and a lighting device. Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. In particular, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

BACKGROUND ART

In recent years, light-emitting elements using electroluminescence (EL) have been actively researched and developed. In a basic structure of such a light-emitting element, a layer containing a light-emitting material (an EL layer) is interposed between a pair of electrodes. By applying a voltage between the pair of electrodes of this element, light emission from the light-emitting material can be obtained.

Since the above light-emitting element is of a self-luminous type, a display device using this light-emitting element has advantages such as high visibility, no necessity of a backlight, and low power consumption. Furthermore, the light-emitting element is also effective in reducing the thickness and weight of the display device and increasing the response speed thereof.

In a light-emitting element (e.g., an organic EL element) including an EL layer that contains an organic light-emitting material and is provided between a pair of electrodes, application of a voltage between the pair of electrodes causes injection of electrons from a cathode and holes from an anode into the EL layer having a light-emitting property and thus a current flows. Then, the injected electrons and holes recombine, so that the organic material having a light-emitting property is brought into an excited state to provide light emission.

The excited state formed by an organic material can be a singlet excited state ($S^*$) or a triplet excited state ($T^*$). Light emission from the singlet excited state is referred to as fluorescence, and light emission from the triplet excited state is referred to as phosphorescence. The statistical generation ratio of $S^*$ to $T^*$ in the light-emitting element is 1:3. In other words, a light-emitting element including a material emitting phosphorescence has a higher light emission efficiency than a light-emitting element including a material emitting fluorescence. Therefore, light-emitting elements including phosphorescent materials capable of converting a triplet excited state into light emission have been actively developed in recent years.

Among the light-emitting elements including phosphorescent materials, a light-emitting element that emits blue light has not been put into practical use yet because it is difficult to develop a stable material having a high triplet excitation energy level. For this reason, a more stable fluorescent material has been developed for a light-emitting element that emits blue light and a technique of increasing the emission efficiency of the light-emitting element including a fluorescent material has been searched.

As an emission mechanism capable of converting part of a triplet excited state into light emission, triplet-triplet annihilation (TTA) is known. The TTA refers to a process in which, when two triplet excitons approach each other, excitation energy is transferred and spin angular momentum is exchanged to form a singlet exciton.

As compounds in which TTA occurs, anthracene compounds are known. Non-Patent Document 1 discloses that the use of an anthracene compound as a host material in a light-emitting element that emits blue light achieves an external quantum efficiency exceeding 10%. It also discloses that the proportion of a delayed fluorescence component due to TTA in the anthracene compound is approximately 10% of emissive components of the light-emitting element.

Furthermore, tetracene compounds are known as compounds having a high proportion of a delayed fluorescence component due to TTA. Non-Patent Document 2 discloses that the delayed fluorescence component due to TTA in light emission from a tetracene compound accounts for a higher proportion than that for an anthracene compound.

Note that when TTA occurs, the lifetime of a fluorescent material significantly increases (delayed fluorescence is generated) as compared to the case where TTA does not occur. The delayed fluorescence in a light-emitting element can be confirmed by observing the attenuation of light emission after the steady injection of carriers is stopped at a certain point of time. Note that in that case, the spectrum of delayed fluorescence overlaps with the emission spectrum during the steady injection of carriers.

REFERENCE

Non-Patent Document

[Non-Patent Document 1] Tsunenori SUZUKI and six others, Japanese Journal of Applied Physics, vol. 53, 052102 (2014)

[Non-Patent Document 2] D. Y. Kondakov and three others, Journal of Applied Physics, vol. 106, 124510 (2009)

DISCLOSURE OF INVENTION

What is essential to improve the emission efficiency of a light-emitting element including a fluorescent material is that the energy of triplet excitons, which do not contribute to light emission, is converted into the energy of singlet excitons with light-emitting properties and the conversion efficiency is increased. In other words, it is important to convert the energy of triplet excitons into the energy of singlet excitons by TTA; in particular, the proportion of a delayed fluorescence component due to TTA in the emissive components of the light-emitting element should be increased. This is because an increased proportion of the delayed fluorescence component due to TTA means an increase in the production rate of singlet excitons with light-emitting properties.

In view of the above, an object of one embodiment of the present invention is to provide a light-emitting element that includes a fluorescent material and has a high emission efficiency. Another object of one embodiment of the present invention is to provide a light-emitting element in which a delayed fluorescence component due to TTA accounts for a high proportion of emissive components. Another object of one embodiment of the present invention is to provide a novel light-emitting device with a high emission efficiency and a low power consumption. Another object of one embodiment of the present invention is to provide a novel display device.

Note that the description of the above objects does not preclude the existence of other objects. One embodiment of the present invention does not necessarily achieve all the objects. Other objects are apparent from and can be derived from the description of the specification and the like.

One embodiment of the present invention is a light-emitting element including an anode, a cathode, and an EL layer between the anode and the cathode. The EL layer includes a light-emitting layer and an electron-transport layer in contact with the light-emitting layer. The light-emitting layer includes a host material. The electron-transport layer includes a first material. The LUMO (Lowest Unoccupied Molecular Orbital) level of the first material is lower than that of the host material. The proportion of a delayed fluorescence component due to triplet-triplet annihilation is greater than or equal to 10% of the entire light emission from the EL layer.

One embodiment of the present invention is a light-emitting element including an anode, a cathode, and an EL layer between the anode and the cathode. The EL layer includes a light-emitting layer and an electron-transport layer in contact with the light-emitting layer. The light-emitting layer includes a host material. The electron-transport layer includes a first material. The LUMO level of the first material is lower than that of the host material by greater than or equal to 0.05 eV. The proportion of a delayed fluorescence component due to triplet-triplet annihilation is greater than or equal to 10% of the entire light emission from the EL layer.

Note that in one embodiment of the present invention, the proportion of the delayed fluorescence component due to the triplet-triplet annihilation may be greater than or equal to 15% of the entire light emission from the EL layer. The first material may be a substance including a condensed heteroaromatic ring skeleton having a diazine skeleton or a triazine skeleton. The first material may be a substance including a pyrazine skeleton or a pyrimidine skeleton. The triplet excitation energy of the first material may be higher than that of a substance that has the highest triplet excitation energy among the materials contained in the light-emitting layer by greater than or equal to 0.2 eV.

One embodiment of the present invention may be a light-emitting element including a hole-transport layer in contact with the light-emitting layer. The hole-transport layer includes a second material. The LUMO level of the second material is higher than that of the host material. Alternatively, in the light-emitting element including the hole-transport layer in contact with the light-emitting layer, the hole-transport layer may include the second material and the triplet excitation energy of the second material may be higher than that of a substance that has the highest triplet excitation energy among the materials contained in the light-emitting layer by greater than or equal to 0.2 eV.

One embodiment of the present invention may be a light-emitting element including the light-emitting layer further containing a fluorescent material. The triplet excitation energy of the fluorescent material may be higher than that of the host material. The LUMO level of the fluorescent material may be higher than or equal to that of the host material. The light-emitting layer may emit blue light.

One embodiment of the present invention is a light-emitting device including the light-emitting element and a transistor or a substrate. Another embodiment of the present invention may be an electronic device including a sensor, an operation button, a speaker, or a microphone in addition to the light-emitting device. Another embodiment of the present invention may be a lighting device including a housing in addition to the light-emitting device.

According to one embodiment of the present invention, a light-emitting element that includes a fluorescent material and has a high emission efficiency can be provided. According to another embodiment of the present invention, a light-emitting element in which a delayed fluorescence component due to TTA accounts for a high proportion of emissive components can be provided. According to another embodiment of the present invention, a novel light-emitting device with a high emission efficiency and a low power consumption can be provided. According to another embodiment of the present invention, a novel display device can be provided.

Note that the description of these effects does not preclude the existence of other effects. One embodiment of the present invention does not necessarily have all the effects. Other effects are apparent from and can be derived from the description of the specification, the drawings, the claims, and the like.

BEST MODE FOR CARRYING OUT THE INVENTION

Figure 1A:
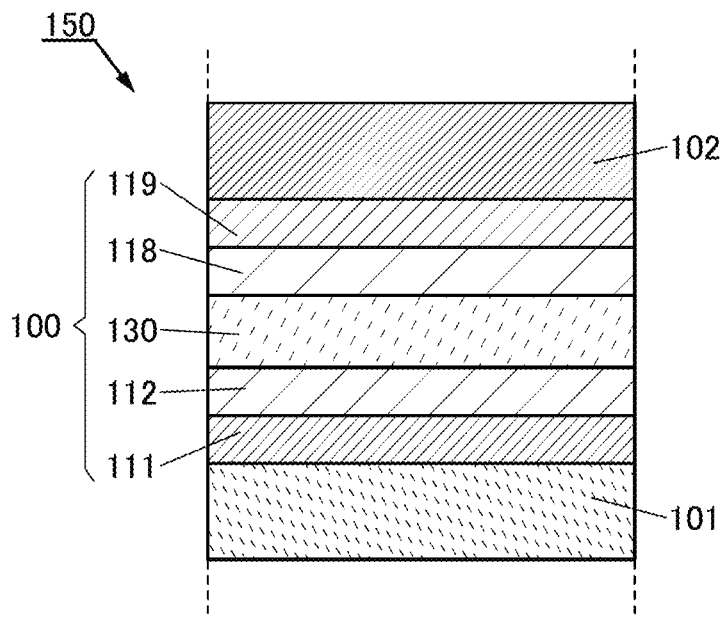
FIGS. 1A to 1C are schematic cross-sectional views of a light-emitting element of one embodiment of the present invention and a schematic diagram illustrating the correlation of energy levels.

Hereinafter, embodiments of the present invention will be described. Note that it is easily understood by those skilled in the art that modes and details disclosed herein can be modified in various ways without departing from the spirit and scope of the present invention. Therefore, the present invention should not be interpreted as being limited to the description in the embodiments.

Note that in each drawing described in this specification, the size, the thickness, and the like of components such as an anode, an EL layer, an intermediate layer, and a cathode are exaggerated for clarity in some cases. Therefore, the sizes of the components are not limited to the sizes in the drawings and relative sizes between the components.

In this specification and the like, ordinal numbers such as "first", "second", and "third" are used for convenience and do not denote the order of steps or the positional relation. Therefore, for example, description can be made even when "first" is replaced with "second" or "third", as appropriate. In addition, the ordinal numbers in this specification and the like are not necessarily the same as those that specify one embodiment of the present invention.

In the structures of the present invention described in this specification and the like, the same portions or portions having similar functions are denoted by common reference numerals in different drawings, and the description of such portions is not repeated. Furthermore, the same hatching pattern is applied to portions having similar functions, and the portions are not especially denoted by reference numerals in some cases.

In this specification, color is defined by three aspects of hue (corresponding to the wavelength of light of a single color), chroma (saturation, i.e., the degree to which it differs from white), and value (brightness, i.e., the intensity of light). In this specification, color may be defined by only one of the above three aspects or two of the aspects which are selected arbitrarily. In this specification, a difference between two colors of light means a difference in at least one of the above three aspects and also includes a difference in the shape of two spectra of light or in the distribution of the relative intensity of the peaks in the spectra.

Note that the terms "film" and "layer" can be interchanged with each other depending on the case or circumstances. For example, the term "conductive layer" can be changed into the term "conductive film" in some cases, and the term "insulating film" can be changed into the term "insulating layer" in some cases.

In this specification and the like, a singlet excited state (S*) refers to a singlet state having excitation energy. Among the singlet excited states, the excited state having the lowest energy is referred to as a lowest singlet excited state. A singlet excitation energy level means an energy level in a singlet excited state. Among the singlet excitation energy levels, the lowest excitation energy level is referred to as a lowest singlet excitation energy (S1) level. Note that in this specification and the like, simple expressions "singlet excited state" and "singlet excitation energy level" mean the lowest singlet excited state and the S1 level, respectively, in some cases.

In this specification and the like, a triplet excited state (T*) refers to a triplet state having excitation energy. Among the triplet excited states, the excited state having the lowest energy is referred to as a lowest triplet excited state. A triplet excitation energy level means an energy level in a triplet excited state. Among the triplet excitation energy levels, the lowest excitation energy level is referred to as a lowest triplet excitation energy (T1) level. Note that in this specification and the like, simple expressions "triplet excited state" and "triplet excitation energy level" mean the lowest triplet excited state and the T1 level, respectively, in some cases.

In this specification and the like, a fluorescent material refers to a material that emits light in the visible light region when the singlet excited state relaxes to the ground state. A phosphorescent material refers to a material that emits light in the visible light region at room temperature when the triplet excited state relaxes to the ground state. That is, a phosphorescent material refers to a material that can convert triplet excitation energy into visible light.

Note that in this specification and the like, "room temperature" refers to a temperature in a range of 0° C. to 40° C.

In this specification and the like, a wavelength range of blue refers to a wavelength range of greater than or equal to 400 nm and less than or equal to 550 nm, and blue light has at least one peak in that range in an emission spectrum.

Embodiment 1

<Structure Example of Light-Emitting Element>

First, a structure of a light-emitting element of one embodiment of the present invention will be described below with reference to FIGS. 1A to 1C.

FIG. 1A is a schematic cross-sectional view of a light-emitting element 150 of one embodiment of the present invention.

The light-emitting element 150 includes a pair of electrodes (an electrode 101 and an electrode 102) and an EL layer 100 therebetween. The EL layer 100 includes at least a light-emitting layer 130. Note that the description in this embodiment is given assuming that the electrode 101 and the electrode 102 of the pair of electrodes serve as an anode and a cathode, respectively; however, they can be interchanged for the structure of the light-emitting element 150.

The EL layer 100 illustrated in FIG. 1A includes functional layers in addition to the light-emitting layer 130. The functional layers include a hole-injection layer 111, a hole-transport layer 112, an electron-transport layer 118, and an electron-injection layer 119. Note that the structure of the EL layer 100 is not limited to the structure illustrated in FIG. 1A, and a structure including at least one layer selected from the hole-injection layer 111, the hole-transport layer 112, the electron-transport layer 118, and the electron-injection layer 119 may be employed. Alternatively, the EL layer 100 may include a functional layer which is capable of lowering a hole- or electron-injection barrier, improving a hole- or electron-transport property, inhibiting transport of holes or electrons, or suppressing a quenching phenomenon by an electrode, for example.

Figure 1B:
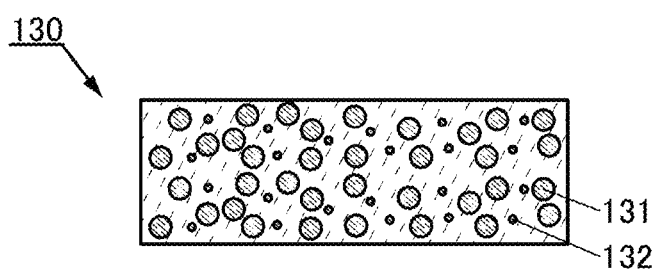

FIG. 1B is a schematic cross-sectional view illustrating an example of the light-emitting layer 130 in FIG. 1A. The light-emitting layer 130 in FIG. 1B includes at least a host material 131 and a guest material 132.

The host material 131 preferably has a function of converting triplet excitation energy into singlet excitation energy by causing TTA, so that the triplet excitation energy generated in the light-emitting layer 130 can be partly converted into singlet excitation energy by TTA in the host material 131. The singlet excitation energy generated by TTA can be transferred to the guest material 132 and extracted as fluorescence. In order to achieve this, the lowest singlet excitation energy (S1) level of the host material 131 is preferably higher than the S1 level of the guest material 132. In addition, the lowest triplet excitation energy (T1) level of the host material 131 is preferably lower than the T1 level of the guest material 132.

Note that the host material 131 may be composed of a single compound or a plurality of compounds. The guest material 132 may be a light-emitting organic material, and the light-emitting organic material is preferably a material capable of emitting fluorescence (hereinafter also referred to as a fluorescent material). A structure in which a fluorescent material is used as the guest material 132 will be described below. The guest material 132 may be rephrased as the fluorescent material.

<Emission Mechanism of Light-Emitting Element>

First, the emission mechanism of the light-emitting element 150 is described below.

In the light-emitting element 150 of one embodiment of the present invention, voltage application between the pair of electrodes (the electrodes 101 and 102) causes electrons and holes to be injected from the cathode and the anode, respectively, into the EL layer 100 and thus current flows. By recombination of the injected electrons and holes, excitons are formed. The ratio of singlet excitons to triplet excitons which are generated by carrier recombination is approximately 1:3 according to the statistically obtained probability. Hence, the probability of formation of singlet excitons is 25%.

Note that the exciton refers to a carrier (electron and hole) pair. Since excitons have excitation energy, a material where excitons are generated is brought into an excited state.

Through the following two processes, singlet excitons are formed in the EL layer 100 and light emission from the guest material 132 can be obtained:

($\alpha$) Direct formation process; and ($\beta$) TTA process.

<<($\alpha$) Direct Formation Process>>

Described first is the case where carriers (electrons and holes) recombine in the light-emitting layer 130 included in the EL layer 100 to form a singlet exciton.

When the carriers recombine in the host material 131, excitons are formed to bring the host material 131 into an excited state (a singlet excited state or a triplet excited state). At this time, in the case where the excited state of the host material 131 is a singlet excited state, singlet excitation energy transfers from the S1 level of the host material 131 to the S1 level of the guest material 132, thereby forming the singlet excited state of the guest material 132. Note that the case where the excited state of the host material 131 is a triplet excited state is described later in ($\beta$) TTA process.

When the carriers recombine in the guest material 132, excitons are formed to bring the guest material 132 into an excited state (a singlet excited state or a triplet excited state).

In the case where the formed excited state of the guest material 132 is a singlet excited state, light emission is obtained from the singlet excited state of the guest material 132. To obtain a high emission efficiency in this case, the fluorescence quantum yield of the guest material 132 is preferably high.

In the case where the guest material 132 is brought into a triplet excited state, the triplet excited state of the guest material 132 is thermally deactivated and does not contribute to light emission because the guest material 132 is a fluorescent material. However, if the T1 level of the host material 131 is lower than the T1 level of the guest material 132, the triplet excitation energy of the guest material 132 can be transferred from the T1 level of the guest material 132 to the T1 level of the host material 131, which is present in greater quantity than the guest material 132. In that case, the triplet excitation energy can be converted into singlet excitation energy by ($\beta$) TTA process described later. Hence, to increase the probability of occurrence of TTA, the T1 level of the host material 131 should be lower than the T1 level of the guest material 132.

In the case where the T1 level of the host material 131 is higher than the T1 level of the guest material 132, the probability of carrier recombination in the guest material 132 can be reduced when the weight percentage of the guest material 132 is lower than that of the host material 131. In addition, the probability of energy transfer from the T1 level of the host material 131 to the T1 level of the guest material 132 can be reduced. Specifically, the weight ratio of the guest material 132 to the host material 131 is preferably greater than 0 and less than or equal to 0.05.

<<(β) TTA Process>>

Described next is the case where a singlet exciton is formed from triplet excitons formed in the carrier recombination process in the light-emitting layer 130.

Here, the case where the T1 level of the host material 131 is lower than the T1 level of the guest material 132 is described. The correlation of energy levels in this case is schematically shown in FIG. 1C. What terms and numerals in FIG. 1C represent are listed below. Note that the T1 level of the host material 131 may be higher than the T1 level of the guest material 132.

Host (131): the host material 131
Guest (132): the guest material 132 (fluorescent material)
$S_{FH}$: the S1 level of the host material 131
$T_{FH}$: the T1 level of the host material 131
$S_{FG}$: the S1 level of the guest material 132 (fluorescent material)
$T_{FG}$: the T1 level of the guest material 132 (fluorescent material)

Carriers recombine in the host material 131 and excitons are generated to bring the host material 131 into an excited state. In the case where the excitons generated at this time are triplet excitons, two of the triplet excitons approach each other, and one of them might be converted into a singlet exciton having the energy of the S1 level ($S_{FH}$) of the host material 131 (see TTA in FIG. 1C). This reaction is represented by General Formula (G1) or (G2), where the number of triplet excitons decreases while singlet excitons are generated.

$$^3H^* + {}^3H^* \rightarrow {}^1(HH)^* \rightarrow {}^1H^{**} + H \rightarrow {}^1H^* + H \tag{G1}$$

$$^3H^* + {}^3H^* \rightarrow {}^3(HH)^* \rightarrow {}^3H^{**} + H \rightarrow {}^3H^* + H \tag{G2}$$

In the reaction in General Formula (G1), a pair of excitons ($^1(HH)^*$) with a total spin quantum number of 0 are formed from two triplet excitons ($^3H^*$) with a total spin quantum number of 0 in the host material 131, and a singlet exciton ($^1H^*$) is generated through an electronically or oscillatorily excited high-order singlet exciton ($^1H^{**}$). In the reaction in General Formula (G2), a pair of excitons ($^3(HH)^*$) with a total spin quantum number of 1 are formed from two triplet excitons ($^3H^*$) with a total spin quantum number of 1 (atomic unit) in the host material 131, and a triplet exciton ($^3H^*$) is generated through an electronically or oscillatorily excited high-order triplet exciton ($^3H^{**}$). Note that in General Formulae (G1) and (G2), H represents the ground state of the host material 131.

In General Formulae (G1) and (G2), there are three times as many pairs of triplet excitons with a total spin quantum number of 1 (atomic unit) as pairs of triplet excitons with a total spin quantum number of 0. In other words, when an exciton is formed from two triplet excitons, the singlet-triplet exciton formation ratio is 1:3 according to the statistically obtained probability. In the case where the density of the triplet excitons in the light-emitting layer 130 is sufficiently high (e.g., $1 \times 10^{12}$ cm$^{-3}$ or more), only the reaction of two triplet excitons approaching each other can be considered whereas quenching of a single triplet exciton is ignored.

Thus, by one reaction of General Formula (G1) and three reactions of General Formula (G2), one singlet exciton ($^1H^*$) and three high-order triplet excitons ($^3H^{**}$) which are electronically or oscillatorily excited are formed from eight triplet excitons ($^3H^*$).

$$8\,{}^3H^* \rightarrow {}^1H^* + 3\,{}^3H^{**} + 4H \rightarrow {}^1H^* + 3\,{}^3H^* + 4H \tag{G3}$$

The electronically or oscillatorily excited high-order triplet excitons ($^3H^{**}$), which are generated in General Formula (G3), become triplet excitons ($^3H^*$) by rapid relaxation and then repeat the reaction in General Formula (G3) again with other triplet excitons. Hence, in General Formula (G3), if all the triplet excitons ($^3H^*$) are converted into singlet excitons ($^1H^*$), one singlet exciton ($^1H^*$) is generated from five triplet excitons ($^3H^*$) (General Formula (G4)).

$$5\,{}^3H \rightarrow {}^1H^* + 4H \tag{G4}$$

The ratio of singlet excitons ($^1H^*$) to triplet excitons ($^3H^*$) which are directly formed by recombination of carriers injected from a pair of electrodes is statistically as follows: $^1H^*$: $^3H^* = 1:3$. That is, the probability of singlet excitons being directly formed by recombination of carriers injected from a pair of electrodes is 25%.

When the singlet excitons directly formed by recombination of carriers injected from a pair of electrodes and the singlet excitons formed by TTA are put together, eight singlet excitons can be formed from twenty excitons (the sum of singlet excitons and triplet excitons) directly formed by recombination of carriers injected from a pair of electrodes (General Formula (G5)). That is, TTA can increase the probability of singlet exciton formation from 25%, which is the conventional value, to at most 40% (=8/20).

$$5\,{}^1H^* + 15\,{}^3H^* \rightarrow 5\,{}^1H^* + (3\,{}^1H^* + 12H) \tag{G5}$$

Figure 1C:
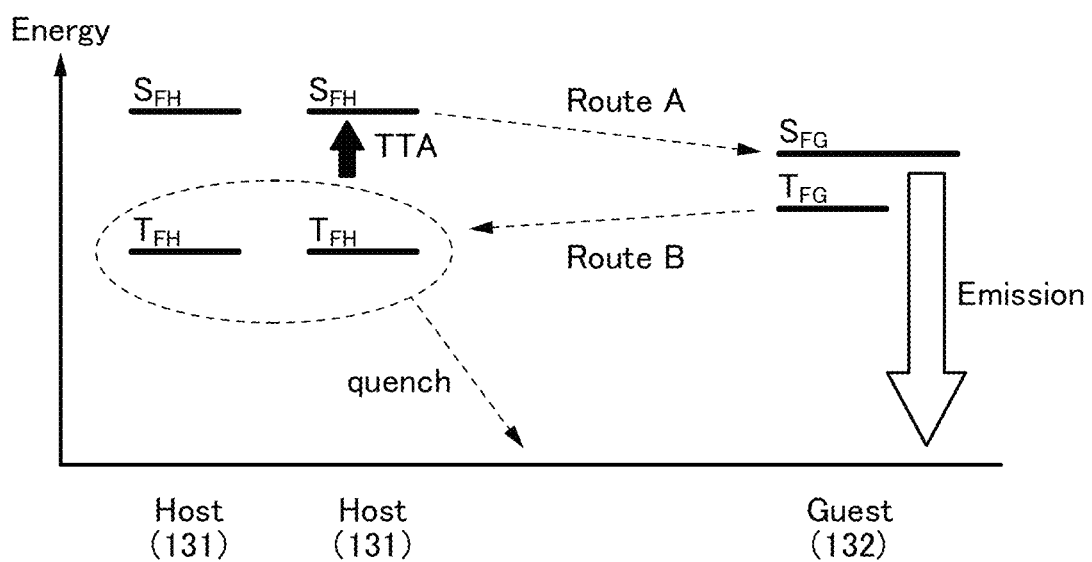

In the singlet excited state of the host material 131, which is formed by the singlet excitons formed through the above process, energy is transferred from the S1 level ($S_{FH}$) of the host material 131 to the S1 level ($S_{FG}$) of the guest material 132, which is lower than $S_{FH}$ (see Route A in FIG. 1C). Then, the guest material 132 brought into a singlet excited state emits fluorescence.

In the case where carriers recombine in the guest material 132 and an excited state formed by the formed excitons is a triplet excited state, triplet excitation energy of $T_{FG}$ is not deactivated and transferred to $T_{FH}$ (see Route B in FIG. 1C) to contribute to TTA when the T1 level ($T_{FH}$) of the host material 131 is lower than the T1 level ($T_{FG}$) of the guest material 132.

In the case where the T1 level ($T_{FG}$) of the guest material 132 is lower than the T1 level ($T_{FH}$) of the host material 131, the weight percentage of the guest material 132 is preferably lower than that of the host material 131. Specifically, the weight ratio of the guest material 132 to the host material 131 is preferably greater than 0 and less than or equal to 0.05, which reduces the probability of carrier recombination in the guest material 132. In addition, the probability of energy transfer from the T1 level ($T_{FH}$) of the host material 131 to the T1 level ($T_{FG}$) of the guest material 132 can be reduced.

As described above, triplet excitons formed in the light-emitting layer 130 can be converted into singlet excitons by TTA, so that light emission from the guest material 132 can be efficiently obtained.

<Probability of TTA Occurrence>

As described above, the probability of formation of singlet excitons and the emission efficiency of a light-emitting element can be increased by TTA; thus, an increase in the probability of occurrence of TTA (also referred to as TTA efficiency) is important to achieve a high emission efficiency. That is, a delayed fluorescence component due to TTA should account for a high proportion of light emission from the light-emitting element.

As described above, owing to the TTA process, the probability of formation of singlet excitons can be increased to at most 40% including 25% occupied by the singlet excitons that are directly formed by recombination of carriers injected from a pair of electrodes. Thus, the proportion of a delayed fluorescence component due to TTA can be increased to at most 37.5% ((40%−25%)/40%) of light emission from the light-emitting element.

<Improved Emission Efficiency with Increase in Delayed Fluorescence Component in Light Emission>

For example, in a light-emitting element that emits blue light and incudes an anthracene compound generally used as a host material, a delayed fluorescence component due to TTA accounts for approximately 10% of light emission. Note that in this specification, the delayed fluorescence refers to light that is obtained after the steady injection of carriers to a light-emitting layer is stopped, and that is continuously emitted for $1 \times 10^{-6}$ sec or longer with an intensity ratio of 0.01 or more with respect to the emission intensity with carriers steadily injected.

In order to improve the emission efficiency of a light-emitting element that emits blue light, the proportion of a delayed fluorescence component due to TTA in light emission needs to be further increased.

As described above, in the TTA process, a singlet exciton is formed from triplet excitons formed in the carrier recombination process in the light-emitting layer 130. However, if the triplet excitons formed in the carrier recombination process are quenched in another process, they do not contribute to the formation of the singlet exciton, causing a decrease in the delayed fluorescence component due to TTA in the light emission from the light-emitting element.

The formed triplet excitons might be quenched by a variety of factors, one of which is the action of carrier electrons in the light-emitting layer 130. The triplet excitons formed in the light-emitting layer 130 are quenched in some cases when interacting with carrier electrons.

Thus, in the light-emitting element of one embodiment of the present invention, the density of carrier electrons in the light-emitting layer 130 is adjusted to reduce the quenching of triplet excitons. The carrier electrons in the light-emitting layer 130 are mainly supplied from the electron-transport layer 118; accordingly, the transfer of carrier electrons from the electron-transport layer 118 to the light-emitting layer 130 only needs to be adjusted. This can be achieved by making an energy barrier between the LUMO level of a material used for the electron-transport layer 118 and the LUMO level of the host material 131 contained in the light-emitting layer 130.

In the light-emitting element of one embodiment of the present invention, the LUMO level of the material used for the electron-transport layer 118 is made lower than the LUMO level of the host material 131 contained in the light-emitting layer 130, so that an energy barrier against the transfer of carrier electrons is formed. When the transfer of carrier electrons to the light-emitting layer 130 is hindered, the carrier recombination region in the light-emitting layer 130 spreads to the electron-transport layer 118 side, and both the triplet excitons and the carrier electrons have a lower density in the recombination region, resulting in a decrease in the probability of quenching of the triplet excitons. It is needless to say that a decreased density of triplet excitons might reduce the probability of occurrence of TTA itself. However, the present inventors have found that the effect of preventing the quenching of triplet excitons due to decreased electron density more than compensates for the adverse effect of decreased density of triplet excitons, and TTA is more likely to occur in the above structure.

Figure 2:
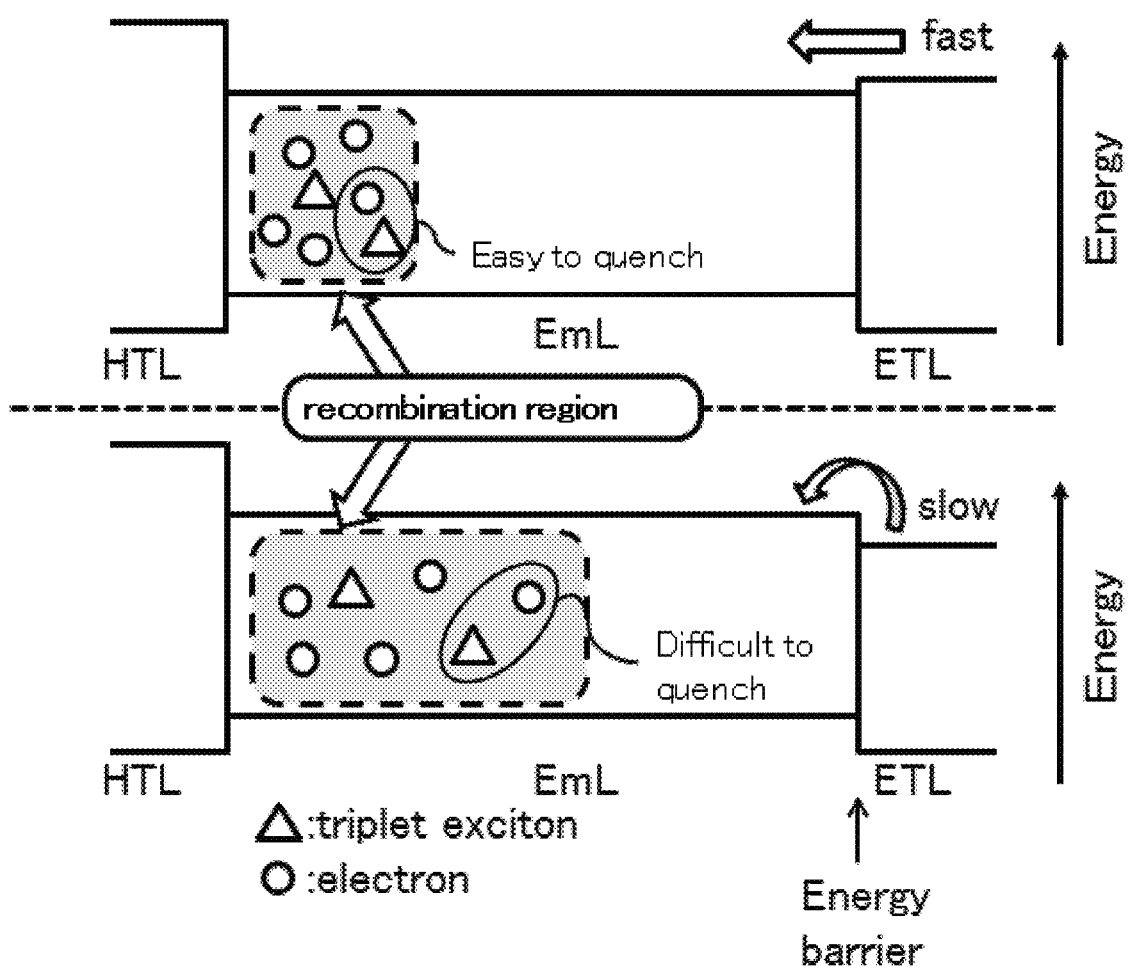
FIG. 2 shows an energy barrier and a recombination region.

FIG. 2 shows the energy diagram, where the LUMO level of the material used for the electron-transport layer 118 is higher or lower than the LUMO level of the host material 131 contained in the light-emitting layer 130. It is found from FIG. 2 that a recombination region spreads to the electron-transport layer (ETL) 118 side when an energy barrier is formed between the electron-transport layer (ETL) 118 and the light-emitting layer (EmL) 130; then, the density of both triplet excitons and electrons decreases, reducing the probability of quenching of triplet excitons. A reduced probability of quenching increases the number of singlet excitons formed from triplet excitons in the TTA process, thereby increasing the delayed fluorescence component due to TTA in the light emission from the light-emitting element. As a result, the emission efficiency of the light-emitting element of one embodiment of the present invention can be improved.

In one embodiment of the present invention, the proportion of the delayed fluorescence component due to TTA can be, for example, higher than or equal to 10% of light emission from the light-emitting element. Furthermore, the proportion of the delayed fluorescence component due to TTA can be higher than or equal to 15% of light emission from the light-emitting element when a material having a relatively deep LUMO level is used for the electron-transport layer 118. To achieve such an effect, an appropriate energy barrier, preferably greater than or equal to 0.05 eV, is made between the LUMO level of the material used for the electron-transport layer 118 and the LUMO level of the host material 131 contained in the light-emitting layer 130.

Here, in the case where the material used for the electron-transport layer 118 has an extremely deep LUMO level, carrier electrons are unlikely to transfer from the electron-transport layer 118 to the light-emitting layer 130 to affect the carrier balance in the light-emitting layer 130, which might reduce the emission efficiency of the light-emitting element. In contrast, the aforementioned energy barrier should be high enough to appropriately suppress the transfer of carrier electrons from the electron-transport layer 118 to the light-emitting layer 130. Hence, the difference between the LUMO level of the material used for the electron-transport layer 118 and the LUMO level of the host material 131 contained in the light-emitting layer 130 is preferably greater than or equal to 0.05 eV and less than or equal to 0.3 eV.

As described above, the light-emitting element of one embodiment of the present invention appropriately suppresses the transfer of carrier electrons from the electron-transport layer 118 to the light-emitting layer 130. Thus, when carrier electrons in the light-emitting layer 130 are trapped by the guest material 132, which is present in less quantity than the host material 131, electrons are less likely to transfer also in the light-emitting layer 130, causing an unnecessary increase in driving voltage. In view of this, the LUMO level of the guest material is preferably higher than the LUMO level of the host material.

Note that a factor of delayed fluorescence in a light-emitting element, which is other than TTA, may be thermally activated delayed fluorescence due to reverse intersystem crossing from the triplet excited state to the singlet excited state. To efficiently cause reverse intersystem crossing, an energy difference between the S1 level and the T1 level is preferably less than or equal to 0.2 eV. In other words, an energy difference greater than 0.2 eV between the S1 level and the T1 level hardly causes reverse intersystem crossing. Therefore, to efficiently cause TTA, an energy difference between the lowest singlet excitation energy level and the lowest triplet excitation energy level of a compound in which TTA occurs is preferably greater than 0.2 eV, further preferably greater than or equal to 0.5 eV.

The lowest singlet excitation energy level of an organic compound can be observed from an absorption spectrum at a transition from the ground state to the lowest singlet excited state in the organic compound. Alternatively, the lowest singlet excitation energy level may be estimated from a peak wavelength of a fluorescence spectrum of the organic compound. Furthermore, the lowest triplet excitation energy level can be observed from an absorption spectrum at a transition from the ground state to the lowest triplet excited state in the organic compound, but is difficult to observe in some cases because this transition is a forbidden transition. In such cases, the lowest triplet excitation energy level may be estimated from a peak wavelength of a phosphorescence spectrum of the organic compound. Thus, a difference in equivalent energy value between the peak wavelengths of the fluorescence and phosphorescence spectra of the organic compound is preferably greater than 0.2 eV, further preferably greater than or equal to 0.5 eV.

<Hole-Transport Layer and Improvement in Emission Efficiency>

The relationship between the material contained in the electron-transport layer 118 and the emission efficiency has been described above. Next, the relationship between the material contained in the hold-transport layer 112 and the emission efficiency will be described.

The material contained in the hole-transport layer 112 preferably has a higher LUMO level than the host material 131. In the case where the material contained in the hole-transport layer 112 has the same LUMO level as the host material 131, carrier electrons reaching the light-emitting layer 130 do not remain in the light-emitting layer 130 and moves to the hole-transport layer 112. Then, carriers recombine also in the hole-transport layer 112, which reduces the efficiency of recombination of carriers in the light-emitting layer 130. This causes a decreased emission efficiency unless the energy of excitons generated in the hole-transport layer 112 can be transferred to the light-emitting material in the light-emitting layer 130.

Hence, the material contained in the hole-transport layer 112 preferably has a higher LUMO level than the host material 131. Note that the LUMO level of the material contained in the hole-transport layer 112 is preferably higher than the LUMO level of the host material 131 by greater than or equal to 0.3 eV, in which case the transfer of carrier electrons from the light-emitting layer 130 to the hole-transport layer 112 can be suppressed effectively.

<Suppression of Transfer of Triplet Excitation Energy>

Triplet excitation energy generated in the light-emitting layer 130 remains in the light-emitting layer 130 so as not to leave the light-emitting layer 130 in the following manner.

When the triplet excitation energy generated in the light-emitting layer 130 moves outside, the probability of occurrence of TTA in the light-emitting layer 130 decreases. In other words, the suppression of the transfer of the triplet excitation energy results in maintaining a high probability of occurrence of TTA in the light-emitting layer and a high emission efficiency of the light-emitting element.

First, to suppress the transfer of triplet excitation energy from the light-emitting layer 130 to the hole-transport layer 112, the T1 level of the material contained in the hole-transport layer 112 is preferably made higher than the T1 level of the host material 131 contained in the light-emitting layer 130, more preferably, by greater than or equal to 0.2 eV.

Similarly, to suppress the transfer of triplet excitation energy from the light-emitting layer 130 to the electron-transport layer 118, the T1 level of the material contained in the electron-transport layer 118 is preferably made higher than the T1 level of the host material 131 contained in the light-emitting layer 130, more preferably, by greater than or equal to 0.2 eV.

When triplet excitation energy is prevented from moving and remains in the light-emitting layer 130, the triplet excitation energy is likely to be lost only due to TTA, so that the probability of occurrence of TTA in the light-emitting layer 130 and the emission efficiency of the light-emitting element can be maintained high.

<Measurement of Delayed Fluorescence Component>

Described is an example of a method for measuring the delayed fluorescence component in light emission from a light-emitting layer.

When carriers are steadily injected to the light-emitting layer, light emission from the light-emitting layer has an intensity including a delayed fluorescence component and other components. The emission intensity relating to the delayed fluorescence reaches a maximum when carriers are injected to the light-emitting layer for a sufficient period of time. Thus, the proportion of a delayed fluorescence component in light emission refers to a value in a state where carriers are steadily injected to the light-emitting layer.

The proportion of a delayed fluorescence component in light emission may be measured by stopping the injection of carriers to the light-emitting layer and measuring the attenuated light. After carrier injection is stopped, the fluorescence usually quenches in several nanoseconds while the delayed fluorescence quenches in several microseconds. Accordingly, the delayed fluorescence can be measured by observing the component that quenches in several microseconds.

The attenuation of light is observed with a streak camera for several microseconds after the injection of carriers to the light-emitting layer is stopped, whereby an exponential attenuation curve can be obtained. The light emission includes a delayed fluorescence component and other components just after the carrier injection to the light-emitting layer is stopped; after several nanoseconds or more, only the delayed fluorescence component remains in effect. Hence, by fitting the attenuation curve with an exponential function, an attenuation curve formula with the time as a parameter can be obtained.

The time 0 s is substituted to the attenuation curve formula to estimate the intensity value of the delayed fluorescence component at the time of stopping the carrier injection. Carriers are steadily injected at the moment of stopping the carrier injection to the light-emitting layer, i.e., the estimated intensity of the delayed fluorescence component is equal to the intensity of the delayed fluorescence component at the time when carriers are steadily injected. The proportion of the delayed fluorescence component in light emission can be calculated from the obtained intensity of the delayed fluorescence component and the emission intensity of the light-emitting layer to which carriers are steadily injected.

Note that the delayed fluorescence component in light emission from the light-emitting layer might include not only delayed fluorescence derived from the TTA process with intermolecular interaction but also thermally activated delayed fluorescence (TADF) derived from the energy transfer of a molecule from a triplet excitation energy level to a singlet excitation energy level. The TADF is generated under the following conditions, which enable the reverse energy transfer from the triplet excitation energy level to the singlet excitation energy level. Both of the energy levels need to be close to each other, specifically, the energy gap therebetween should be less than or equal to 0.2 eV to cause the TADF.

However, only some of the molecules used for the light-emitting layer satisfy the conditions. Thus, unless a molecule with a small energy gap is used in a light-emitting layer, the TADF does not need to be considered and the delayed fluorescence component in light emission from the light-emitting layer can be substantially derived from the TTA process.

For specific measurements, Examples can be referred to.

<Molecular Orientation and Outcoupling Efficiency>

In organic EL, carriers are supplied to a light-emitting layer and recombine therein, so that light is emitted from a guest material contained in the light-emitting layer. In some cases, the light emission is anisotropic, i.e., has angle-dependent intensity. The light emission is perpendicular to the transition dipole moment of the guest material; accordingly, the transition dipole moment orientation influences the angular dependence of the light emission. Since the transition dipole moment orientation of an organic molecule is affected by the molecular orientation of the organic molecule, light emission from the guest material sometimes has anisotropy due to the molecular orientation of the guest material.

The light-emitting layer includes a plurality of molecules and the guest material is dispersed in the host material. In some fabrication conditions of the light-emitting layer, the guest molecules are not randomly oriented in the host material but are oriented in a direction, that is, the guest molecules may have uneven molecular orientation. If the guest material in the light-emitting layer has orientation that allows light to be easily extracted from a light-emitting element, the outcoupling efficiency of the light-emitting element is improved. Specifically, the guest molecules are preferably oriented so that their transition dipole moment is horizontal to a substrate surface.

In the estimation of the molecular orientation in an actual light-emitting element, it is not easy to directly observe the transition dipole moment orientation of a molecule, or more specifically, a guest material in a light-emitting layer. Therefore, to estimate the molecular orientation of a light-emitting material in the light-emitting layer, the present inventors have thought of a method in which light emitted from the light-emitting layer is linearly polarized to extract a p-polarized component, the angular dependence of the integrated intensity of the obtained p-polarized emission spectrum from the visible to near-infrared region (from 440 nm to 956 nm) is measured and analyzed by calculation (simulation). The estimation method of molecular orientation will be described below.

When guest molecules are randomly oriented in host molecules, the following state is obtained. The total transition dipole moment of all the molecules has the same component in the x direction, the y direction, and the z direction which are orthogonal to one another. For example, in the case where a layer is present on a plane along the x direction and the y direction and molecules in the layer are isotropically oriented, a transition dipole moment component parallel to the layer, which has two dimensions, is two-thirds (67%) of the entire component, and a component perpendicular to the layer is one-third (33%) of the entire component.

The measurement will be described next. In the measurement of the intensity of light from a light-emitting layer, the light enters a Glan-Taylor polarizer and passes therethrough before entering a detector. Thus, only a polarization component in a specific direction can be detected by the detector.

Figure 3A:
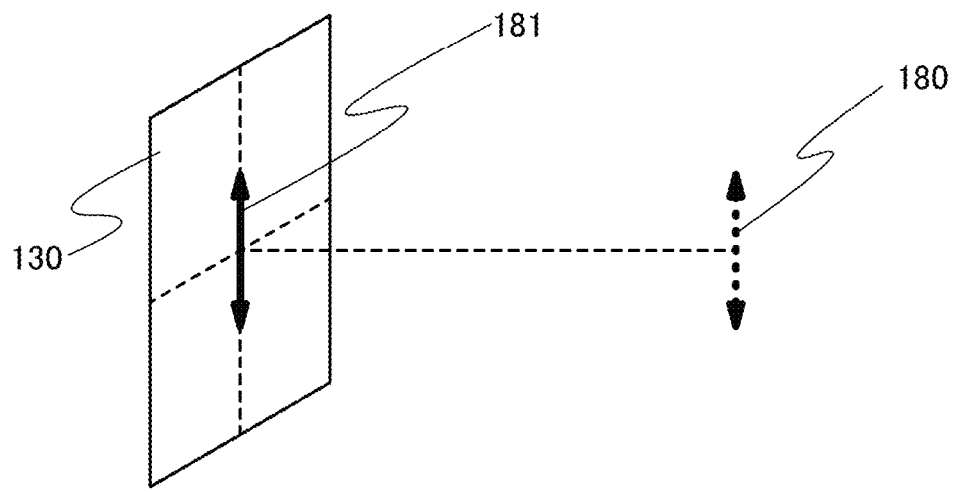
FIGS. 3A to 3C show the components of a transition dipole moment.
Figure 3B:
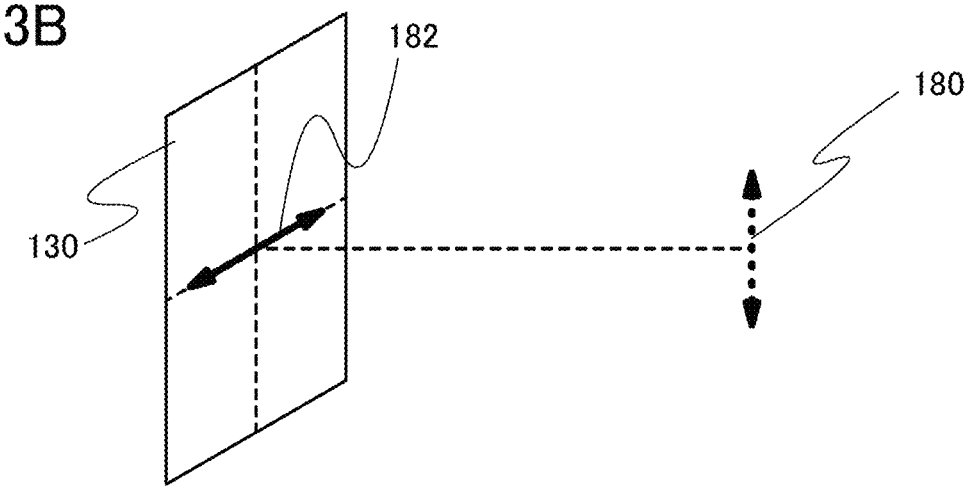
Figure 3C:
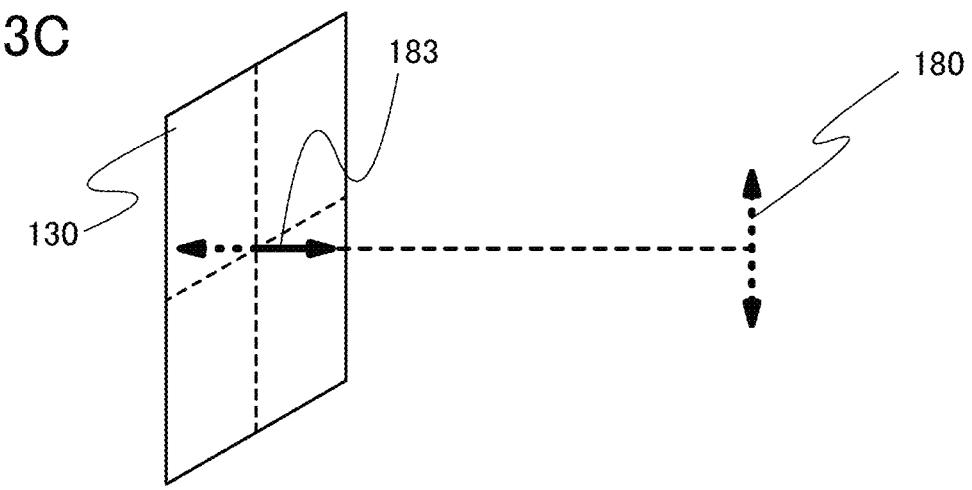

Here, three types of components of the transition dipole moment of light are determined as shown in FIGS. 3A to 3C:

A) a transition dipole moment component 181 which is parallel to the light-emitting layer 130 and in a direction parallel to an observation direction 180 of the detector; B) a transition dipole moment component 182 which is parallel to the light-emitting layer 130 and in a direction perpendicular to the observation direction 180 of the detector; and C) a transition dipole moment component 183 which is in a direction perpendicular to the light-emitting layer 130. The component B cannot pass through the Glan-Taylor polarizer between the detector and the light-emitting layer 130, and therefore is not detected by the detector. In other words, p-polarized emission including the components A and C is observed in this measurement.

Figure 4A:
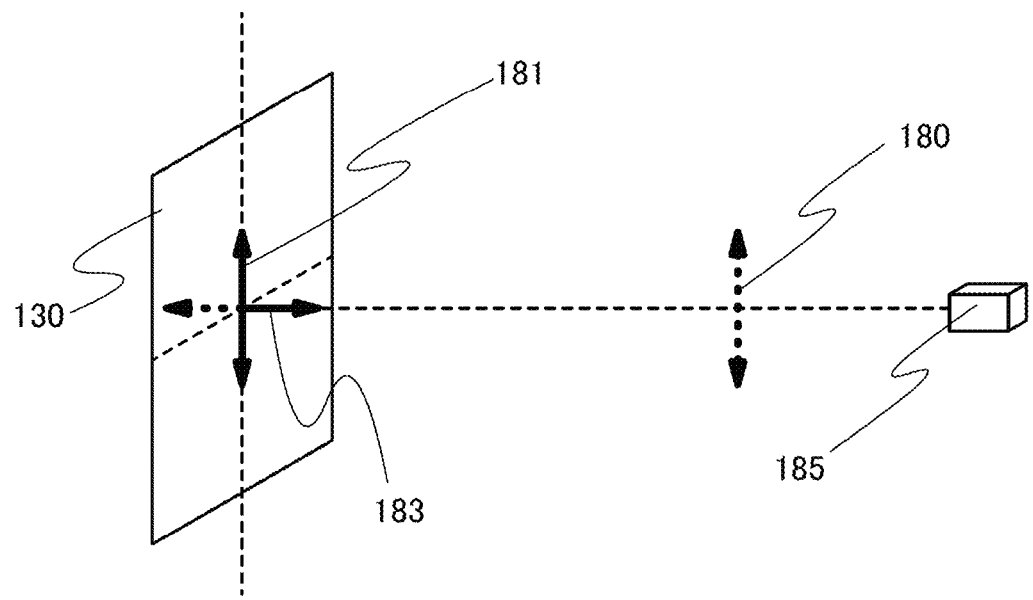
FIGS. 4A and 4B are schematic diagrams illustrating a measurement method of molecular orientation.
Figure 4B:
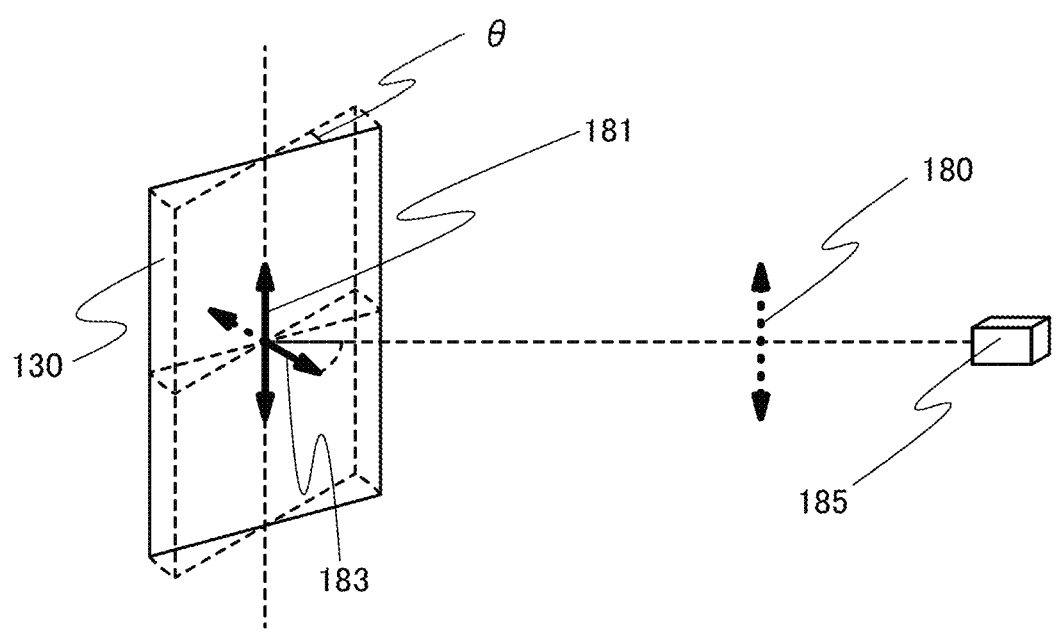

Next, to measure the angular dependence of light emission, the light-emitting layer 130 is gradually inclined from the initial position where the light-emitting layer 130 is in a direction perpendicular to a detector 185. FIG. 4A shows the initial state and FIG. 4B shows the tilted light-emitting layer 130 (tilt angle θ). In the initial state (tilt angle=0°), the detector 185, which is in front of the light-emitting layer 130, does not measure light derived from the aforementioned component C, but measures the component A. As the tilt angle of the light-emitting layer 130 increases, not only the component A but also the component C is gradually measured by the detector 185 depending on the tilt angle. In this manner, the angular dependence of light emission can be measured.

In the light extracted from the element, the component perpendicular to the light-emitting layer 130 has much lower intensity than the component parallel to the light-emitting layer 130; in that case, the component C is difficult to measure. Thus, the thickness of each layer in the light-emitting element is adjusted in advance, and the emission intensity of the component parallel to the light-emitting layer 130 is reduced by utilizing optical interference. Light extracted straight from the light-emitting element includes a component extracted directly from the light-emitting layer 130 and a component that is extracted after light generated in the light-emitting layer 130 enters an electrode and reflects off it. The phases of the two components are reversed and canceled out by adjusting the thickness of each layer in the light-emitting element. This can weaken the component A, facilitating the observation of the component C.

The angular dependence of light emission from the light-emitting layer can be measured in the above manner. The measured results are plotted to obtain a graph, where the horizontal axis represents the tilt angle of the light-emitting layer 130 from the initial state and the vertical axis represents the normalized integrated intensity of emission spectrum. The shape of the graph changes with the ratio of the component A to the component C in the light emission. The shape of each graph with a different ratio of the component A to the component C in the light emission can be obtained by calculation (simulation). In other words, the ratio of the component A to the component C in the light emission can be obtained by fitting the graph as the result of the calculation to the graph as the result of the measurement. Each molecule (guest material in this case) has a unique transition dipole moment orientation; hence, the information on the orientation of the guest material can be obtained from the ratio of the component A to the component C.

The component A exceeding 67% means a large amount of transition dipole moment component parallel to the light-emitting layer; briefly, 100% of the component A means a completely horizontal orientation. Because light is emitted in a direction perpendicular to the transition dipole moment, the outcoupling efficiency increases as the transition dipole moment becomes more parallel to the light-emitting layer. That is, the emission efficiency of the element increases as the component A approaches 100%.

Note that when light emitted from the light-emitting element of one embodiment of the present invention is observed in the above measurement, it is found that the guest material is oriented not randomly but in a specific direction, and the transition dipole moment significantly deviates from the direction perpendicular to the light-emitting layer. The intensity of light emission in the direction perpendicular to the light-emitting layer increases as the transition dipole moment becomes deviating from the direction perpendicular to the light-emitting layer. This indicates that the orientation of the guest material contributes to the high emission efficiency of the light-emitting element of one embodiment of the present invention.

Note that for details of the measurement and calculation, the description of Examples can also be referred to.

<Materials>

Next, components of the light-emitting element of one embodiment of the present invention will be described in detail.

<<Light-Emitting Layer>>

In the light-emitting layer 130, the weight percentage of the host material 131 is higher than that of at least the guest material 132, and the guest material 132 (fluorescent material) is dispersed in the host material 131. The host material 131 in the light-emitting layer 130 is preferably an organic compound in which delayed fluorescence components due to triplet-triplet annihilation (TTA) account for a high proportion of emitted light; specifically, an organic compound in which delayed fluorescence components due to TTA account for 20% or more. Note that in the light-emitting layer 130, the host material 131 may be composed of one kind of compound or a plurality of compounds.

In the light-emitting layer 130, the guest material 132 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and for example, any of the following materials can be used.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl) perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N', N'-triphenyl-1,4-phenylenediamine (abbreviation: 2DPAPPA), N,N,N',N',N'',N'',N''',N'''-octaphenyldibenzo[g, p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis (1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino) phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis (4-methylphenyl)acenaphtho[1,2-a]fluoranthene-3,10-diamine (abbreviation: p-mPhAFD), 2-{2-isopropyl-6-[2-(1, 1,7,7-tetramethyl-2,3,6,7-tetrahydro-1H,5H-benzo[ij] quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis {2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd: 1',2', 3'-lm]perylene.

Note that the light-emitting layer 130 may include a material other than the host material 131 and the guest material 132.

Although there is no particular limitation on a material that can be used in the light-emitting layer 130, any of the following materials can be used, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato) beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). In addition, condensed polycyclic aromatic compounds such as anthracene derivatives, phenanthrene derivatives, pyrene derivatives, chrysene derivatives, and dibenzo[g,p]chrysene derivatives can be used. Specific examples thereof include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-[4-(10-phenyl-9-anthryl)phenyl]-9H-carbazol (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a wider energy gap than the guest material 132 is preferably selected from these substances and known substances.

Note that the light-emitting layer 130 can have a structure in which two or more layers are stacked. For example, in the case where the light-emitting layer 130 is formed by stacking a first light-emitting layer and a second light-emitting layer in this order from the hole-transport layer side, a substance having a hole-transport property is used as the host material of the first light-emitting layer and a substance having an electron-transport property is used as the host material of the second light-emitting layer. Alternatively, the light-emitting layer 130 may include a first region containing a host material and a guest material and a second region containing a host material.

Next, details of other components of the light-emitting element 150 in FIG. 1A will be described below.

<<Pair of Electrodes>>

The electrode 101 and the electrode 102 have functions of injecting holes and electrons into the light-emitting layer 130. The electrodes 101 and 102 can be formed using a metal, an alloy, or a conductive compound, or a mixture or a stack thereof, for example. A typical example of the metal is aluminum, besides, a transition metal such as silver, tungsten, chromium, molybdenum, copper, or titanium, an alkali metal such as lithium or cesium, or a Group 2 metal such as calcium or magnesium can be used. As the transition metal, a rare earth metal such as ytterbium (Yb) may be used. An alloy containing any of the above metals can be used as the alloy, and MgAg and AlLi can be given as examples. As the conductive compound, a metal oxide such as indium oxide-tin oxide (indium tin oxide) can be given. It is also possible to use an inorganic carbon-based material such as graphene as the conductive compound. As described above, the electrode 101 and/or the electrode 102 may be formed by stacking two or more of these materials.

Light emitted from the light-emitting layer 130 is extracted through the electrode 101 and/or the electrode 102. Therefore, at least one of the electrodes 101 and 102 transmits visible light. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

<<Hole-Injection Layer>>

The hole-injection layer 111 has a function of reducing a barrier for hole injection from one of the pair of electrodes (the electrode 101 or the electrode 102) to promote hole injection and is formed using, for example, a transition metal oxide, a phthalocyanine derivative, or an aromatic amine. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charges can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: F4-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

Examples of the aromatic amine compound, which has a high hole-transport property, include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)

amino]-9-phenylcarbazole (abbreviation: PCzPCN1), and 3-[4-(9-phenanthryl)-phenyl]-9-phenyl-9H-carbazole (abbreviation: PCPPn).

Other examples of the carbazole derivative include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl) anthracene (abbreviation: t-BuDBA), 9,10-di(2-naphthyl) anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl) anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5, 8,11-tetra(tert-butyl)perylene. Other examples are pentacene and coronene. The aromatic hydrocarbon having a hole mobility of $1\times10^{-6}$ cm$^2$/Vs or more and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), and 9,10-bis[4-(2,2-diphenylvinyl)phenyl]anthracene (abbreviation: DPVPA).

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: poly-TPD).

«Hole-Transport Layer»

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 130, the highest occupied molecular orbital (HOMO) level of the hole-transport layer 112 is preferably equal or close to the HOMO level of the hole-injection layer 111.

In addition to the materials given as the material for the hole-injection layer 111, any of the following substances having a high hole-transport property can be used as the hole-transport material: aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris (N,N-diphenylamino)triphenylamine (abbreviation: TDATA), 4,4',4"-tris[N-(3-methylphenyl)-N-phenylamino] triphenylamine (abbreviation: MTDATA), 4,4'-bis[N-(spiro-9,9'-bifluoren-2-yl)-N-phenylamino]biphenyl (abbreviation: BSPB), and 4-phenyl-4'-(9-phenylfluoren-9-yl)triphenylamine (abbreviation: BPAFLP), and the like. The substances listed here are mainly substances having a hole mobility of $1\times10^{-6}$ cm$^2$/Vs or higher. Note that any substance other than the substances listed here may be used as long as the hole-transport property is higher than the electron-transport property. The layer including a substance having a high hole-transport property is not limited to a single layer, and two or more layers containing the aforementioned substances may be stacked.

The hole-transport material contained in the hole-transport layer 112 preferably has a higher LUMO level and a higher lowest triplet excitation energy (T1) level than the host material 131 in the light-emitting layer. In the case where the material contained in the hole-transport layer 112 has the same LUMO level as the host material 131, carrier electrons reaching the light-emitting layer 130 do not remain in the light-emitting layer 130 and moves to the hole-transport layer 112. Then, fewer excitons recombine in the light-emitting layer 130, which reduces the emission efficiency. In the case where the lowest triplet excitation energy (T1) level is equal to that of the host material 131, TTA does not occur from triplet excitons generated in the light-emitting layer 130, so that the triplet energy diffuses to the hole-transport layer 112, causing a reduced emission efficiency.

For example, 3-[4-(9-phenanthryl)-phenyl]-9-phenyl-9H-carbazole (abbreviation: PCPPn) is preferably used as the hole-transport material contained in the hole-transport layer 112. PCPPn has appropriately high LUMO level and T1 level; thus, diffusion of carrier electrons from the light-emitting layer 130 to the hole-transport layer 112 can be appropriately suppressed, increasing the probability of occurrence of TTA in the light-emitting layer 130 and the emission efficiency of the light-emitting element.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as an electron-transport material, and a material having an electron mobility of $1\times10^{-6}$ cm$^2$/Vs or higher is preferred. Specific examples include a metal complex having a quinoline ligand, a benzoquinoline ligand, an oxazole ligand, or a thiazole ligand; an oxadiazole derivative; a triazole derivative; a phenanthroline derivative; a pyridine derivative; a bipyridine derivative; and a pyrimidine derivative.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), and bis(2-methyl-8-quinolinolato) (4-phenylphenolato)aluminum(III) (abbreviation: BAlq). Alternatively, a metal complex having an oxazole-based or thiazole-based ligand, such as bis[2-(2-hydroxyphenyl)benzoxazolato]zinc (II) (abbreviation: Zn(BOX)$_2$) or bis[2-(2-hydroxyphenyl) benzothiazolato]zinc(II) (abbreviation: Zn(BTZ)$_2$) can be used. Other than the metal complexes, any of the following can be used: 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), and bathocuproine (abbreviation: BCP). The substances described here are mainly substances having an electron mobility of $1\times10^{-6}$ cm$^2$/Vs or higher. The electron-transport layer 118 is not limited to a single layer, and two or more layers containing the aforementioned substances may be stacked.

In particular, as an electron-transport material with a deep LUMO, 2,2'-(pyridine-2,6-diyl)bis(4,6-diphenylpyrimidine) (abbreviation: 2,6(P2Pm)2Py), 2,9-bis(naphthalen-2-yl)-4,7-diphenyl-1,10-phenanthroline (abbreviation: NBPhen), 2,2'-(pyridine-2,6-diyl)bis(4-phenylbenzo[h]quinazoline) (abbreviation: 2,6(P-Bqn)2Py), or the like is preferably used.

As another electron-transport material with a deep LUMO, a substance including a condensed heteroaromatic ring skeleton including a diazine skeleton or a triazine skeleton in its molecular structure is preferably used. A substance including a pyrazine skeleton or a pyrimidine skeleton in its molecular structure is also preferably used.

The LUMO level of the material used for the electron-transport layer 118 is preferably made lower than the LUMO level of the host material 131 contained in the light-emitting layer 130, in which case an energy barrier against the transfer of carrier electrons can be formed. The energy barrier hinders the transfer of carrier electrons to the light-emitting layer 130, so that the carrier recombination region in the light-emitting layer 130 spreads to the electron-transport layer 118 side, and both the triplet excitons and the carrier electrons have a lower density in the recombination region, resulting in a decrease in the quenching of the excitons caused by the injection of carrier electrons to the triplet excitons.

Between the electron-transport layer 118 and the light-emitting layer 130, a layer that controls the transport of electron carriers may be provided. This is a layer formed by the addition of a small amount of a substance having a high electron-trapping property to the aforementioned material having a high electron-transport property, and the layer is capable of adjusting carrier balance by retarding the transport of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound or a high molecular compound (e.g., an oligomer, a dendrimer, or a polymer) may be used in the light-emitting layer, the hole-injection layer, the hole-transport layer, the electron-transport layer, and the electron-injection layer.

<<Substrate>>

The light-emitting element 150 may be fabricated over a substrate of glass, plastic, or the like. As the way of stacking layers over the substrate, layers may be sequentially stacked from the electrode 101 side or sequentially stacked from the electrode 102 side.

Note that, for example, glass, quartz, plastic, or the like can be used for the substrate over which the light-emitting element 150 can be formed. Alternatively, a flexible substrate can be used. The flexible substrate is a substrate that can be bent, such as a plastic substrate made of polycarbonate or polyarylate, for example. A film, an inorganic film formed by evaporation, or the like can also be used. Note that materials other than these can be used as long as they can function as a support in a manufacturing process of the light-emitting element and an optical element or as long as they have a function of protecting the light-emitting element and the optical element.

The light-emitting element 150 can be formed using a variety of substrates, for example. The type of substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include a barium borosilicate glass substrate, an aluminoborosilicate glass substrate, and a soda lime glass substrate. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, and polyvinyl chloride. Other examples are polyamide, polyimide, aramid, epoxy, an inorganic film formed by evaporation, and paper.

Alternatively, a flexible substrate may be used as the substrate, and the light-emitting element may be provided directly on the flexible substrate. Alternatively, a separation layer may be provided between the substrate and the light-emitting element. The separation layer can be used when part or the whole of the light-emitting element formed over the separation layer is completed, separated from the substrate, and transferred to another substrate. In such a case, the light-emitting element can be transferred to a substrate having low heat resistance or a flexible substrate as well. For the above separation layer, a stack including inorganic films, which are a tungsten film and a silicon oxide film, or a resin film of polyimide or the like formed over a substrate can be used, for example.

In other words, after the light-emitting element is formed using a substrate, the light-emitting element may be transferred to another substrate. Examples of a substrate to which the light-emitting element is transferred include, in addition to the above-described substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), a leather substrate, and a rubber substrate. By using such a substrate, a light-emitting element with high durability, a light-emitting element with high heat resistance, a light-weight light-emitting element, or a thin light-emitting element can be obtained.

The light-emitting element 150 may be formed over an electrode electrically connected to a field-effect transistor (FET), for example, which is formed over the above-mentioned substrate, so that an active matrix display device in which the FET controls the drive of the light-emitting element 150 can be manufactured.

One embodiment of the present invention has been described in this embodiment. Another embodiment will also be described in the other embodiments. Note that one embodiment of the present invention is not limited to these. For example, one embodiment of the present invention shows, but is not limited to, an example in which the proportion of a delayed fluorescence component due to TTA is greater than or equal to 10% of light emission from an EL layer and the LUMO level of a material contained in an electron-transport layer is lower than the LUMO level of a host material contained in a light-emitting layer. Depending on circumstances or conditions, in one embodiment of the present invention, the delayed fluorescence component need not account for greater than or equal to 10% of light emission from the EL layer. Alternatively, the LUMO level of the material contained in the electron-transport layer may be higher than the LUMO level of the host material. As another example, one embodiment of the present invention shows, but is not limited to, an example in which the LUMO level of a material contained in an electron-transport layer is lower than the LUMO level of a host material contained in a light-emitting layer by greater than or equal to 0.05 eV. Depending on circumstances or conditions, in one embodiment of the present invention, for example, the LUMO level of the material contained in the electron-transport layer need not be lower than the LUMO level of the host material contained in the light-emitting layer by greater than or equal to 0.05 eV.

The structure described above in this embodiment can be combined with any of the structures described in the other embodiments as appropriate.

Embodiment 2

In this embodiment, structure examples of the light-emitting element of one embodiment of the present invention, which is described in Embodiment 1, will be described with reference to FIG. 5 to FIG. 7B.

<Structure Example 1 of Light-Emitting Element>

Figure 5:
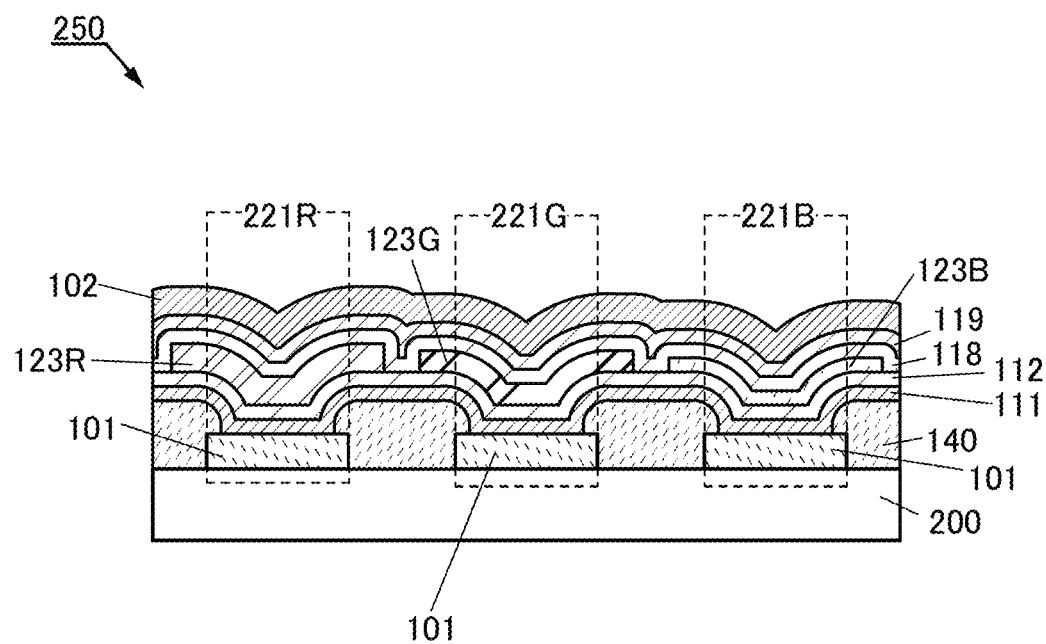
FIG. 5 is a schematic cross-sectional view of a light-emitting element of one embodiment of the present invention.

A structure example of the light-emitting element of one embodiment of the present invention will be described below with reference to FIG. 5. FIG. 5 is a cross-sectional view illustrating a light-emitting element of one embodiment of the present invention.

A light-emitting element 250 in FIG. 5 has a bottom-emission structure in which light is extracted through a substrate 200. However, one embodiment of the present invention is not limited to this structure and may have a top-emission structure in which light emitted from the light-emitting element is extracted in the direction opposite to the substrate 200 or a dual-emission structure in which light emitted from the light-emitting element is extracted in both top and bottom directions of the substrate 200 over which the light-emitting element is formed.

The light-emitting element 250 includes the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 118, and the electron-injection layer 119 are also provided.

In the case where the light-emitting element has a bottom emission structure, the electrode 101 preferably has a function of transmitting light and the electrode 102 preferably has a function of reflecting light.

In the light-emitting element 250 illustrated in FIG. 5, a partition wall 140 is provided between a region 221B, a region 221G, and a region 221R, which are sandwiched between the electrode 101 and the electrode 102. The partition wall 140 has an insulating property. The partition wall 140 covers end portions of the electrode 101 and has openings overlapping with the electrode. With the partition wall 140, the electrode 101 provided over the substrate 200 in the regions can be divided into island shapes.

The light-emitting layers 123B, 123G, and 123R preferably contain light-emitting materials having functions of emitting light of different colors. For example, when the light-emitting layer 123B, the light-emitting layer 123G, and the light-emitting layer 123R contain light-emitting materials having functions of emitting blue light, green light, and red light, respectively, the light-emitting element 250 can be used in a full-color display device. The thicknesses of the light-emitting layers may be the same or different.

As described in Embodiment 1, the LUMO level of a material used in the electron-transport layer 118 is made lower than the LUMO level of a host material contained in the light-emitting layer 123B. This allows the fabrication of a light-emitting element in which a delayed fluorescence component accounts for a relatively high proportion of light emission from the light-emitting layer 123B.

Note that one or more of the light-emitting layers 123B, 123G, and 123R may include two or more stacked layers.

<Structure Example 2 of Light-Emitting Element>

Next, structure examples different from the light-emitting element illustrated in FIG. 5 will be described below with reference to FIGS. 6A and 6B.

Figure 6A:
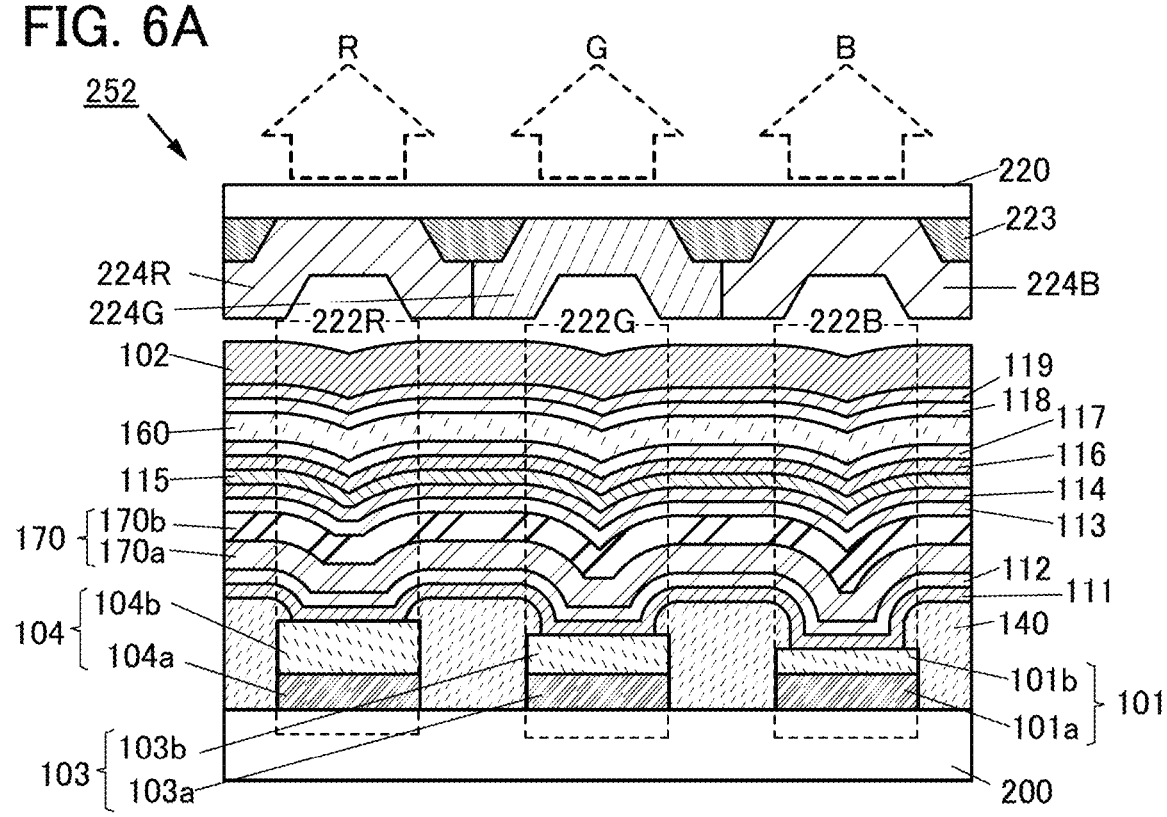
FIGS. 6A and 6B are schematic cross-sectional views of light-emitting elements of one embodiment of the present invention.
Figure 6B:
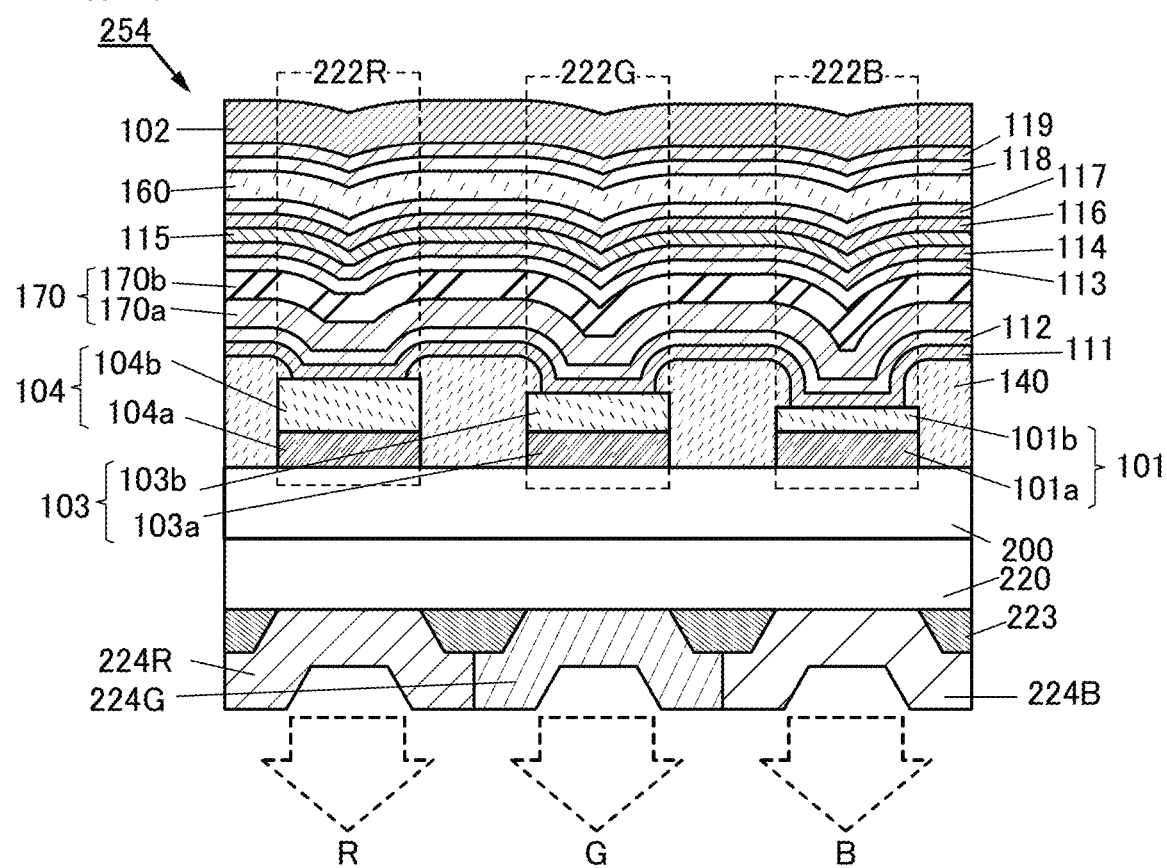

FIGS. 6A and 6B are cross-sectional views of a light-emitting element of one embodiment of the present invention. In FIGS. 6A and 6B, a portion having a function similar to that in FIG. 5 is represented by the same hatch pattern as in FIG. 5 and not especially denoted by a reference numeral in some cases. In addition, common reference numerals are used for portions having similar functions, and a detailed description of such portions is not repeated in some cases.

FIGS. 6A and 6B each illustrate a structure example of a tandem light-emitting element in which a plurality of light-emitting layers are stacked between a pair of electrodes with a charge-generation layer 115 provided between the light-emitting layers. A light-emitting element 252 illustrated in FIG. 6A has a top-emission structure in which light is extracted in a direction opposite to the substrate 200, and a light-emitting element 254 illustrated in FIG. 6B has a bottom-emission structure in which light is extracted through the substrate 200. However, one embodiment of the present invention is not limited to these structures and may have a dual-emission structure in which light emitted from the light-emitting element is extracted in both top and bottom directions of the substrate 200 over which the light-emitting element is formed.

The light-emitting elements 252 and 254 each include the electrode 101, the electrode 102, an electrode 103, and an electrode 104 over the substrate 200. A light-emitting layer 160, the charge-generation layer 115, and a light-emitting layer 170 are provided between the electrode 101 and the electrode 102, between the electrode 102 and the electrode 103, and between the electrode 102 and the electrode 104. The hole-injection layer 111, the hole-transport layer 112, an electron-transport layer 113, an electron-injection layer 114, a hole-injection layer 116, a hole-transport layer 117, the electron-transport layer 118, and the electron-injection layer 119 are further provided.

The electrode 101 includes a conductive layer 101a and a conductive layer 101b over and in contact with the conductive layer 101a. The electrode 103 includes a conductive layer 103a and a conductive layer 103b over and in contact with the conductive layer 103a. The electrode 104 includes a conductive layer 104a and a conductive layer 104b over and in contact with the conductive layer 104a.

In the light-emitting element 252 illustrated in FIG. 6A and the light-emitting element 254 illustrated in FIG. 6B, the partition wall 140 is provided between a region 222B sandwiched between the electrode 101 and the electrode 102, a region 222G sandwiched between the electrode 102 and the electrode 103, and a region 222R sandwiched between the electrode 102 and the electrode 104. The partition wall 140 has an insulating property. The partition wall 140 covers end portions of the electrodes 101, 103, and 104 and has openings overlapping with the electrodes. With the partition wall 140, the electrodes provided over the substrate 200 in the regions can be divided into island shapes.

The light-emitting elements 252 and 254 each include a substrate 220 provided with an optical element 224B, an optical element 224G, and an optical element 224R in the direction in which light emitted from the region 222B, light emitted from the region 222G, and light emitted from the region 222R are extracted, respectively. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

Note that in FIGS. 6A and 6B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that the light-blocking layer 223 may be omitted.

<<Microcavity>>

Furthermore, the light-emitting elements 252 and 254 each have a microcavity structure.

Light emitted from the light-emitting layers 160 and 170 resonates between a pair of electrodes (e.g., the electrodes 101 and 102). In each of the light-emitting elements 252 and 254, the thicknesses of the conductive layers (the conductive layer 101b, the conductive layer 103b, and the conductive layer 104b) in each region are adjusted so that the wavelength of light emitted from the light-emitting layers 160 and 170 can be intensified. Note that the thickness of at least one of the hole-injection layer 111 and the hole-transport layer 112 may differ between the regions so that the wavelength of light emitted from the light-emitting layers 160 and 170 is intensified.

For example, in the case where the refractive index of the conductive material having a function of reflecting light in the electrodes 101 to 104 is lower than the refractive index of the light-emitting layer 160 or 170, the thickness of the conductive layer 101b of the electrode 101 is adjusted so that the optical path length between the electrode 101 and the electrode 102 is $m_B\lambda_B/2$ ($m_B$ is a natural number and $\lambda_B$ is a wavelength of light which is intensified in the region 222B). Similarly, the thickness of the conductive layer 103b of the electrode 103 is adjusted so that the optical path length between the electrode 103 and the electrode 102 is $m_G\lambda_G/2$ ($m_G$ is a natural number and $\lambda_G$ is a wavelength of light which is intensified in the region 222G). Furthermore, the thickness of the conductive layer 104b of the electrode 104 is adjusted so that the optical path length between the electrode 104 and the electrode 102 is $m_R\lambda_R/2$ ($m_R$ is a natural number and $\lambda_R$ is a wavelength of light which is intensified in the region 222R).

In the above manner, with the microcavity structure, in which the optical path length between the pair of electrodes in the respective regions is adjusted, scattering and absorption of light in the vicinity of the electrodes can be suppressed, resulting in high outcoupling efficiency. In the above structure, each of the conductive layers 101b, 103b, and 104b preferably has a function of transmitting light. The materials of the conductive layers 101b, 103b, and 104b may be the same or different. The conductive layers 101b, 103b, and 104b may each have two or more stacked layers.

Note that since the light-emitting element 252 illustrated in FIG. 6A has a top-emission structure, it is preferable that the conductive layer 101a of the electrode 101, the conductive layer 103a of the electrode 103, and the conductive layer 104a of the electrode 104 have a function of reflecting light. In addition, it is preferable that the electrode 102 have functions of transmitting light and reflecting light.

Since the light-emitting element 254 illustrated in FIG. 6B has a bottom-emission structure, it is preferable that the conductive layer 101a of the electrode 101, the conductive layer 103a of the electrode 103, and the conductive layer 104a of the electrode 104 have functions of transmitting light and reflecting light. In addition, it is preferable that the electrode 102 have a function of reflecting light.

Materials used for the conductive layers 101a, 103a, and 104a may be the same or different in each of the light-emitting elements 252 and 254. When the conductive layers 101a, 103a, and 104a are formed using the same materials, manufacturing costs of the light-emitting elements 252 and 254 can be reduced. The conductive layers 101a, 103a, and 104a may each have two or more stacked layers.

As described in Embodiment 1, the LUMO level of the material used in the electron-transport layer 113 is made lower than the LUMO level of the host material contained in the light-emitting layer 170, or the LUMO level of the material used in the electron-transport layer 118 is made lower than the LUMO level of the host material contained in the light-emitting layer 160. This allows the fabrication of a light-emitting element in which a delayed fluorescence component accounts for a relatively high proportion of light emission from the light-emitting layer.

The light-emitting layers 160 and 170 can each have a stacked-layer structure of two layers, for example, a light-emitting layer 170a and a light-emitting layer 170b. By using two kinds of light-emitting materials (a first compound and a second compound) having functions of emitting light of different colors in the two light-emitting layers, light of a plurality of emission colors can be obtained at the same time. It is particularly preferable to select light-emitting materials so that white light can be obtained by combining light emission from the light-emitting layers 160 and 170.

The light-emitting layer 160 or 170 may have a structure in which three or more layers are stacked or may include a layer containing no light-emitting material.

The structure described in this embodiment can be combined with any of the structures described in the other embodiments as appropriate.

Embodiment 3

In this embodiment, light-emitting elements having structures different from those described in Embodiments 1 and 2 and emission mechanisms of the light-emitting elements will be described below with reference to FIG. 7A to FIG. 8B.

<Structure Example 1 of Light-Emitting Element>

Figure 7A:
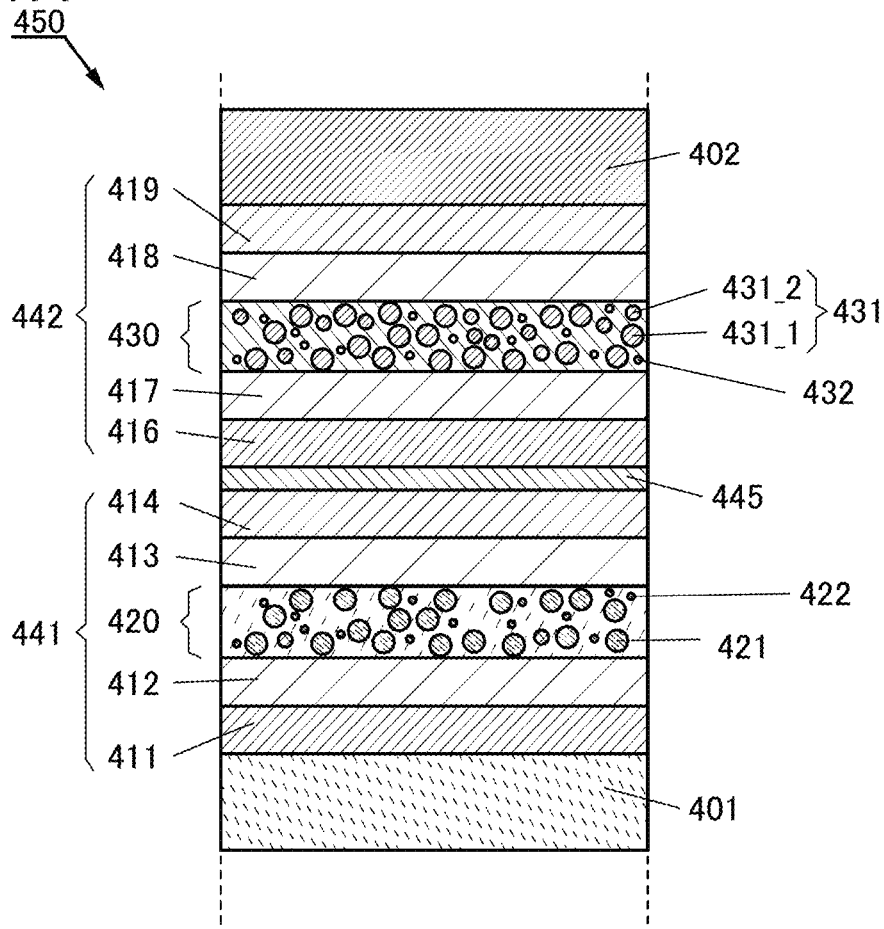
FIGS. 7A and 7B are a schematic cross-sectional view of a light-emitting element of one embodiment of the present invention and a schematic diagram illustrating the correlation of energy levels.

FIG. 7A is a schematic cross-sectional view of a light-emitting element 450.

The light-emitting element 450 illustrated in FIG. 7A includes a plurality of light-emitting units (a light-emitting unit 441 and a light-emitting unit 442 in FIG. 7A) between a pair of electrodes (an electrode 401 and an electrode 402). One light-emitting unit has the same structure as the EL layer 100 illustrated in FIG. 1A. That is, the light-emitting element 150 in FIG. 1A includes one light-emitting unit, whereas the light-emitting element 450 includes a plurality of light-emitting units. Note that the electrode 401 functions as an anode and the electrode 402 functions as a cathode in the following description of the light-emitting element 450; however, the functions may be interchanged in the light-emitting element 450.

In the light-emitting element 450 illustrated in FIG. 7A, the light-emitting unit 441 and the light-emitting unit 442 are stacked, and a charge-generation layer 445 is provided between the light-emitting unit 441 and the light-emitting unit 442. Note that the light-emitting unit 441 and the light-emitting unit 442 may have the same structure or different structures. For example, the EL layer 100 illustrated in FIG. 1A is preferably used in the light-emitting unit 441.

That is, the light-emitting element 450 includes a light-emitting layer 420 and a light-emitting layer 430. The light-emitting unit 441 includes a hole-injection layer 411, a hole-transport layer 412, an electron-transport layer 413, and an electron-injection layer 414 in addition to the light-emitting layer 420. The light-emitting unit 442 includes a hole-injection layer 416, a hole-transport layer 417, an electron-transport layer 418, and an electron-injection layer 419 in addition to the light-emitting layer 430.

The charge-generation layer 445 contains a composite material of an organic compound and an acceptor substance. For the composite material, the composite material that can be used for the hole-injection layer 111 described in Embodiment 1 may be used. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1\times10^{-6}$ cm$^2$/Vs or higher is preferably used. Note that any other material may be used as long as it has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 445 as that of the light-emitting unit 442, the charge-generation layer 445 can also serve as a hole-injection layer or a hole-transport layer of the light-emitting unit; thus, a hole-injection layer or a hole-transport layer does need not be included in the light-emitting unit.

The charge-generation layer 445 may have a stacked-layer structure of a layer containing the composite material of an organic compound and an acceptor substance and a layer containing another material. For example, the charge-generation layer 445 may be formed using a combination of a layer containing the composite material of an organic compound and an acceptor substance with a layer containing one compound selected from among materials having an electron donating property and a compound having a high electron-transport property. Furthermore, the charge-generation layer 445 may be formed using a combination of a layer containing the composite material of an organic compound and an acceptor substance with a layer including a transparent conductive film.

The charge-generation layer 445 provided between the light-emitting unit 441 and the light-emitting unit 442 may have any structure as long as electrons can be injected to the light-emitting unit on one side and holes can be injected into the light-emitting unit on the other side when a voltage is applied between the electrode 401 and the electrode 402. For example, in FIG. 7A, the charge-generation layer 445 injects electrons into the light-emitting unit 441 and holes into the light-emitting unit 442 when a voltage is applied such that the potential of the electrode 401 is higher than that of the electrode 402.

Although the light-emitting element in FIG. 7A includes the two light-emitting units, the light-emitting element may include three or more light-emitting units stacked. When a plurality of light-emitting units partitioned by the charge-generation layer are arranged between a pair of electrodes as in the light-emitting element 450, a high-luminance light-emitting element with a long lifetime can be achieved while the current density is kept low. A light-emitting element with low power consumption can also be provided.

The light-emitting layer 420 includes a host material 421 and a guest material 422. The light-emitting layer 430 includes a host material 431 and a guest material 432. The host material 431 includes an organic compound 431_1 and an organic compound 431_2.

In this embodiment, the light-emitting layer 420 has a structure similar to that of the light-emitting layer 130 in FIG. 1A. That is, the host material 421 and the guest material 422 in the light-emitting layer 420 correspond to the host material 131 and the guest material 132, respectively, in the light-emitting layer 130. In the following description, the guest material 432 contained in the light-emitting layer 430 is a phosphorescent material. Note that the electrode 401, the electrode 402, the hole-injection layers 411 and 416, the hole-transport layers 412 and 417, the electron-transport layers 413 and 418, and the electron-injection layers 414 and 419 correspond to the electrode 101, the electrode 102, the hole-injection layer 111, the hole-transport layer 112, the electron-transport layer 118, and the electron-injection layer 119 in Embodiment 1, respectively. Therefore, detailed description thereof is omitted in this embodiment.

As described in Embodiment 1, the LUMO level of the material used in the electron-transport layer 413 is made lower than the LUMO level of the host material contained in the light-emitting layer 420, or the LUMO level of the material used in the electron-transport layer 418 is made lower than the LUMO level of the host material contained in the light-emitting layer 430. This allows the fabrication of a light-emitting element in which a delayed fluorescence component accounts for a relatively high proportion of light emission from the light-emitting layer.

<<Emission mechanism of light-emitting layer 420>>

The emission mechanism of the light-emitting layer 420 is similar to that of the light-emitting layer 130 in FIG. 1A.

<<Emission Mechanism of Light-Emitting Layer 430>>

Next, the emission mechanism of the light-emitting layer 430 will be described below.

The organic compound 431_1 and the organic compound 431_2 which are contained in the light-emitting layer 430 form an exciplex. The organic compound 431_1 serves as a host material and the organic compound 431_2 serves as an assist material in the description here.

Although it is acceptable as long as the combination of the organic compound 431_1 and the organic compound 431_2 can form an exciplex in the light-emitting layer 430, it is preferred that one organic compound be a material having a hole-transport property and the other organic compound be a material having an electron-transport property.

Figure 7B:
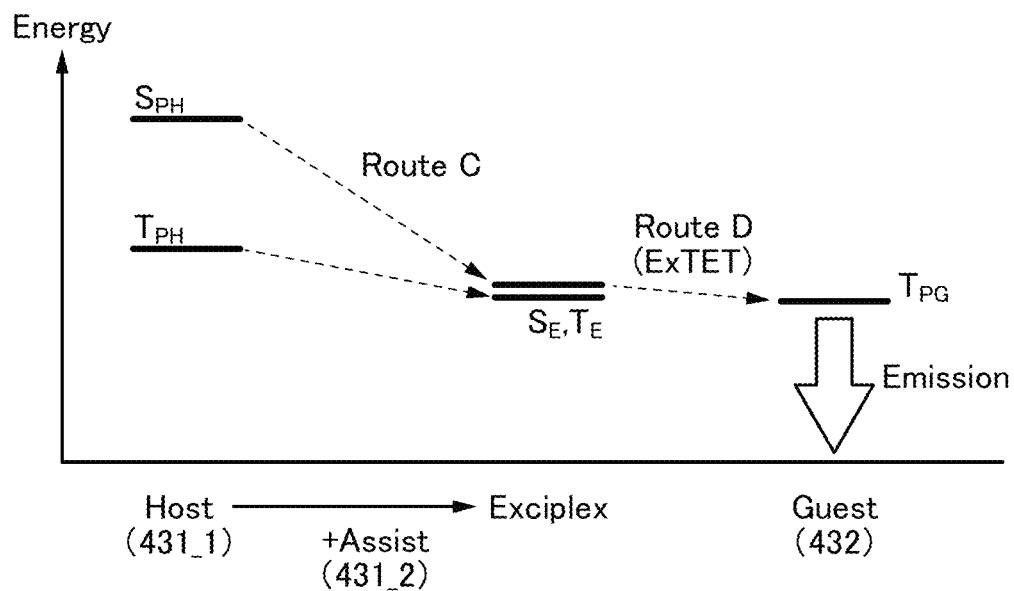

FIG. 7B illustrates the correlation of energy levels of the organic compound 431_1, the organic compound 431_2, and the guest material 432 in the light-emitting layer 430. The following explains what terms and signs in FIG. 7B represent:

Host (431_1): the organic compound 431_1 (host material);

Assist (431_2): the organic compound 431_2 (assist material);

Guest (432): the guest material 432 (phosphorescent material);

Exciplex: exciplex $S_{PH}$: the level of the lowest singlet excited state of the organic compound 431_1;

$T_{PH}$: the level of the lowest triplet excited state of the organic compound 431_1;

$T_{PG}$: the level of the lowest triplet excited state of the guest material 432 (phosphorescent material);

$S_E$: the level of the lowest singlet excited state of the exciplex; and $T_E$: the level of the lowest triplet excited state of the exciplex.

The level ($S_E$) of the lowest singlet excited state of the exciplex, which is formed by the organic compound 431_1 and the organic compound 431_2 and the level ($T_E$) of the lowest triplet excited state of the exciplex are close to each other (see Route C in FIG. 7B).

Both energies of $S_E$ and $T_E$ of the exciplex are then transferred to the level of the lowest triplet excited state of the guest material 432 (phosphorescent material), so that light emission is obtained (see Route D in FIG. 7B).

The above-described processes through Route C and Route D may be referred to as exciplex-triplet energy transfer (ExTET) in this specification and the like.

When one of the organic compounds 431_1 and 431_2 receiving holes and the other receiving electrons come close to each other, the exciplex is formed at once. Alternatively, when one compound is brought into an excited state, the one immediately interacts with the other compound to form the exciplex. Therefore, most excitons in the light-emitting layer 430 exist as exciplexes. The band gap of the exciplex is narrower than that of each of the organic compounds 431_1 and 431_2; therefore, the driving voltage can be lowered when the exciplex is formed by recombination of a hole and an electron.

When the light-emitting layer 430 has the above structure, light emission from the guest material 432 (phosphorescent material) of the light-emitting layer 430 can be efficiently obtained.

Note that light emitted from the light-emitting layer 420 preferably has a peak on the shorter wavelength side than light emitted from the light-emitting layer 430. The luminance of a light-emitting element using the phosphorescent material emitting light with a short wavelength tends to degrade quickly. By using fluorescence for light emission with a short wavelength, a light-emitting element with less degradation of luminance can be provided.

Furthermore, the light-emitting layer 420 and the light-emitting layer 430 may be made to emit light with different emission wavelengths, so that the light-emitting element can be a multicolor light-emitting element. In that case, the emission spectrum of the light-emitting element is formed by combining light having different emission peaks, and thus has at least two peaks.

The above structure is also suitable for obtaining white light emission. When the light-emitting layer 420 and the light-emitting layer 430 emit light of complementary colors, white light emission can be obtained.

In addition, white light emission with a high color rendering property that is formed of three primary colors or four or more colors can be obtained by using a plurality of light-emitting materials emitting light with different wavelengths for one of the light-emitting layers 420 and 430 or both. In that case, one of the light-emitting layers 420 and 430 or both may be divided into layers and each of the divided layers may contain a different light-emitting material from the others.

<Examples of Material that can be Used for Light-Emitting Layer>

Next, materials that can be used for the light-emitting layers 420 and 430 will be described.

<<Material that can be Used for Light-Emitting Layer 420>>

Any of the materials that can be used for the light-emitting layer 130 described in Embodiment 1 may be used as a material that can be used for the light-emitting layer 420.

<<Material that can be Used for Light-Emitting Layer 430>>

In the light-emitting layer 430, the organic compound 431_1 (host material) exists in the highest proportion in weight ratio, and the guest material 432 (phosphorescent material) is dispersed in the organic compound 431_1 (host material).

Examples of the organic compound 431_1 (host material) include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples are an aromatic amine, a carbazole derivative, and the like.

As the guest material 432 (phosphorescent material), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand, and the like can be given.

As the organic compound 431_2 (assist material), a substance which can form an exciplex together with the organic compound 431_1 is used. In that case, it is preferable that the organic compound 431_1, the organic compound 431_2, and the guest material 432 (phosphorescent material) be selected such that the emission peak of the exciplex overlaps with an absorption band, specifically an absorption band on the longest wavelength side, of a triplet metal to ligand charge transfer (MLCT) transition of the guest material 432 (phosphorescent material). This makes it possible to provide a light-emitting element with drastically improved emission efficiency. Note that in the case where a thermally activated delayed fluorescence material is used instead of the phosphorescent material, it is preferable that the absorption band on the longest wavelength side be a singlet absorption band.

As the light-emitting material contained in the light-emitting layer 430, any material can be used as long as the material can convert triplet excitation energy into light emission. As an example of the material that can convert triplet excitation energy into light emission, a thermally activated delayed fluorescence (TADF) material can be given in addition to the phosphorescent material. Therefore, the term "phosphorescent material" in the description can be replaced with the term "thermally activated delayed fluorescence material". Note that the thermally activated delayed fluorescence material is a material that can up-convert a triplet excited state into a singlet excited state (i.e., reverse intersystem crossing is possible) using a little thermal energy and efficiently exhibits light emission (fluorescence) from the singlet excited state. Thermally activated delayed fluorescence is efficiently obtained under the conditions where the difference between the triplet excitation energy level and the singlet excitation energy level is preferably larger than 0 eV and smaller than or equal to 0.2 eV, further preferably larger than 0 eV and smaller than or equal to 0.1 eV.

The material that emits thermally activated delayed fluorescence may be a material that can form a singlet excited state by itself from a triplet excited state by reverse intersystem crossing or may be a combination of two kinds of materials which form an exciplex.

There is no limitation on the emission colors of the light-emitting materials contained in the light-emitting layers 420 and 430, and they may be the same or different. Light emitted from the light-emitting materials is mixed and extracted out of the element; therefore, for example, in the case where their emission colors are complementary colors, the light-emitting element can emit white light. In consideration of the reliability of the light-emitting element, the emission peak wavelength of the light-emitting material contained in the light-emitting layer 420 is preferably shorter than that of the light-emitting material contained in the light-emitting layer 430.

<Structure Example 2 of Light-Emitting Element>

Next, a structure example different from that of the light-emitting element illustrated in FIGS. 7A and 7B will be described below with reference to FIGS. 8A and 8B.

Figure 8A:
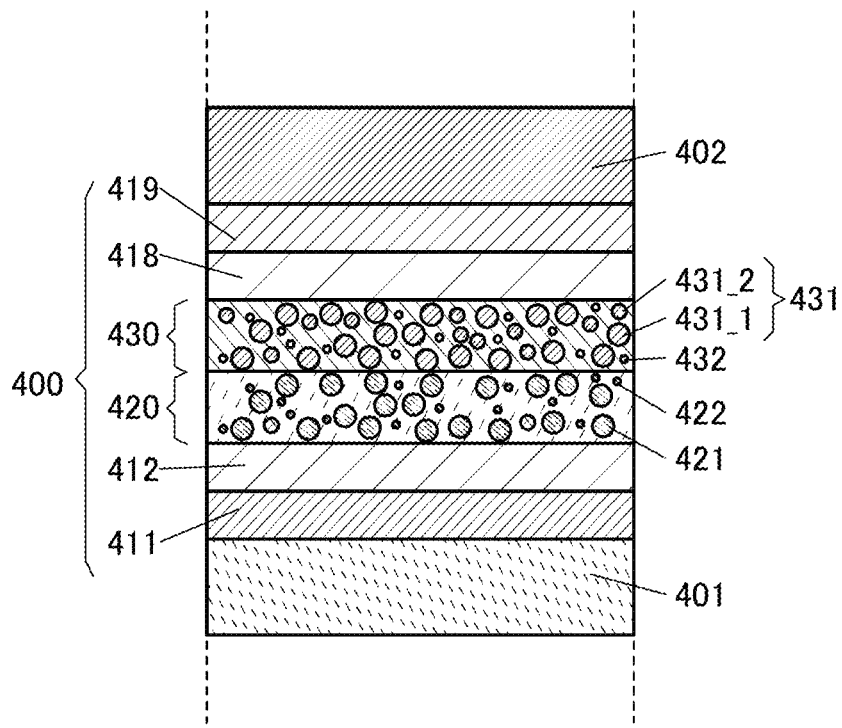
FIGS. 8A and 8B are a schematic cross-sectional view of a light-emitting element of one embodiment of the present invention and a schematic diagram illustrating the correlation of energy levels.

FIG. 8A is a schematic cross-sectional view of a light-emitting element 452.

In the light-emitting element 452 in FIG. 8A, an EL layer 400 is interposed between a pair of electrodes (the electrodes 401 and 402). Note that in the light-emitting element 452, the electrode 401 functions as an anode, and the electrode 402 functions as a cathode.

The EL layer 400 includes the light-emitting layers 420 and 430. As the EL layer 400 in the light-emitting element 452, the light-emitting layers 420 and 430, the hole-injection layer 411, the hole-transport layer 412, the electron-transport layer 418, and the electron-injection layer 419 are illustrated. However, this stacked-layer structure is an example, and the structure of the EL layer 400 in the light-emitting element 452 is not limited thereto. For example, the stacking order of the above layers of the EL layer 400 may be changed. Alternatively, in the EL layer 400, a functional layer other than the above layers may be provided. The functional layer may have a function of injecting a carrier (an electron or a hole), a function of transporting a carrier, a function of inhibiting a carrier, or a function of generating a carrier, for example.

The light-emitting layer 420 includes the host material 421 and the guest material 422. The light-emitting layer 430 includes the host material 431 and the guest material 432. The host material 431 includes the organic compound 431_1 and the organic compound 431_2. In the following description, the guest material 422 is a fluorescent material and the guest material 432 is a phosphorescent material.

<<Emission Mechanism of Light-Emitting Layer 420>>

The emission mechanism of the light-emitting layer 420 is similar to that of the light-emitting layer 130 in FIG. 1A.

<<Emission Mechanism of Light-Emitting Layer 430>>

The emission mechanism of the light-emitting layer 430 is similar to that of the light-emitting layer 430 in FIG. 7A.

<<Emission Mechanism of Light-Emitting Layers 420 and 430>>

Each emission mechanism of the light-emitting layers 420 and 430 is described above. As in the light-emitting element 452, in the case where the light-emitting layers 420 and 430 are in contact with each other, even when energy is transferred from the exciplex to the host material 421 of the light-emitting layer 420 (in particular, when energy of the triplet excited level is transferred) at an interface between the light-emitting layer 420 and the light-emitting layer 430, the triplet excitation energy can be converted into light emission in the light-emitting layer 420.

The T1 level of the host material 421 of the light-emitting layer 420 is preferably lower than T1 levels of the organic compounds 431_1 and 431_2 in the light-emitting layer 430. In the light-emitting layer 420, the S1 level of the host material 421 is preferably higher than the S1 level of the guest material 422 (fluorescent material) while the T1 level of the host material 421 is preferably lower than the T1 level of the guest material 422 (fluorescent material).

Figure 8B:
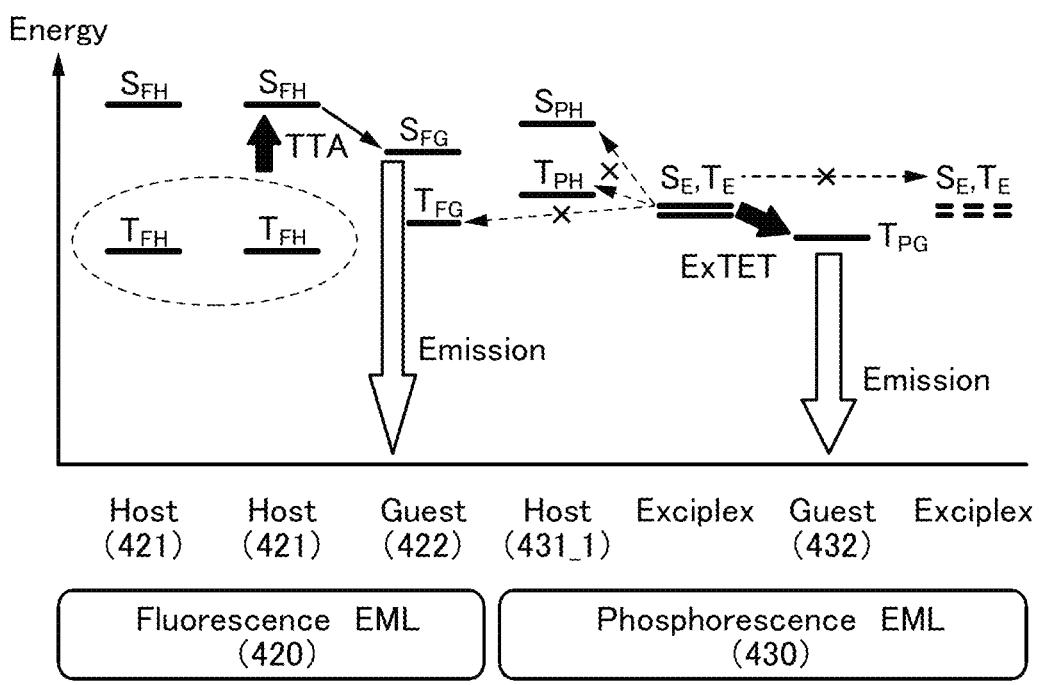

FIG. 8B shows the correlation of energy levels in the case where TTA is utilized in the light-emitting layer 420 and ExTET is utilized in the light-emitting layer 430. The following explains what terms and signs in FIG. 8B represent:

Fluorescence EML (420): the fluorescent light-emitting layer (light-emitting layer 420);

Phosphorescence EML (430): the phosphorescent light-emitting layer (light-emitting layer 430);

$S_{FH}$: the level of the lowest singlet excited state of the host material 421;

$T_{FH}$: the level of the lowest triplet excited state of the host material 421;

$S_{FG}$: the level of the lowest singlet excited state of the guest material 422 (fluorescent material);

$T_{FG}$: the level of the lowest triplet excited state of the guest material 422 (fluorescent material);

$S_{PH}$: the level of the lowest singlet excited state of the host material (organic compound 431_1);

$T_{PH}$: the level of the lowest triplet excited state of the host material (organic compound 431_1);

$T_{PG}$: the level of the lowest triplet excited state of the guest material 432 (phosphorescent material);

$S_E$: the level of the lowest singlet excited state of the exciplex; and $T_E$: the level of the lowest triplet excited state of the exciplex.

As shown in FIG. 8B, the exciplex exists only in an excited state; thus, exciton diffusion between the exciplexes is less likely to occur. In addition, because the excited levels ($S_E$ and $T_E$) of the exciplex are lower than the excited levels ($S_{PH}$ and $T_{PH}$) of the organic compound 431_1 (the host material for the phosphorescent material) of the light-emitting layer 430, energy diffusion from the exciplex to the organic compound 431_1 does not occur. Similarly, energy diffusion from the exciplex to the organic compound 431_2 does not occur. That is, the efficiency of the phosphorescent light-emitting layer (light-emitting layer 430) can be maintained because an exciton diffusion distance of the exciplex is short in the phosphorescent light-emitting layer (light-emitting layer 430). In addition, even when part of the triplet excitation energy of the exciplex of the phosphorescent light-emitting layer (light-emitting layer 430) diffuses into the fluorescent light-emitting layer (light-emitting layer 420) through the interface between the fluorescent light-emitting layer (light-emitting layer 420) and the phosphorescent light-emitting layer (light-emitting layer 430), energy loss can be reduced because the triplet excitation energy in the fluorescent light-emitting layer (light-emitting layer 420) caused by the diffusion is used for light emission through TTA.

As described above, ExTET is utilized in the light-emitting layer 430 and TTA is utilized in the light-emitting layer 420 in the light-emitting element 452, so that energy loss is reduced and a high emission efficiency is achieved. As in the light-emitting element 452, in the case where the light-emitting layers 420 and 430 are in contact with each other, the number of EL layers 400 as well as the energy loss can be reduced. Therefore, a light-emitting element with low manufacturing costs can be obtained.

Note that the light-emitting layers 420 and 430 need not be in contact with each other. In that case, it is possible to prevent energy transfer by the Dexter mechanism (particularly triplet energy transfer) from the organic compound 431_1 or 431_2 in an excited state or the guest material 432 (phosphorescent material) in an excited state which is generated in the light-emitting layer 430 to the host material 421 or the guest material 422 (fluorescent material) in the light-emitting layer 420. Therefore, the thickness of a layer provided between the light-emitting layers 420 and 430 may be several nanometers.

The layer provided between the light-emitting layers 420 and 430 may contain a single material or both a hole-transport material and an electron-transport material. In the case of a single material, a bipolar material may be used. The bipolar material here refers to a material in which the ratio between the electron mobility and the hole mobility is 100 or less. Alternatively, the hole-transport material, the electron-transport material, or the like may be used. At least one of materials included in the layer may be the same as the host material (organic compound 431_1 or 431_2) of the light-emitting layer 430. This facilitates the manufacture of the light-emitting element and reduces the drive voltage. Furthermore, the hole-transport material and the electron-transport material may form an exciplex, which effectively prevents exciton diffusion. Specifically, it is possible to prevent energy transfer from the host material (organic compound 431_1 or 431_2) in an excited state or the guest material 432 (phosphorescent material) in an excited state of the light-emitting layer 430 to the host material 421 or the guest material 422 (fluorescent material) in the light-emitting layer 420.

Note that in the light-emitting element 452, a carrier recombination region is preferably distributed to some extent. Therefore, it is preferable that the light-emitting layer 420 or 430 have an appropriate degree of carrier-trapping property. It is particularly preferable that the guest material 432 (phosphorescent material) in the light-emitting layer 430 have an electron-trapping property. Alternatively, the guest material 422 (fluorescent material) in the light-emitting layer 420 preferably has a hole-trapping property.

Note that light emitted from the light-emitting layer 420 preferably has a peak on the shorter wavelength side than light emitted from the light-emitting layer 430. Since the luminance of a light-emitting element using a phosphorescent material emitting light with a short wavelength tends to degrade quickly, fluorescence with a short wavelength is employed so that a light-emitting element with less degradation of luminance can be provided.

Furthermore, when the light-emitting layers 420 and 430 are made to emit light with different emission wavelengths, a multicolor light-emitting element can be achieved. In that case, the emission spectrum of the light-emitting element is formed by combining light having different emission peaks, and thus has at least two peaks.

The above structure is also suitable for obtaining white light emission. When the light-emitting layers 420 and 430 emit light of complementary colors, white light emission can be obtained.

In addition, white light emission with a high color rendering property that is formed of three primary colors or four or more colors can be obtained by using a plurality of light-emitting substances emitting light with different wavelengths for the light-emitting layer 420. In that case, the light-emitting layer 420 may be divided into layers and each of the divided layers may contain a light-emitting material different from the others.

<Material that can be Used in Light-Emitting Layer>

Next, materials that can be used in the light-emitting layers 420 and 430 will be described.

<<Material that can be Used in Light-Emitting Layer 420>>

In the light-emitting layer 420, the host material 421 is present in the highest proportion by weight, and the guest material 422 (fluorescent material) is dispersed in the host material 421. The S1 level of the host material 421 is preferably higher than the S1 level of the guest material 422 (fluorescent material) while the T1 level of the host material 421 is preferably lower than the T1 level of the guest material 422 (fluorescent material).

<<Material that can be Used in Light-Emitting Layer 430>>

In the light-emitting layer 430, the host material (organic compound 431_1 or 431_2) is present in the highest proportion by weight, and the guest material 432 (phosphorescent material) is dispersed in the host materials (organic compounds 431_1 and 431_2). The T1 levels of the host materials (organic compounds 431_1 and 431_2) of the light-emitting layer 430 is preferably higher than the T1 level of the guest material 422 (fluorescent material) of the light-emitting layer 420.

As the host materials (organic compounds 431_1 and 431_2) and the guest material 432 (phosphorescent material), those in the light-emitting element 450 described in FIGS. 7A and 7B can be used.

Note that the light-emitting layers 420 and 430 can be formed by an evaporation method (including a vacuum evaporation method), an inkjet method, a coating method, gravure printing, or the like.

The structure described in this embodiment can be combined with any of the structures described in the other embodiments as appropriate.

Embodiment 4

In this embodiment, a display device including a light-emitting element of one embodiment of the present invention will be described with reference to FIGS. 9A and 9B.

Figure 9A:
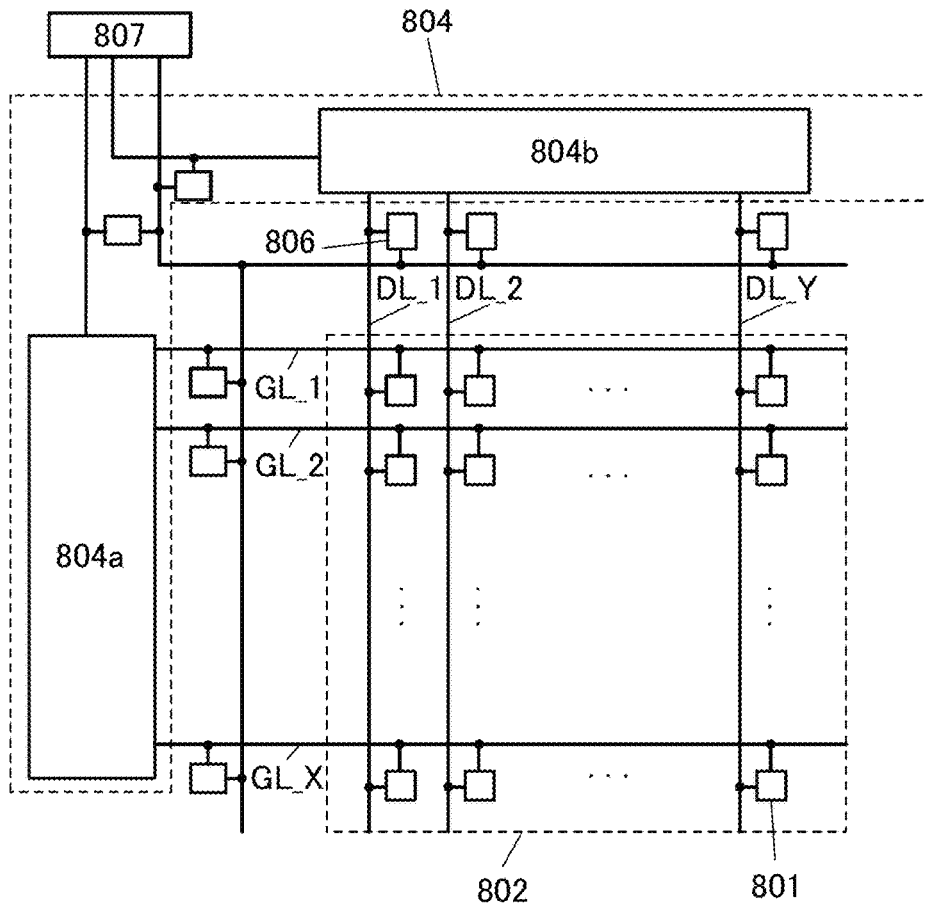
FIGS. 9A and 9B are a block diagram and a circuit diagram illustrating a display device of one embodiment of the present invention.
Figure 9B:
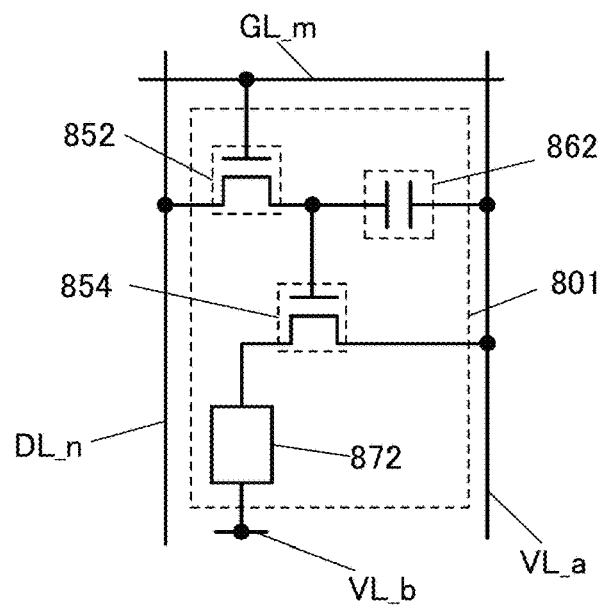

Note that FIG. 9A is a block diagram illustrating the display device of one embodiment of the present invention, and FIG. 9B is a circuit diagram illustrating a pixel circuit of the display device of one embodiment of the present invention.

<Description of Display Device>

The display device illustrated in FIG. 9A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804a) and a circuit for supplying a signal (data signal) to drive a display element in a pixel (the circuit is hereinafter referred to as a signal line driver circuit 804b).

The scan line driver circuit 804a includes a shift register or the like. Through the terminal portion 807, the scan line driver circuit 804a receives a signal for driving the shift register and outputs a signal. For example, the scan line driver circuit 804a receives a start pulse signal, a clock signal, or the like and outputs a pulse signal. The scan line driver circuit 804a has a function of controlling the potentials of wirings supplied with scan signals (such wirings are hereinafter referred to as scan lines GL_1 to GL_X). Note that a plurality of scan line driver circuits 804a may be provided to control the scan lines GL_1 to GL_X separately. Alternatively, the scan line driver circuit 804a has a function of supplying an initialization signal. Without being limited thereto, the scan line driver circuit 804a can supply another signal.

The signal line driver circuit 804b includes a shift register or the like. Through the terminal portion 807, the signal line driver circuit 804b receives a signal (image signal) from which a data signal is derived, as well as a signal for driving the shift register. The signal line driver circuit 804b has a function of generating a data signal to be written to the pixel circuit 801 which is based on the image signal. In addition, the signal line driver circuit 804b has a function of controlling the output of a data signal in response to a pulse signal produced by the input of a start pulse signal, a clock signal, or the like. Furthermore, the signal line driver circuit 804b has a function of controlling the potentials of wirings supplied with data signals (such wirings are hereinafter referred to as data lines DL_1 to DL_Y). Alternatively, the signal line driver circuit 804b has a function of supplying an initialization signal. Without being limited thereto, the signal line driver circuit 804b can supply another signal.

The signal line driver circuit 804b includes a plurality of analog switches, for example. The signal line driver circuit 804b can output, as the data signals, signals obtained by time-dividing the image signal by sequentially turning on the plurality of analog switches. The signal line driver circuit 804b may include a shift register or the like.

To each of the plurality of pixel circuits 801, a pulse signal is input through one of the plurality of scan lines GL supplied with scan signals and a data signal is input through one of the plurality of data lines DL supplied with data signals. Writing and holding of the data signal to and in each of the plurality of pixel circuits 801 are controlled by the scan line driver circuit 804a. For example, to the pixel circuit 801 in the m-th row and the n-th column (m is a natural number of X or less, and n is a natural number of Y or less), a pulse signal is input from the scan line driver circuit 804a through the scan line GL_m, and a data signal is input from the signal line driver circuit 804b through the data line DL_n in accordance with the potential of the scan line GL_m.

The protection circuit 806 shown in FIG. 9A is connected to, for example, the scan line GL between the scan line driver circuit 804a and the pixel circuit 801. Alternatively, the protection circuit 806 is connected to the data line DL between the signal line driver circuit 804b and the pixel circuit 801. Alternatively, the protection circuit 806 can be connected to a wiring between the scan line driver circuit 804a and the terminal portion 807. Alternatively, the protection circuit 806 can be connected to a wiring between the signal line driver circuit 804b and the terminal portion 807. Note that the terminal portion 807 means a portion having terminals for inputting power, control signals, and image signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 9A, the protection circuits 806 are connected to the pixel portion 802 and the driver circuit portion 804, so that the resistance of the display device to overcurrent generated by electrostatic discharge (ESD) or the like can be improved. Note that the configuration of the protection circuits 806 is not limited to that, and for example, the protection circuits 806 may be connected to the scan line driver circuit 804a or the signal line driver circuit 804b. Alternatively, the protection circuits 806 may be connected to the terminal portion 807.

FIG. 9A shows an example in which the driver circuit portion 804 includes the scan line driver circuit 804a and the signal line driver circuit 804b; however, the structure is not limited thereto. For example, only the scan line driver circuit 804a may be formed and a separately prepared substrate where a signal line driver circuit is formed (e.g., a driver circuit substrate formed with a single crystal semiconductor film or a polycrystalline semiconductor film) may be mounted.

<Structure Example of Pixel Circuit>

Each of the plurality of pixel circuits 801 in FIG. 9A can have a structure illustrated in FIG. 9B, for example.

The pixel circuit 801 illustrated in FIG. 9B includes transistors 852 and 854, a capacitor 862, and a light-emitting element 872.

One of a source electrode and a drain electrode of the transistor 852 is electrically connected to a wiring to which a data signal is supplied (a data line DL_n). A gate electrode of the transistor 852 is electrically connected to a wiring to which a gate signal is supplied (a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1 to 3 can be used.

Note that a high power supply potential VDD is supplied to one of the potential supply line VL_a and the potential supply line VL_b, and a low power supply potential VSS is supplied to the other.

In the display device including the pixel circuits 801 in FIG. 9B, for example, the pixel circuits 801 are sequentially selected row by row by the scan line driver circuit 804a in FIG. 9A, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing costs can be reduced or yield can be improved. Alternatively, since the size of these elements is small, the aperture ratio can be improved, so that power consumption can be reduced and higher luminance can be achieved.

As a method other than the active matrix method, the passive matrix method in which an active element (a non-linear element) is not used can also be used. Since an active element (a non-linear element) is not used, the number of manufacturing steps is small, so that manufacturing costs can be reduced or yield can be improved. Alternatively, since an active element (a non-linear element) is not used, the aperture ratio can be improved, so that power consumption can be reduced or higher luminance can be achieved, for example.

The structure described in this embodiment can be combined with any of the structures described in the other embodiments as appropriate.

Embodiment 5

In this embodiment, a display device including a light-emitting element of one embodiment of the present invention and an electronic device in which the display device is provided with an input device will be described with reference to FIGS. 10A to 14.

<Description 1 of Touch Panel>

In this embodiment, a touch panel 2000 including a display device and an input device will be described as an example of an electronic device. In addition, an example of using a touch sensor as an input device will be described.

Figure 10A:
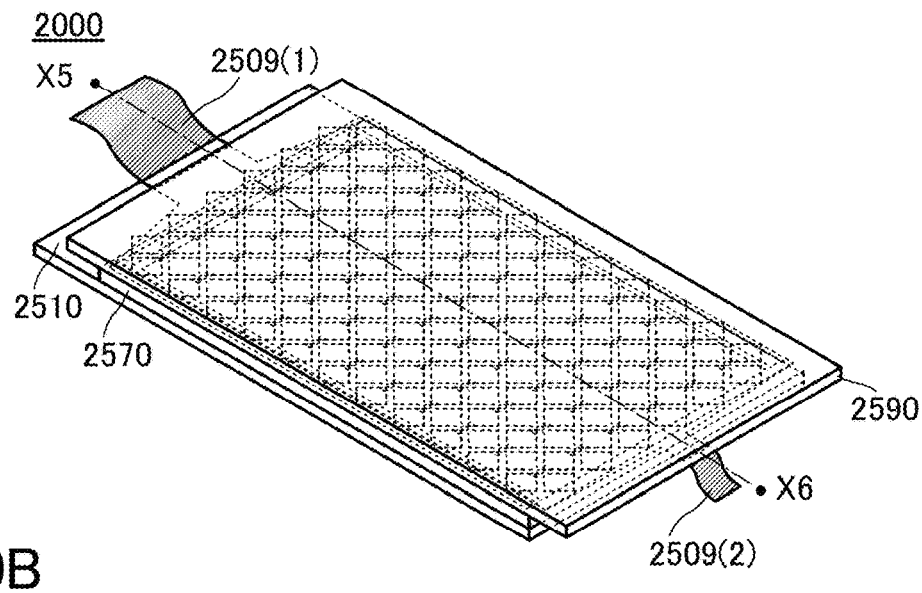
FIGS. 10A and 10B are perspective views illustrating an example of a touch panel of one embodiment of the present invention.
Figure 10B:
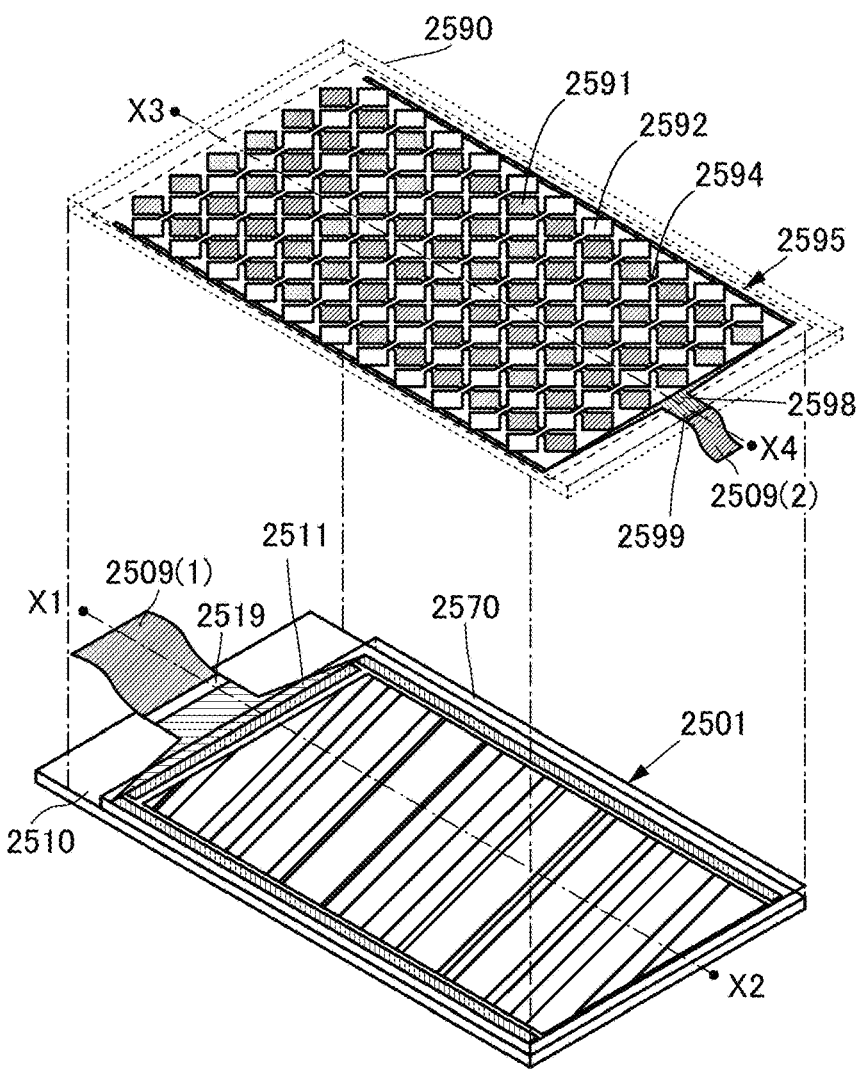

FIGS. 10A and 10B are perspective views of the touch panel 2000. Note that FIGS. 10A and 10B illustrate typical components of the touch panel 2000 for simplicity.

The touch panel 2000 includes a display device 2501 and a touch sensor 2595 (see FIG. 10B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 10B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used, for example. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of the mutual capacitive type is preferable because multiple points can be sensed simultaneously.

Note that the touch sensor 2595 illustrated in FIG. 10B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 have a shape of a plurality of quadrangles arranged in one direction with one corner of a quadrangle connected to one corner of another quadrangle as illustrated in FIGS. 10A and 10B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

<Description of Display Device>

Figure 11A:
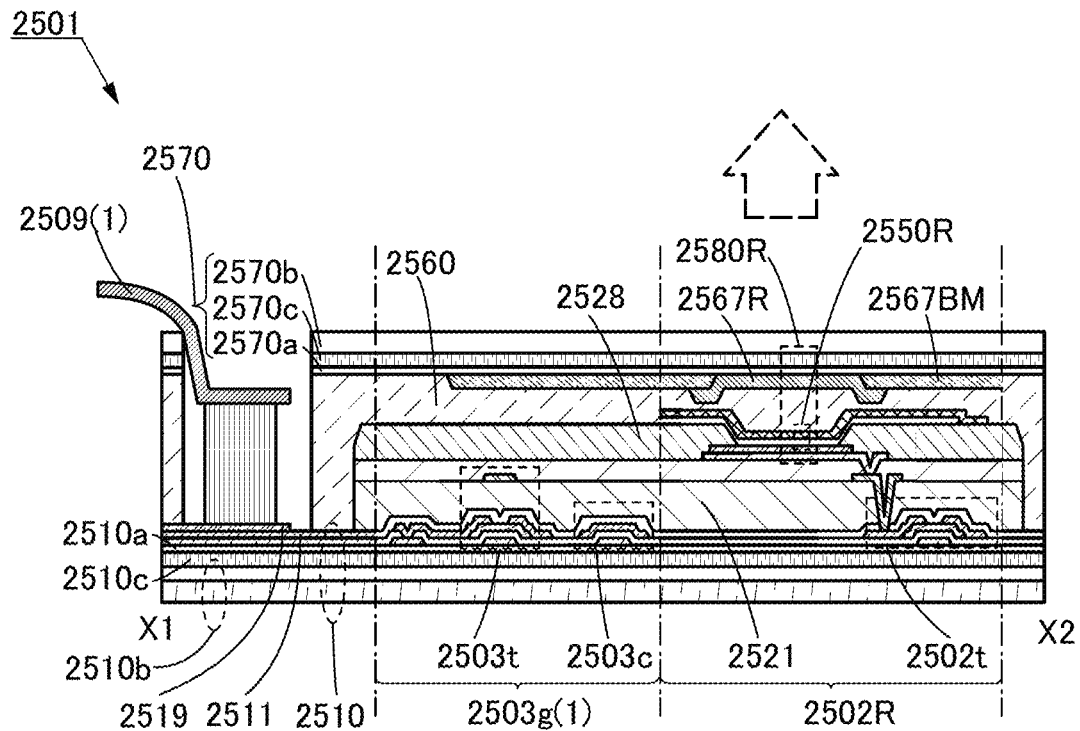
FIGS. 11A to 11C are cross-sectional views illustrating examples of the display device and the touch sensor of one embodiment of the present invention.

Next, the display device 2501 will be described in detail with reference to FIG. 11A. FIG. 11A corresponds to a cross-sectional view taken along dashed-dotted line X1-X2 in FIG. 10B.

The display device 2501 includes a plurality of pixels arranged in a matrix. Each of the pixels includes a display element and a pixel circuit for driving the display element.

An example in which a light-emitting element that emits white light is used as a display element will be described below; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ g·m$^{-2}$·day$^{-1}$, preferably lower than or equal to $1\times10^{-6}$ g·m$^{-2}$·day$^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the light-emitting element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the light-emitting element, a flexible substrate 2570b, and an adhesive layer 2570c for attaching the insulating layer 2570a and the flexible substrate 2570b to each other.

For the adhesive layer 2510c and the adhesive layer 2570c, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 11A, the sealing layer 2560 can also serve as an optical adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen and argon) may be used instead of the sealing layer 2560. A drying agent may be provided in the inert gas so as to adsorb moisture or the like. An ultraviolet curable resin or a heat curable resin may be used; for example, a polyvinyl chloride (PVC) based resin, an acrylic resin, a polyimide-based resin, an epoxy-based resin, a silicone-based resin, a polyvinyl butyral (PVB) based resin, or an ethylene vinyl acetate (EVA) based resin can be used. An epoxy-based resin or a glass frit is preferably used as the sealant. As a material used for the sealant, a material which is impermeable to moisture and oxygen is preferably used.

The display device 2501 includes a pixel 2502R. The pixel 2502R includes a light-emitting module 2580R.

The pixel 2502R includes the light-emitting element 2550R and a transistor 2502t that can supply electric power to the light-emitting element 2550R. Note that the transistor 2502t functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, for example, any of the light-emitting elements described in Embodiments 1 to 4 can be used.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in the drawing.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength region. For example, a color filter for transmitting light in a red wavelength region, a color filter for transmitting light in a green wavelength region, a color filter for transmitting light in a blue wavelength region, a color filter for transmitting light in a yellow wavelength region, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t. Note that the insulating layer 2521 has a function of covering unevenness caused by the pixel circuit. The insulating layer 2521 may have a function of suppressing impurity diffusion. This can prevent the reliability of the transistor 2502t or the like from being lowered by impurity diffusion.

The light-emitting element 2550R is formed over the insulating layer 2521. A partition wall 2528 is provided so as to overlap with an end portion of the lower electrode of the light-emitting element 2550R. Note that a spacer for controlling the distance between the substrate 2510 and the substrate 2570 may be formed over the partition wall 2528.

A scan line driver circuit 2503g(1) includes a transistor 2503t and a capacitor 2503c. Note that the driver circuit and the pixel circuits can be formed in the same process and over the same substrate.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Figure 11B:
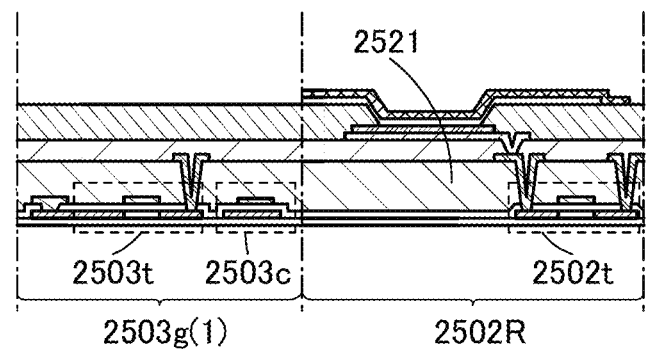

In the display device 2501, transistors with any of a variety of structures can be used. FIG. 11A illustrates an example of using bottom-gate transistors; however, the present invention is not limited to this example, and top-gate transistors may be used in the display device 2501 as illustrated in FIG. 11B.

In addition, there is no particular limitation on the polarity of the transistor 2502t and the transistor 2503t. For these transistors, n-channel and p-channel transistors may be used, or either n-channel transistors or p-channel transistors may be used, for example. Furthermore, there is no particular limitation on the crystallinity of a semiconductor film used for the transistors 2502t and 2503t. For example, an amorphous semiconductor film or a crystalline semiconductor film may be used. Examples of semiconductor materials include Group 13 semiconductors (e.g., a semiconductor including gallium), Group 14 semiconductors (e.g., a semiconductor including silicon), compound semiconductors (including oxide semiconductors), and organic semiconductors. An oxide semiconductor that has an energy gap of 2 eV or more, preferably 2.5 eV or more, further preferably 3 eV or more is preferably used for one of the transistors 2502t and 2503t or both, so that the off-state current of the transistors can be reduced. Examples of the oxide semiconductors include an In—Ga oxide and an In-M-Zn oxide (M represents aluminum (Al), gallium (Ga), yttrium (Y), zirconium (Zr), lanthanum (La), cerium (Ce), tin (Sn), hafnium (Hf), or neodymium (Nd)).

<Description of Touch Sensor>

Figure 11C:
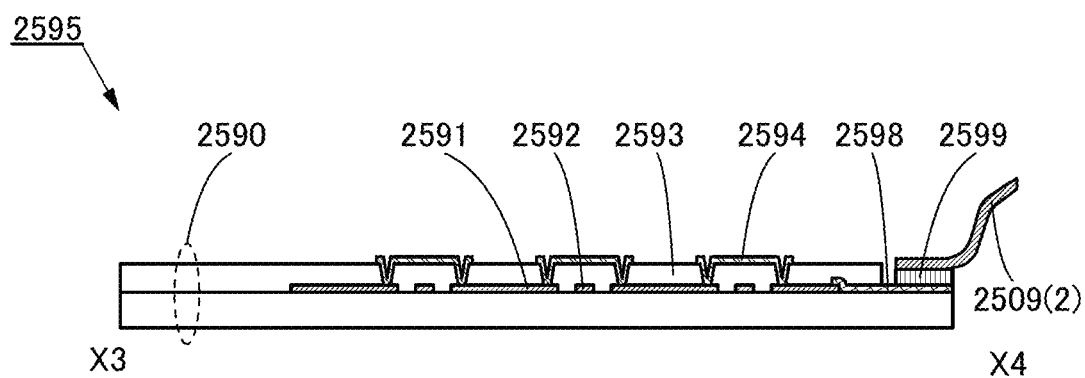

Next, the touch sensor 2595 will be described in detail with reference to FIG. 11C. FIG. 11C corresponds to a cross-sectional view taken along dashed-dotted line X3-X4 in FIG. 10B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond such as silicone, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material having higher conductivity than the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

One electrode 2592 is provided between the pair of electrodes 2591. The wiring 2594 electrically connects the pair of electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 12A:
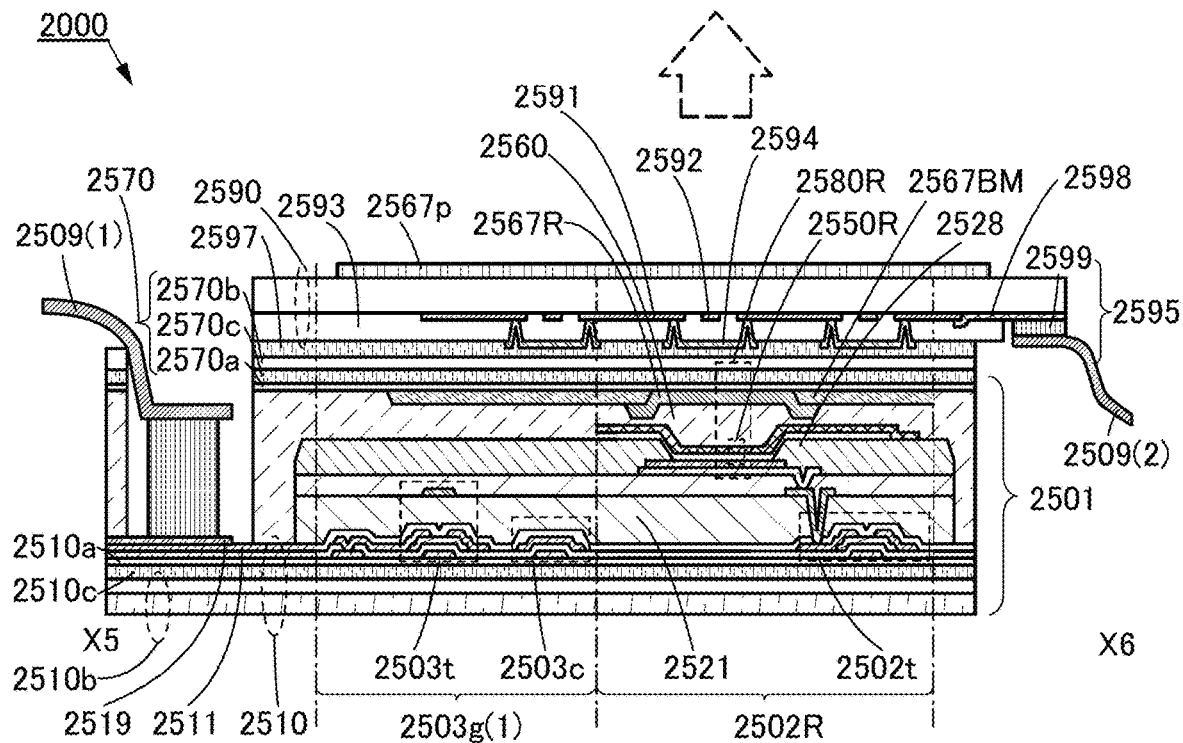
FIGS. 12A and 12B are cross-sectional views illustrating examples of a touch panel of one embodiment of the present invention.

Next, the touch panel 2000 will be described in detail with reference to FIG. 12A. FIG. 12A corresponds to a cross-sectional view taken along dashed-dotted line X5-X6 in FIG. 10A.

In the touch panel 2000 illustrated in FIG. 12A, the display device 2501 described with reference to FIG. 11A and the touch sensor 2595 described with reference to FIG. 11C are attached to each other.

The touch panel 2000 illustrated in FIG. 12A includes an adhesive layer 2597 and an anti-reflective layer 2567p in addition to the components described with reference to FIGS. 11A and 11C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567p is positioned in a region overlapping with pixels. As the anti-reflective layer 2567p, a circularly polarizing plate can be used, for example.

Next, a touch panel having a structure different from that illustrated in FIG. 12A will be described with reference to FIG. 12B.

Figure 12B:
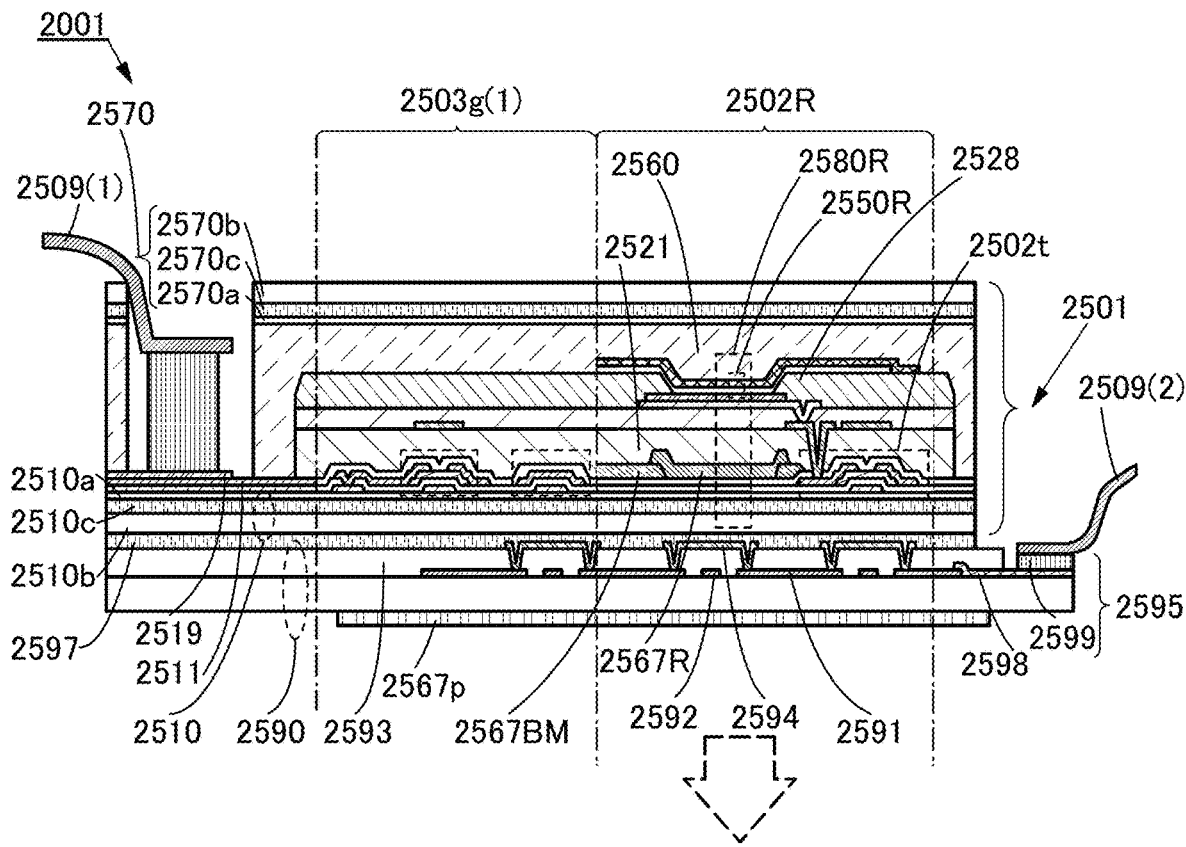

FIG. 12B is a cross-sectional view of a touch panel 2001. The touch panel 2001 illustrated in FIG. 12B differs from the touch panel 2000 illustrated in FIG. 12A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 12B emits light to the side where the transistor 2502t is provided. Accordingly, part of light emitted from the light-emitting element 2550R passes through the coloring layer 2567R and is emitted to the outside of the light-emitting module 2580R as indicated by an arrow in FIG. 12B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 12A or 12B, light may be emitted from the light-emitting element through one or both of the substrate 2510 and the substrate 2570.

<Description of Method for Driving Touch Panel>

Next, an example of a method for driving a touch panel will be described with reference to FIGS. 13A and 13B.

Figure 13A:
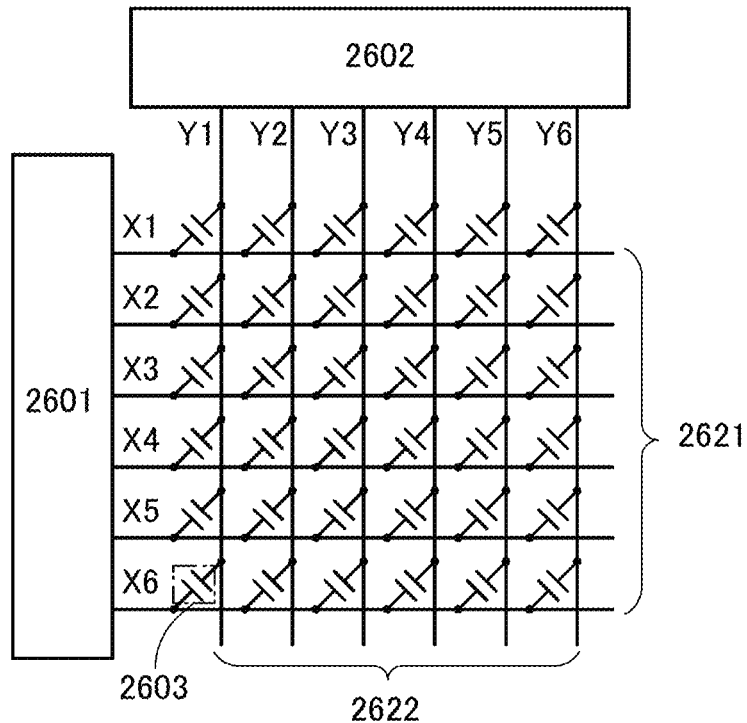
FIGS. 13A and 13B are a block diagram and a timing chart of a touch sensor of one embodiment of the present invention.

FIG. 13A is a block diagram illustrating the structure of a mutual capacitive touch sensor. FIG. 13A illustrates a pulse voltage output circuit 2601 and a current sensing circuit 2602. Note that in FIG. 13A, six wirings X1 to X6 represent the electrodes 2621 to which a pulse voltage is applied, and six wirings Y1 to Y6 represent the electrodes 2622 that detect changes in current. FIG. 13A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is sensed in the wirings Y1 to Y6 when there is no approach or contact of a sensing target, whereas a decrease in current value is sensed when mutual capacitance decreases due to the approach or contact of a sensing target. Note that an integrator circuit or the like is used for sensing of current values.

Figure 13B:
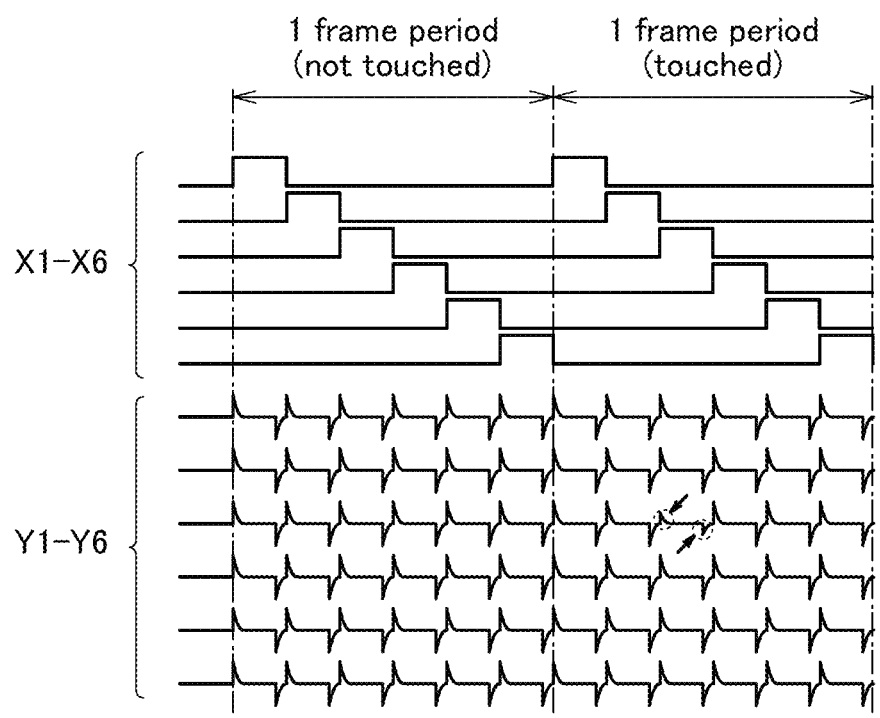

FIG. 13B is a timing chart showing input and output waveforms in the mutual capacitive touch sensor illustrated in FIG. 13A. In FIG. 13B, a sensing target is sensed in all the rows and columns in one frame period. FIG. 13B shows a period when a sensing target is not sensed (not touched) and a period when a sensing target is sensed (touched). In FIG. 13B, sensed current values of the wirings Y1 to Y6 are shown as the waveforms of voltage values.

Pulse voltages are sequentially applied to the wirings X1 to X6, and the waveforms of the wirings Y1 to Y6 change in accordance with the pulse voltages. When there is no approach or contact of a sensing target, the waveforms of the wirings Y1 to Y6 change uniformly in accordance with changes in the voltages of the wirings X1 to X6. The current value decreases at the point of approach or contact of a sensing target and accordingly the waveform of the voltage value changes.

By sensing a change in mutual capacitance in this manner, the approach or contact of a sensing target can be sensed.

<Description of Sensor Circuit>

Figure 14:
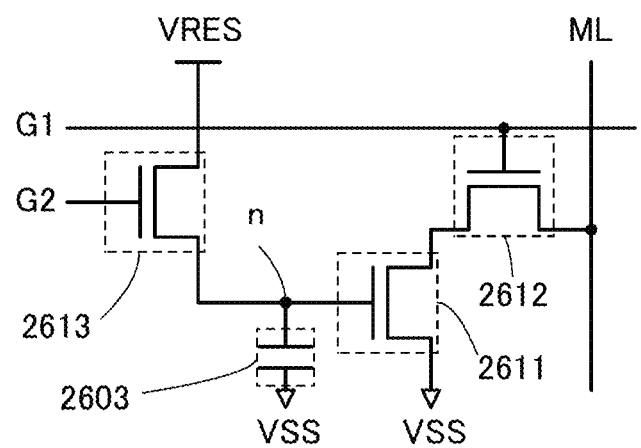
FIG. 14 is a circuit diagram of a touch sensor of one embodiment of the present invention.

The passive matrix type touch sensor in which only the capacitor 2603 is provided at the intersection of wirings is illustrated as a touch sensor in FIG. 13A; alternatively, an active matrix type touch sensor including a transistor and a capacitor may be used. FIG. 14 illustrates an example of a sensor circuit included in an active matrix type touch sensor.

The sensor circuit in FIG. 14 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 14 will be described. First, a potential for turning on the transistor 2613 is supplied as the signal G2, and a potential corresponding to the voltage VRES is thus applied to a node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML changes with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be used in appropriate combination with the structure described in any of the other embodiments.

Embodiment 6

In this embodiment, a display module and electronic devices including a light-emitting element of one embodiment of the present invention will be described with reference to FIG. 15 and FIGS. 16A to 16G.

<Display Module>

Figure 15:
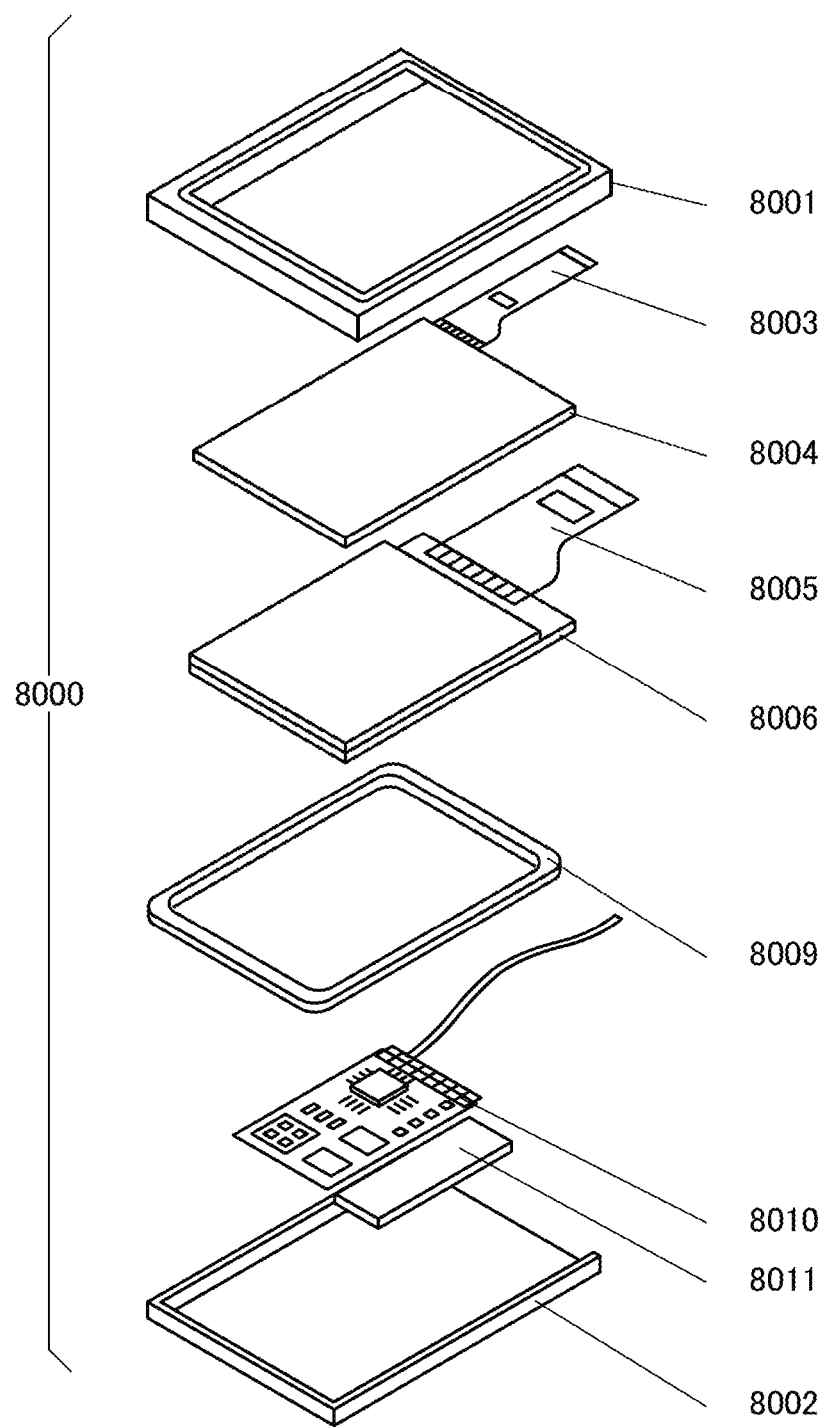
FIG. 15 is a perspective view illustrating a display module of one embodiment of the present invention.

In a display module 8000 illustrated in FIG. 15, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 may serve as a radiator plate.

The printed board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<Electronic Devices>

FIGS. 16A to 16G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 16A to 16G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on the display portion. Note that the functions of the electronic devices illustrated in FIGS. 16A to 16G are not limited to those described above, and the electronic devices can have a variety of functions. Although not illustrated in FIGS. 16A to 16G, the electronic devices may include a plurality of display portions. The electronic devices may include a camera or the like and have a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 16A to 16G will be described in detail below.

Figure 16A:
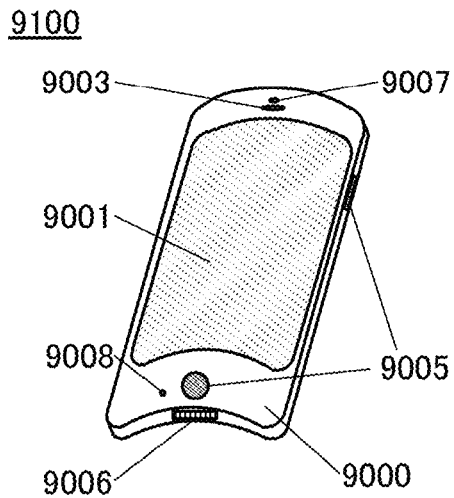
FIGS. 16A to 16G illustrate electronic devices of one embodiment of the present invention.

FIG. 16A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 16B:
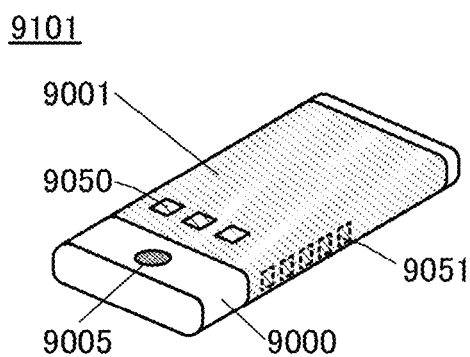

FIG. 16B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not illustrated in FIG. 16B, can be positioned in the portable information terminal 9101 as in the portable information terminal 9100 illustrated in FIG. 16A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery level; and the reception strength of an antenna. Alternatively, the operation buttons 9050 or the like may be displayed in place of the information 9051.

Figure 16C:
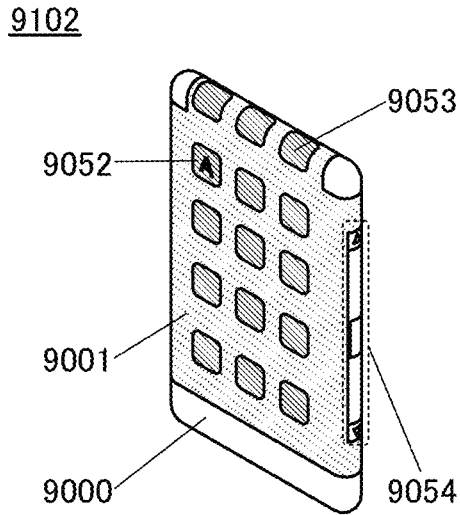

FIG. 16C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 16D:
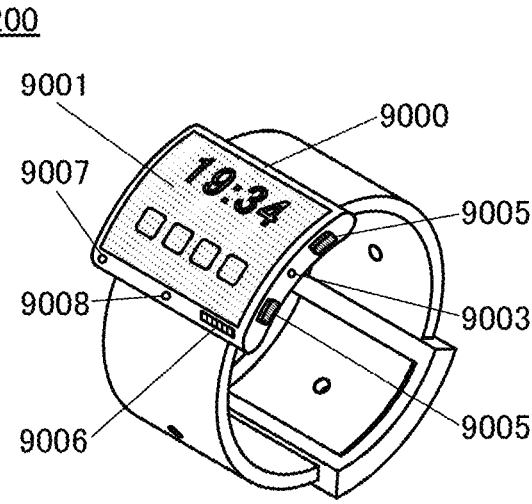

FIG. 16D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Figure 16E:
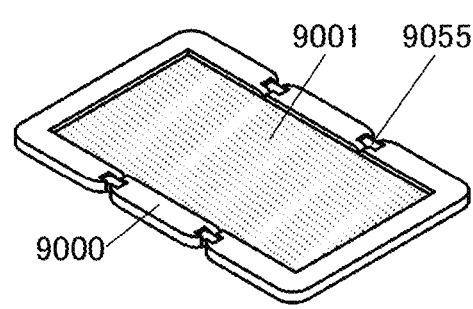
Figure 16F:
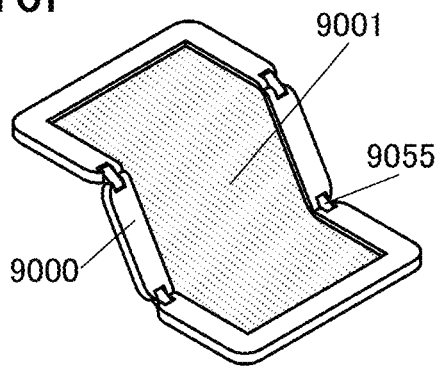
Figure 16G:
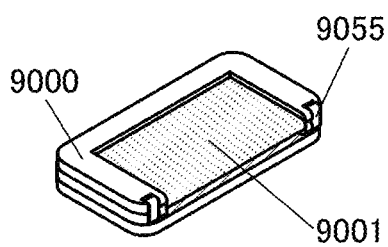

FIGS. 16E, 16F, and 16G are perspective views of a foldable portable information terminal 9201. FIG. 16E is a perspective view illustrating the portable information terminal 9201 that is opened. FIG. 16F is a perspective view illustrating the portable information terminal 9201 that is being opened or being folded. FIG. 16G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature greater than or equal to 1 mm and less than or equal to 150 mm.

The electronic devices in this embodiment each include a display portion for displaying some kind of information. The light-emitting element of one embodiment of the present invention can also be used for electronic devices without a display portion. In the electronic devices described in this embodiment, the display portion is flexible and display can be performed on the curved display surface, or the display portion is foldable; however, the structure of the electronic devices is not limited to these examples, and a structure in which the display portion is not flexible and display is performed on a plane portion may be employed.

The structure described in this embodiment can be combined with any of the structures described in the other embodiments as appropriate.

Embodiment 7

In this embodiment, examples of lighting devices using the light-emitting element of one embodiment of the present invention will be described with reference to FIG. 17.

Figure 17:
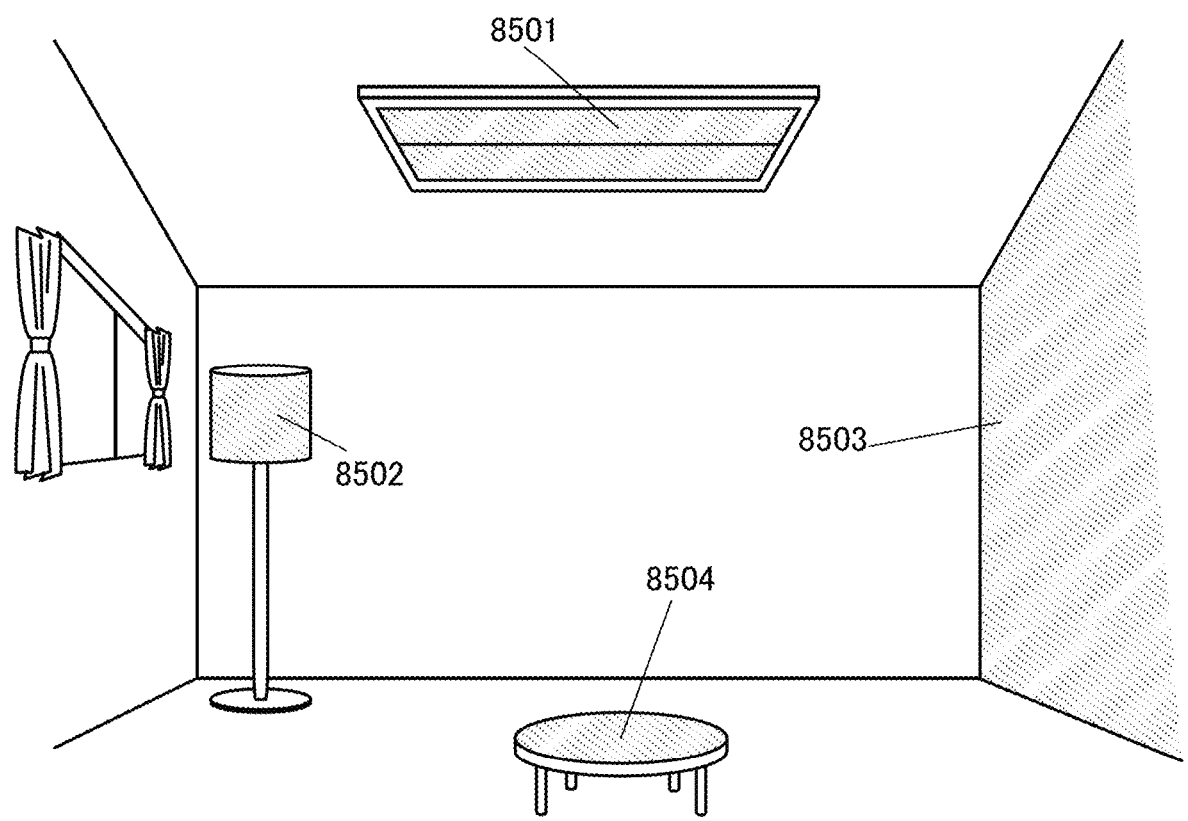
FIG. 17 illustrates lighting devices of one embodiment of the present invention.

FIG. 17 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. The light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

In this manner, a variety of lighting devices using the light-emitting element can be obtained. Note that such lighting devices are included in one embodiment of the present invention.

The structure described in this embodiment can be used in appropriate combination with the structure described in any of the other embodiments.

Example 1

In this example, eight light-emitting elements with different structures were fabricated. Note that the eight light-emitting elements include four light-emitting elements with different materials used for electron-transport layers, and four light-emitting elements different from the former four light-emitting elements only in a material used for hole-transport layers. Note that the fabrication of the light-emitting elements 1 to 8 is described with reference to FIG. 18. The chemical formulae of materials used in this example are as follows.

[Chemical formula 1]

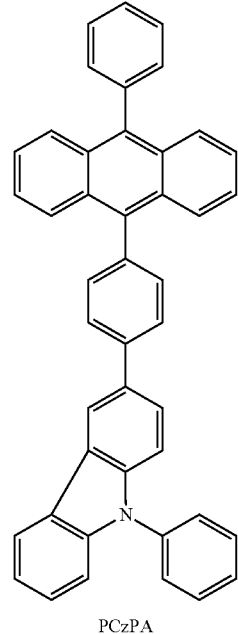

PCzPA

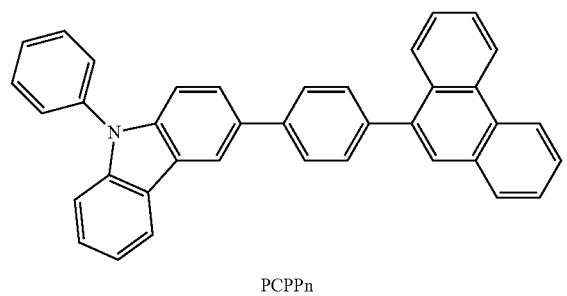

PCPPn

-continued

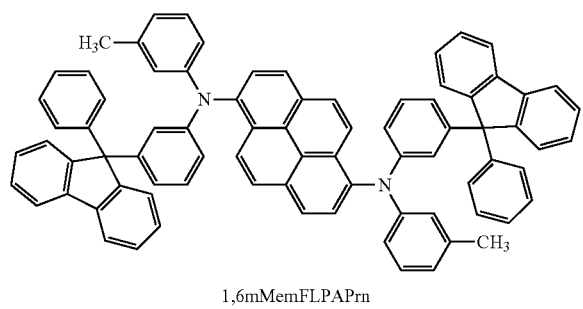

1,6mMemFLPAPrn

-continued

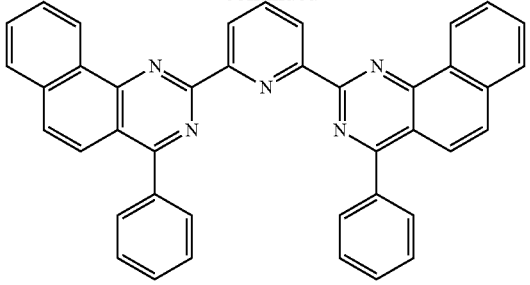

2,6(P-Bqn)2Py

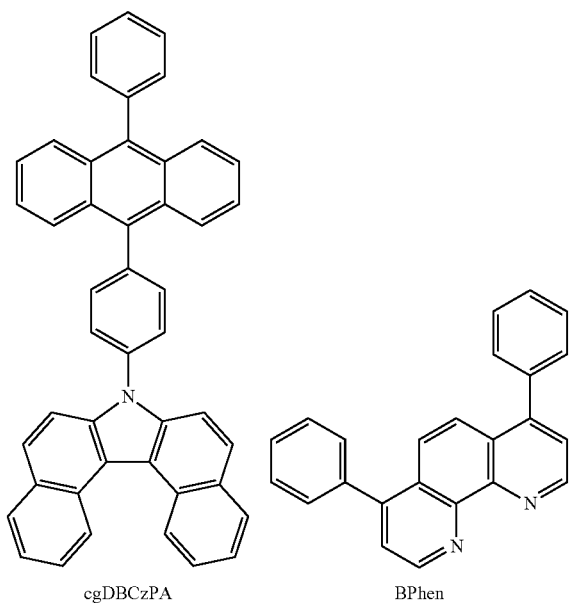

cgDBCzPA

BPhen

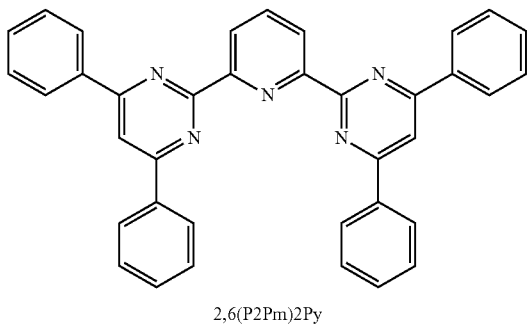

2,6(P2Pm)2Py

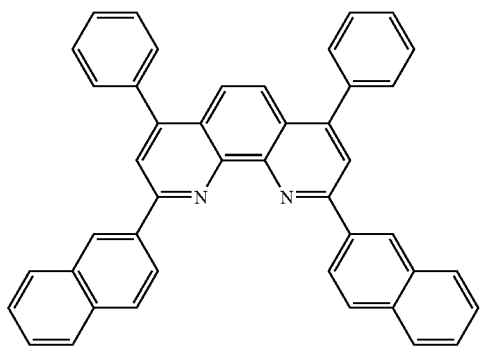

NBPhen

<<Fabrication of Light-Emitting Elements 1 to 8>>

First, indium tin oxide (ITO) containing silicon oxide was deposited over a glass substrate 900 by a sputtering method, whereby a first electrode 901 functioning as an anode was formed. Note that the first electrode has a thickness of 70 nm and an area of 2 mm×2 mm.

Next, as pretreatment for forming the light-emitting element over the substrate 900, a surface of the substrate was washed with water and baking was performed at 200° C. for 1 hour; then, UV ozone treatment was performed for 370 seconds.

After that, the substrate was transferred into a vacuum evaporation apparatus where the pressure had been reduced to approximately $1\times10^{-4}$ Pa, and was subjected to vacuum baking at 170° C. for 30 minutes in a heating chamber of the vacuum evaporation apparatus. Then, the substrate 900 was cooled down for approximately 30 minutes.

Next, the substrate 900 was fixed to a holder provided in the vacuum evaporation apparatus so that a surface of the substrate on which the first electrode 901 was formed faced downward. In this example, a hole-injection layer 911, a hole-transport layer 912, a light-emitting layer 913, an electron-transport layer 914, and an electron-injection layer 915, which are included in an EL layer 902, are sequentially formed by a vacuum evaporation method.

After the pressure in the vacuum evaporation apparatus was reduced to $1\times10^{-4}$ Pa, in the case of the light-emitting elements 1 to 4, 3-[4-(9-phenanthryl)-phenyl]-9-phenyl-9H-carbazole (abbreviation: PCPPn) and molybdenum oxide were deposited by co-evaporation with a weight ratio of PCPPn to molybdenum oxide being 4:2, so that the hole-injection layer 911 was formed on the first electrode 901. The thickness was set to 10 nm. In the case of the light-emitting elements 5 to 8, 9-phenyl-3-[4-(10-phenyl-9-anthryl)phenyl]-9H-carbazole (abbreviation: PCzPA) and molybdenum oxide were deposited by co-evaporation with a weight ratio of PCzPA to molybdenum oxide being 4:2, so that the hole-injection layer 911 was formed on the first electrode 901. The thickness was set to 10 nm. Note that the co-evaporation is an evaporation method in which a plurality of different substances are concurrently vaporized from respective different evaporation sources.

Next, in the case of the light-emitting elements 1 to 4, PCPPn was deposited by evaporation to a thickness of 30 nm on the hole-injection layer 911, so that the hole-transport layer 912 was formed. In the case of the light-emitting elements 5 to 8, PCzPA was deposited by evaporation to a thickness of 30 nm on the hole-injection layer 911, so that the hole-transport layer 912 was formed.

Then, on the hole-transport layer 912, 7-[4-(10-phenyl-9-anthryl)phenyl]-7H-dibenzo[c,g]carbazole (abbreviation: cgDBCzPA), and N,N-bis(3-methylphenyl)-N,N'-bis[3-(9-phenyl-9H-fluoren-9-yl)phenyl]pyrene-1,6-diamine (abbreviation: 1,6mMemFLPAPrn) were deposited by co-evaporation with a weight ratio of cgDBCzPA to 1,6mMemFLPAPrn being 1:0.03, so that the light-emitting layer 913 was formed. Note that the thickness was set to 25 nm.

Next, in the case of the light-emitting elements 1 and 5, bathophenanthroline (abbreviation: BPhen) was deposited by evaporation to a thickness of 25 nm on the light-emitting layer 913, so that the electron-transport layer 914 was formed. In the case of the light-emitting elements 2 and 6, 2,2'-(pyridine-2,6-diyl)bis(4,6-diphenylpyrimidine) (abbreviation: 2,6(P2Pm)2Py) was deposited by evaporation to a thickness of 25 nm on the light-emitting layer 913, so that the electron-transport layer 914 was formed. In the case of the light-emitting elements 3 and 7, 2,9-bis(naphthalen-2-yl)-4,7-diphenyl-1,10-phenanthroline (abbreviation: NBPhen) was deposited by evaporation to a thickness of 25 nm on the light-emitting layer 913, so that the electron-transport layer 914 was formed. In the case of the light-emitting elements 4 and 8, 2,2'-(pyridine-2,6-diyl)bis(4-phenylbenzo[h]quinazoline) (abbreviation: 2,6(P-Bqn)2Py) was deposited by evaporation to a thickness of 25 nm on the light-emitting layer 913, so that the electron-transport layer 914 was formed.

Furthermore, lithium fluoride was deposited by evaporation to a thickness of 1 nm on the electron-transport layer 914, so that the electron-injection layer 915 was formed.

Finally, aluminum was deposited by evaporation to a thickness of 200 nm on the electron-injection layer 915, so that a second electrode 903 functioning as a cathode was formed. Thus, the light-emitting elements 1 to 8 were fabricated. Note that in all the above evaporation steps, evaporation was performed by a resistance-heating method.

Table 1 shows the structures of the thus obtained light-emitting elements 1 to 8.

TABLE 1

| | First electrode | Hole-injection layer | Hole-transport layer | Light-emitting layer | Electron-transport layer | Electron-injection layer | Second electrode |
|---|---|---|---|---|---|---|---|
| Light-emitting element 1 | ITO (70 nm) | PCPPn: MoOx (4:2 10 nm) | PCPPn (30 nm) | * | Bphen (25 nm) | LiF (1 nm) | Al (200 nm) |
| Light-emitting element 2 | ITO (70 nm) | PCPPn: MoOx (4:2 10 nm) | PCPPn (30 nm) | * | 2,6(P2Pm)2Py (25 nm) | LiF (1 nm) | Al (200 nm) |
| Light-emitting element 3 | ITO (70 nm) | PCPPn: MoOx (4:2 10 nm) | PCPPn (30 nm) | * | NBPhen (25 nm) | LiF (1 nm) | Al (200 nm) |
| Light-emitting element 4 | ITO (70 nm) | PCPPn: MoOx (4:2 10 nm) | PCPPn (30 nm) | * | 2,6(P-Bqn)2Py (25 nm) | LiF (1 nm) | Al (200 nm) |
| Light-emitting element 5 | ITO (70 nm) | PCzPA: MoOx (4:2 10 nm) | PCzPA (30 nm) | * | Bphen (25 nm) | LF (1 nm) | Al (200 nm) |
| Light-emitting element 6 | ITO (70 nm) | PCzPA: MoOx (4:2 10 nm) | PCzPA (30 nm) | * | 2,6(P2Pm)2Py (25 nm) | LiF (1 nm) | Al (200 nm) |
| Light-emitting element 7 | ITO (70 nm) | PCzPA: MoOx (4:2 10 nm) | PCzPA (30 nm) | * | NBPhen (25 nm) | LiF (1 nm) | Al (200 nm) |
| Light-emitting element 8 | ITO (70 nm) | PCzPA: MoOx (4:2 10 nm) | PCzPA (30 nm) | * | 2,6(P-Bqn)2Py (25 nm) | LiF (1 nm) | Al (200 nm) |

*cgDBCzPA:1,6mMemFLPAPrn (10.03 25 nm)

The fabricated light-emitting elements 1 to 8 were sealed in a glove box under a nitrogen atmosphere so as not to be exposed to the air (a sealant was applied to surround the elements, and at the time of sealing, UV treatment was performed and heat treatment was performed at 80° C. for 1 hour). Note that the number of each light-emitting element fabricated for the measurements below is four.

<<Properties of Light-Emitting Elements 1 to 8>>

The fabricated light-emitting elements 1 to 8 (the number of each element is four) were measured using a picosecond fluorescence lifetime measurement system (manufactured by Hamamatsu Photonics K.K.). To measure the lifetimes of fluorescence in the light-emitting elements, a square wave pulse voltage was applied to the light-emitting elements, and time-resolved measurements of light, which was attenuated from the falling of the voltage, were performed using a streak camera. The pulse voltage was applied at a frequency of 10 Hz. By integrating data obtained by repeated measurements, data with a high S/N ratio was obtained. The measurement was performed at room temperature (300 K) under the conditions of a pulse voltage of approximately 3 V, a pulse time width of 100 μsec, a negative bias voltage of −5 V, and a measurement time of 50 μsec.

The attenuation curve of transient fluorescence obtained by the measurement was fitted with Formula (f1).

$$L = \sum_{n=1} A_n \exp\left(-\frac{t}{a_n}\right) \quad \text{(f1)}$$

Note that in Formula (f1), L and t represent normalized emission intensity and elapsed time, respectively.

The fitting of the attenuation curve obtained by the measurement was able to be performed with n=1 and 2. It was also found that the light-emitting elements 1 to 8 each included a delayed fluorescence component as well as a fluorescence component. Note that the delayed fluorescence component refers to fluorescence that is measured immediately after the pulse voltage is shut off, i.e., after the injection of carriers to a light-emitting layer is stopped. The measured delayed fluorescence component means the generation of triplet-triplet annihilation (TTA) in the EL layer of the light-emitting element. The proportion of the delayed fluorescence component refers to the proportion of the fluorescence intensity of a light-emitting element immediately after the pulse voltage is shut off to the fluorescence intensity thereof when the pulse voltage is supplied; in other words, the proportion of the fluorescence intensity of the light-emitting element immediately after carrier injection is stopped to the fluorescence intensity thereof when carriers are steadily injected to a light-emitting layer. Table 2 below shows the proportion of the delayed fluorescence component of each of the light-emitting elements 1 to 8.

In addition, the emission properties of the light-emitting elements 1 to 8 were measured to obtain the external quantum efficiency. Note that the external quantum efficiency of each light-emitting element was obtained in such a manner that the viewing angle dependence of light was measured while the substrate was rotated at an angle of −80° to 80° and the light distribution characteristics of electroluminescence were taken into consideration. The results are shown in Table 2 below. Note that the measurement was performed at room temperature (in an atmosphere maintained at 25° C.).

TABLE 2

|  | Proportion of delayed fluorescence component (%) | External quantum efficiency (%) | Pulse voltage (V) |
|---|---|---|---|
| Light-emitting element 1 | 12.3 | 8.97 | 3.15 |
|  | 12.5 | 9.04 | 3.10 |
|  | 12.1 | 9.17 | 3.10 |
|  | 10.9 | 9.02 | 3.10 |
| Light-emitting element 2 | 13.7 | 9.12 | 3.10 |
|  | 12.0 | 9.21 | 3.10 |
|  | 13.0 | 9.17 | 3.10 |
|  | 14.0 | 9.23 | 3.10 |
| Light-emitting element 3 | 18.1 | 9.37 | 3.15 |
|  | 16.2 | 9.79 | 3.15 |
|  | 17.4 | 9.76 | 3.15 |
|  | 18.2 | 9.72 | 3.15 |
| Light-emitting element 4 | 20.7 | 9.66 | 3.20 |
|  | 20.4 | 9.76 | 3.20 |
|  | 19.5 | 9.55 | 3.20 |
|  | 20.9 | 9.33 | 3.20 |
| Light-emitting element 5 | 8.8 | 7.71 | 3.00 |
|  | 7.7 | 7.83 | 3.00 |
|  | 6.8 | 7.91 | 3.05 |
|  | 6.6 | 7.84 | 2.95 |
| Light-emitting element 6 | 7.3 | 7.83 | 3.00 |
|  | 7.1 | 7.92 | 3.00 |
|  | 8.7 | 8.02 | 3.05 |
|  | 7.7 | 7.96 | 3.00 |
| Light-emitting element 7 | 10.1 | 7.91 | 3.00 |
|  | 10.2 | 8.29 | 3.05 |
|  | 9.4 | 8.34 | 3.05 |
|  | 11.1 | 8.23 | 3.05 |
| Light-emitting element 8 | 12.5 | 8.09 | 3.20 |
|  | 12.0 | 8.13 | 3.15 |
|  | 12.4 | 8.09 | 3.20 |
|  | 13.4 | 7.87 | 3.20 |

Table 3 shows the LUMO levels of the materials used in the electron-transport layers of the light-emitting elements 1 to 8. The LUMO levels were estimated from the cyclic voltammetry measurements of each material in a N,N-dimethylformamide (abbreviation: DMF) solvent.

TABLE 3

|  | Electron-transport layer | LUMO level (eV) |
|---|---|---|
| Light-emitting elements 1 and 5 | Bphen | −2.63 |
| Light-emitting elements 2 and 6 | 2,6(P2Pm)2Py | −2.78 |
| Light-emitting elements 3 and 7 | NBPhen | −2.83 |
| Light-emitting elements 4 and 8 | 2,6(P-Bqn)2Py | −2.92 |

Figure 19:
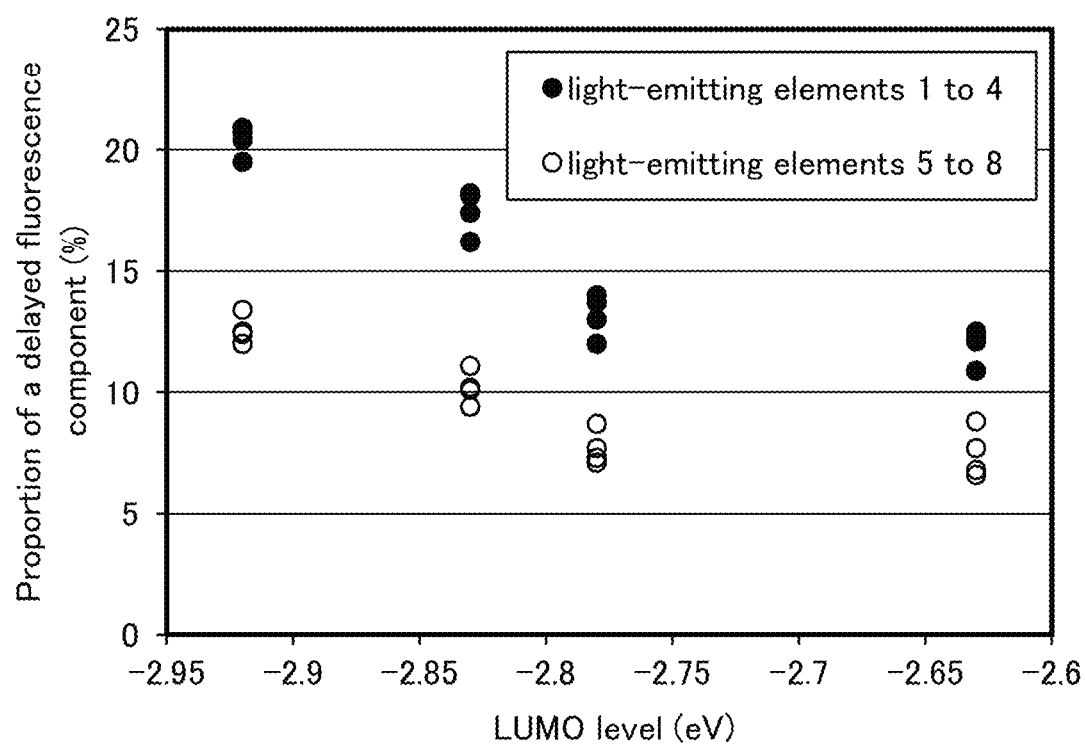
FIG. 19 shows the proportion of a delayed fluorescence component versus the LUMO level of light-emitting elements 1 to 8.

FIG. 19 shows the proportion of the delayed fluorescence component (%) versus the LUMO level (eV) (shown in Table 3) of the materials used in the electron-transport layers of the light-emitting elements 1 to 8. In FIG. 19, the light-emitting elements 1 to 4, which use PCPPn in the hole-transport layers, are commonly plotted and the light-emitting elements 5 to 8, which use PCzPA in the hole-transport layers, are commonly plotted.

The results indicate that the proportion of the delayed fluorescence component tends to increase as the LUMO level of the material used in the electron-transport layer becomes higher, though the proportion has a different value for each material used in the hole-transport layer. That is, the light-emitting elements using 2,6(P-Bqn)2Py, which has the highest LUMO level (−2.92 eV), have a higher proportion of delayed fluorescence component than the other light-emitting elements having the same structure except for the electron-transport layer.

Figure 20:
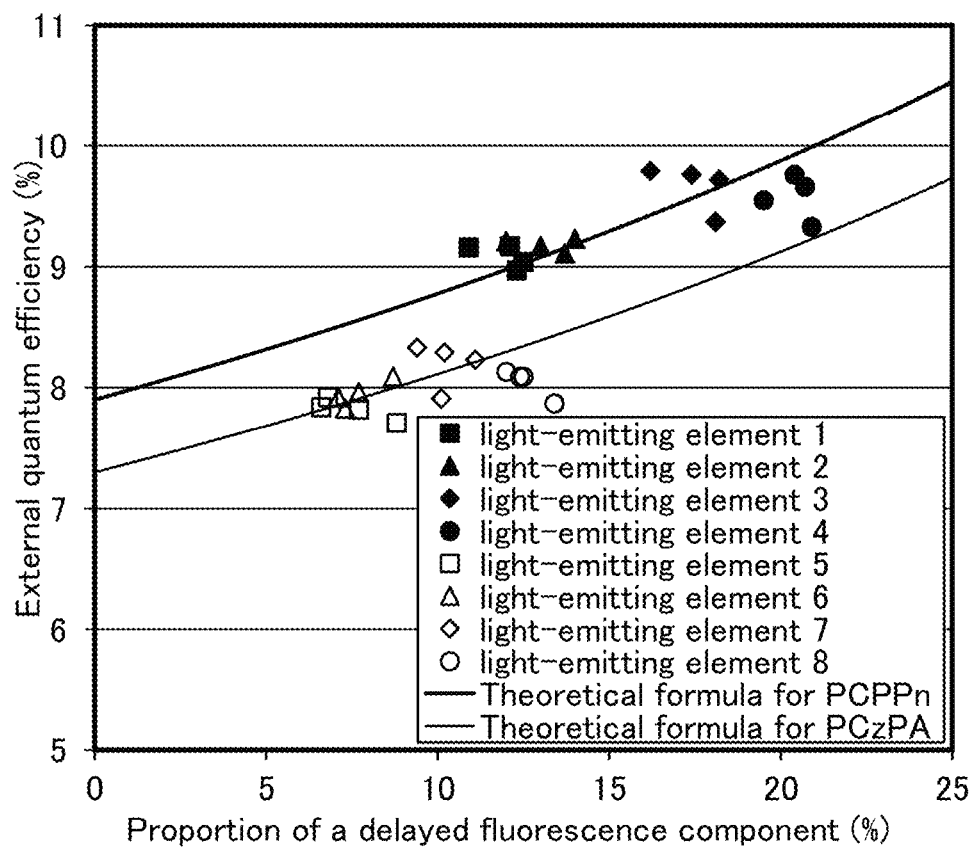
FIG. 20 shows the external quantum efficiency versus the proportion of a delayed fluorescence component of the light-emitting elements 1 to 8.

FIG. 20 shows the relationship between the proportion of the delayed fluorescence component (%) and the external quantum efficiency (%) of the light-emitting elements 1 to 8.

The results show that the external quantum efficiency (%) increases with the proportion of delayed fluorescence component (%).

Here, the proportion of delayed fluorescence component (X) is represented by Formula (f2) where $I_P$ is the fluorescence intensity in the direct formation process and $I_D$ is the intensity of delayed fluorescence due to TTA.

$$X = \frac{I_D}{I_P + I_D} \quad (f2)$$

According to the definition of the external quantum efficiency (EQE), the proportion of generated singlet excitons (α) is 0.25 when $I_D$ is 0 (X=0). However, α increases with $I_D$, i.e., EQE is proportional to $I_P+I_D$. Accordingly, Formula (f3) is obtained.

$$EQE \propto I_P + I_D = I_P \times \frac{1}{1 - X} \quad (f3)$$

Since X is equivalent to the x-axis in FIG. 20, the relationship between the proportion of the delayed fluorescence component (%) and the external quantum efficiency (%) of the light-emitting elements 1 to 4, which use PCPPn in the hole-transport layers, and the relationship between the proportion of the delayed fluorescence component (%) and the external quantum efficiency (%) of the light-emitting elements 5 to 8, which use PCzPA in the hole-transport layers, can be substituted into Formula (f3) as shown in FIG. 20. This shows that the proportion of the delayed fluorescence component (%) and the external quantum efficiency (%) have a correlation.

Figure 21:
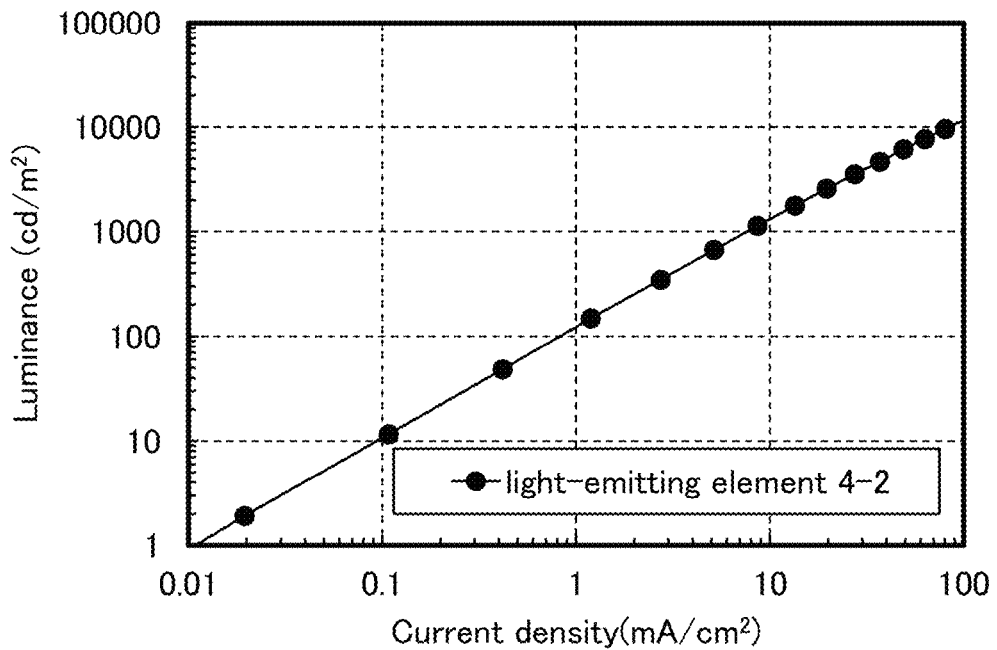
FIG. 21 shows the current density-luminance characteristics of a light-emitting element 4-2.
Figure 22:
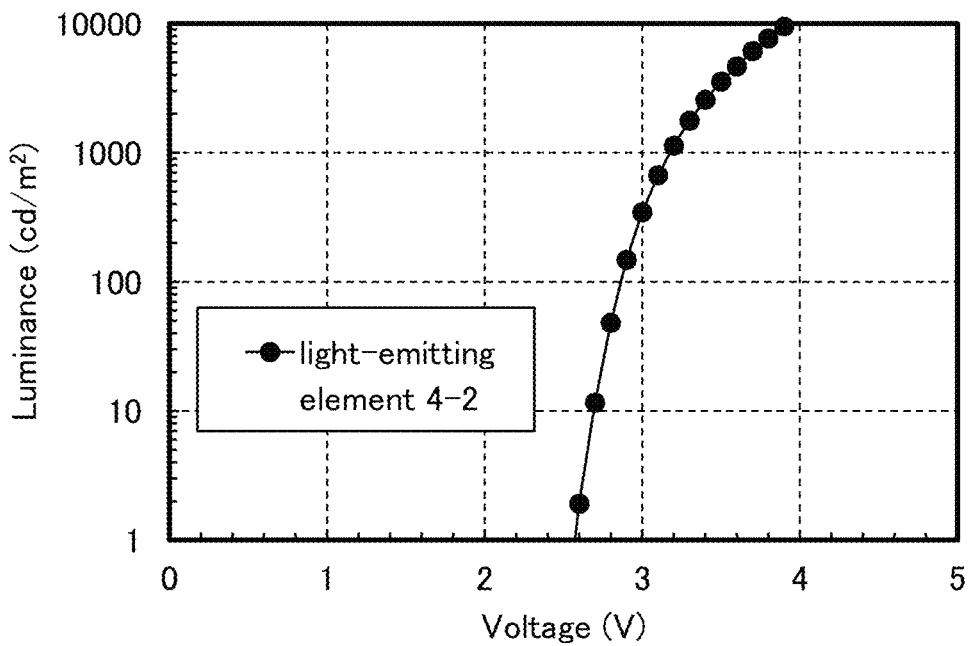
FIG. 22 shows the voltage-luminance characteristics of the light-emitting element 4-2.
Figure 23:
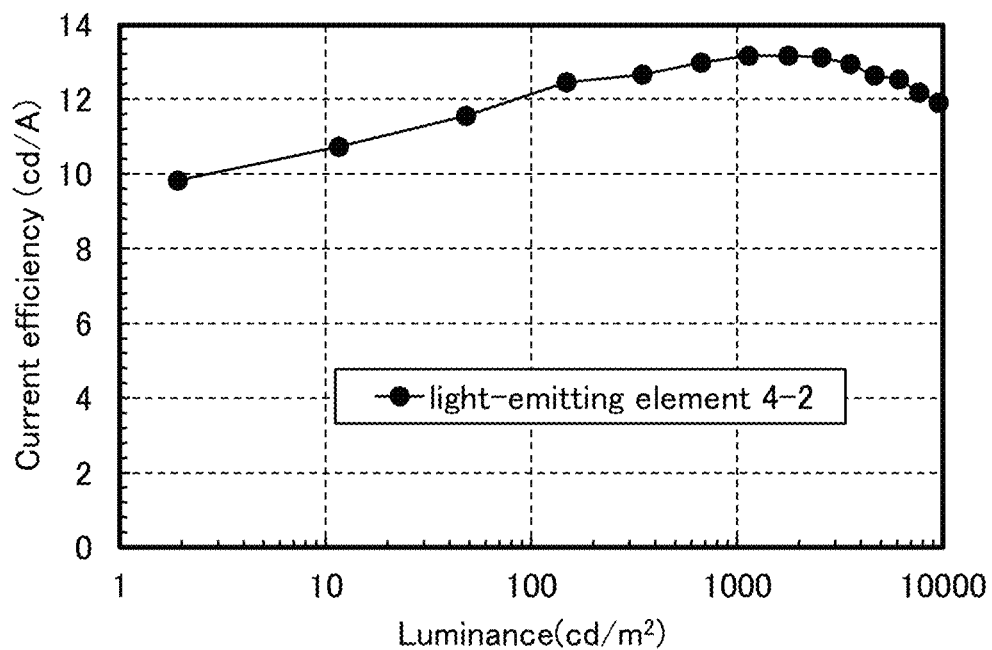
FIG. 23 shows the luminance-current efficiency characteristics of the light-emitting element 4-2.
Figure 24:
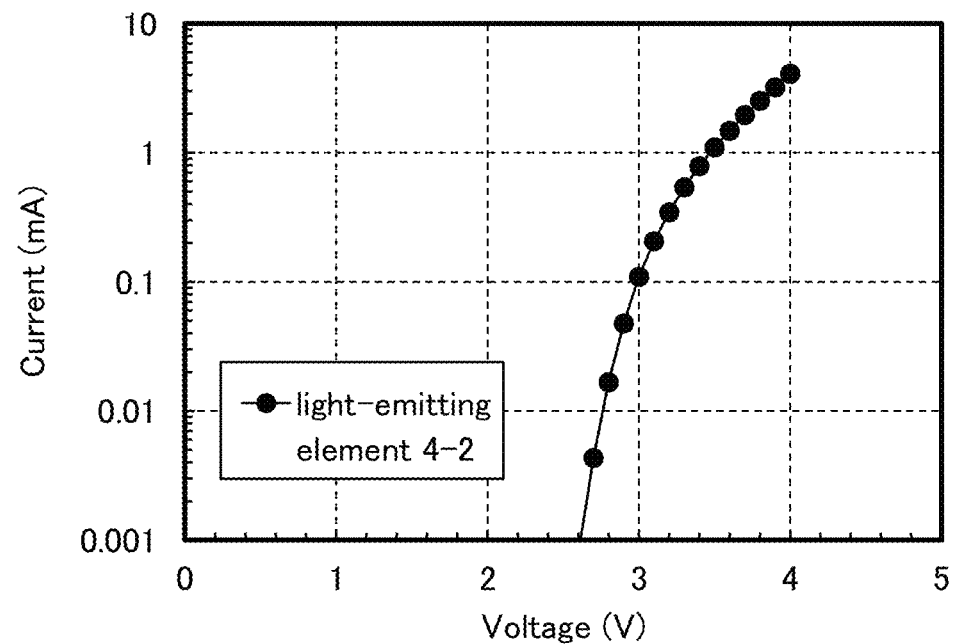
FIG. 24 shows the voltage-current characteristics of the light-emitting element 4-2.
Figure 25:
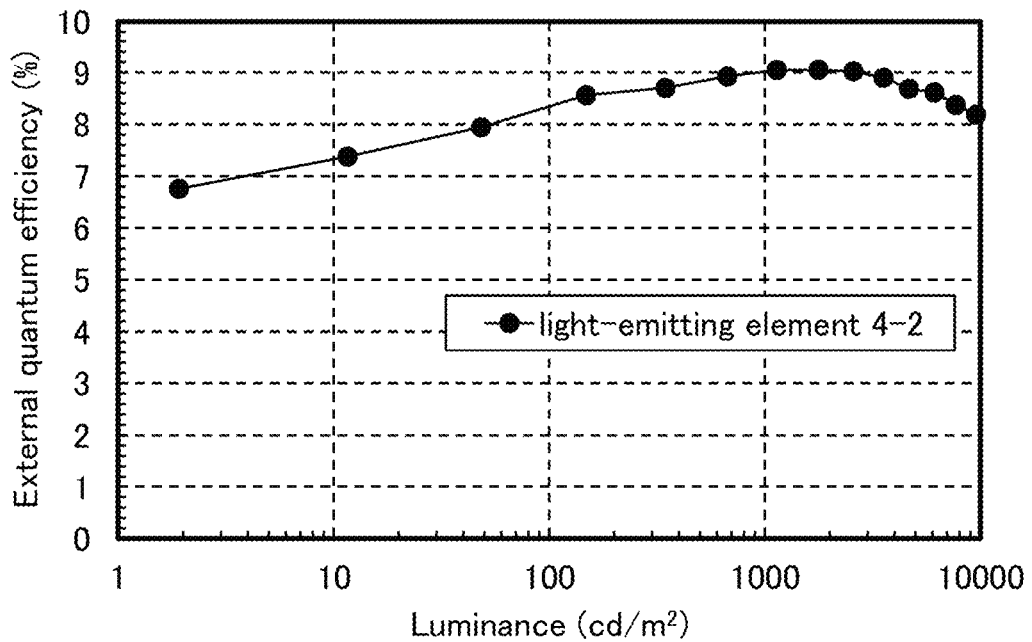
FIG. 25 shows the luminance-external quantum efficiency characteristics of the light-emitting element 4-2.

Furthermore, a light-emitting element 4-2, which has the same structure as the light-emitting element 4 shown in Table 1, was fabricated and the characteristics thereof were measured. Note that FIG. 21 shows the current density-luminance characteristics of the light-emitting element 4-2; FIG. 22, the voltage-luminance characteristics thereof; FIG. 23, the luminance-current efficiency characteristics thereof; FIG. 24, the voltage-current characteristics thereof; and FIG. 25, the luminance-external quantum efficiency characteristics thereof. Here, the external quantum efficiency of the light-emitting element shown in FIG. 25 was obtained in the aforementioned manner that the viewing angle dependence of light was measured while the substrate was rotated at an angle of −80° to 80° and the light distribution characteristics of electroluminescence were taken into consideration. The characteristic values of the light-emitting elements shown in FIGS. 21 to 24 were calculated from front luminance with a luminance colorimeter BM-5A (manufactured by TOPCON TECHNOHOUSE CORPORATION).

Table 4 shows the initial values of main characteristics of the light-emitting element 4-2 at a luminance of approximately 1000 cd/m$^2$.

TABLE 4

|  | Voltage (V) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 4-2 | 3.2 | 8.6 | (0.14, 0.14) | 1100 | 13 | 13 | 9.0 |

Figure 26:
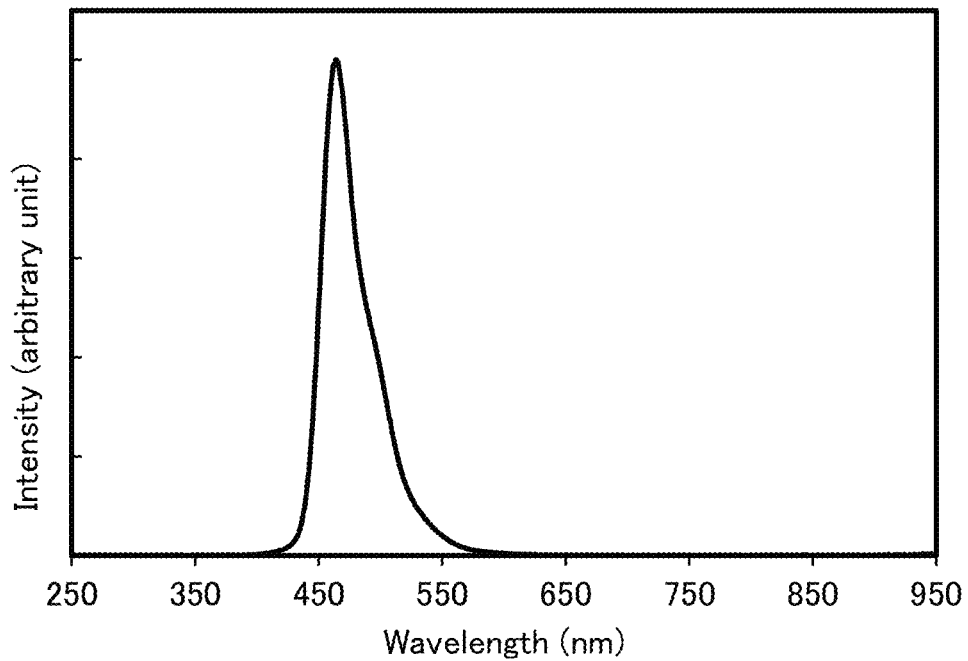
FIG. 26 shows the emission spectrum of the light-emitting element 4-2.

FIG. 26 shows an emission spectrum when a current with a current density of 12.5 mA/cm² was supplied to the light-emitting element 4-2. As shown in FIG. 26, the emission spectrum of the light-emitting element 4-2 has a peak at around 464 nm, which is probably derived from 1,6mMemFLPAPrn used as the guest material (dopant) in the light-emitting layer of the light-emitting element 4-2.

Figure 27:
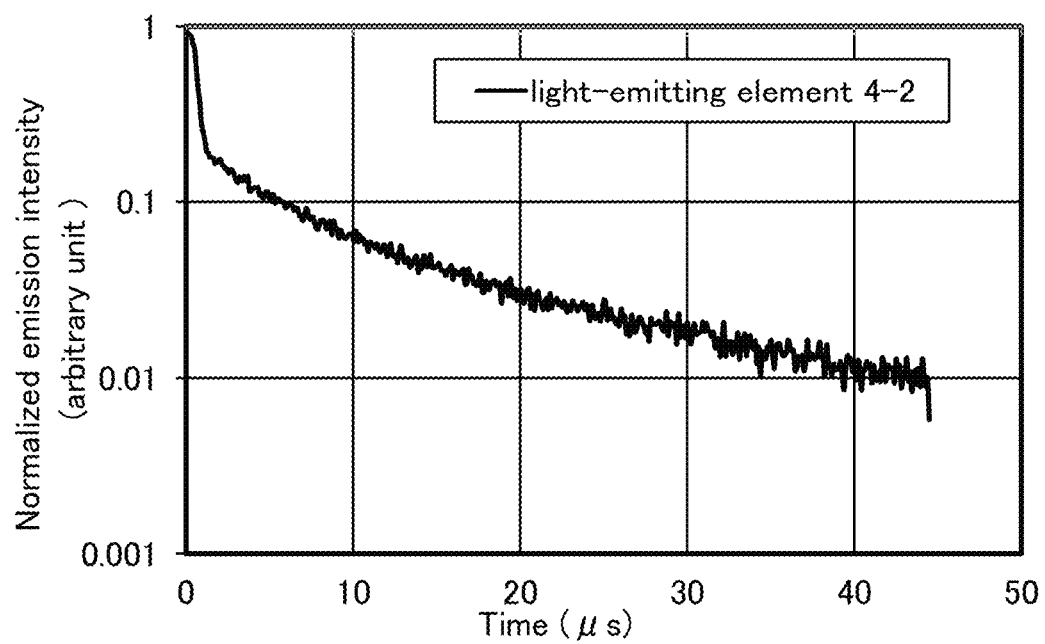
FIG. 27 shows an attenuation curve of transient fluorescence of the light-emitting element 4-2.

FIG. 27 shows an attenuation curve of transient fluorescence of the light-emitting element 4-2. Note that in FIG. 27, the vertical axis represents the emission intensity normalized to that in a state where carriers are steadily injected (when the pulse voltage is supplied), and the horizontal axis represents the time elapsed after the falling of the pulse voltage. The attenuation curve shown in FIG. 27 was fitted with Formula (f1), whereby a proportion of delayed fluorescence component of 21.5% was obtained.

Figure 28:
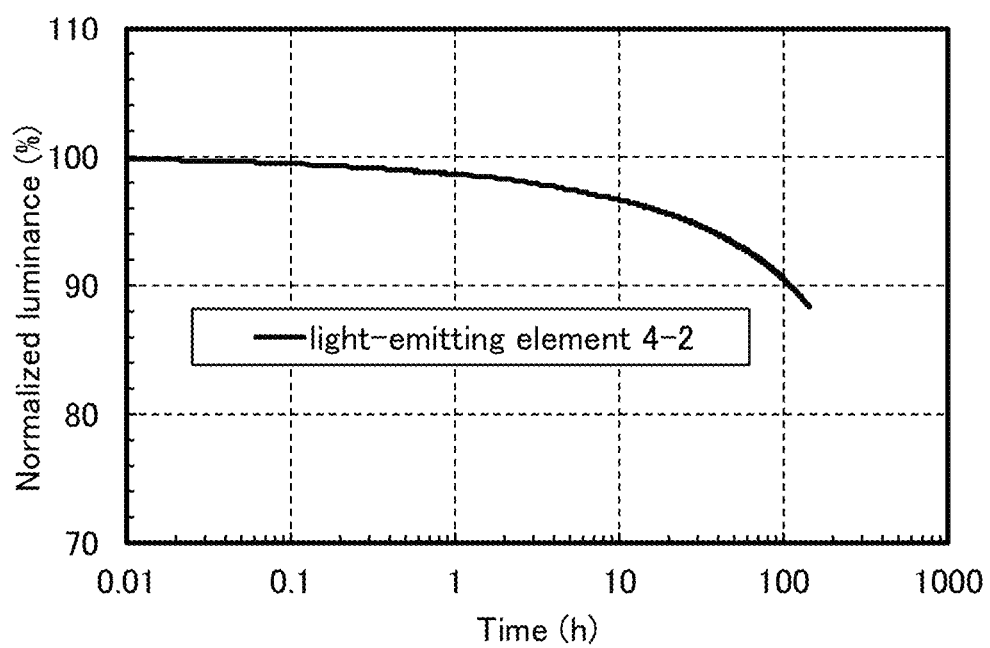
FIG. 28 shows the reliability of the light-emitting element 4-2.

Next, the light-emitting element 4-2 was subjected to a reliability test. FIG. 28 shows the results of the reliability test. In FIG. 28, the vertical axis represents normalized luminance (%) with an initial luminance of 100% and the horizontal axis represents driving time (h) of the element. Note that in the reliability test, the light-emitting element 4-2 was driven under the conditions where the initial luminance was set to 5000 cd/m² and the current density was constant.

As a result, the light-emitting element 4-2 of one embodiment of the present invention showed a high reliability.

Example 2

In this example, the transition dipole moment orientation of a molecule contributing to light emission in a light-emitting layer of a light-emitting element was estimated. Specifically, the angular dependence of the spectrum intensity of a p-polarized emission component was measured and the results were analyzed by calculation (simulation), whereby the transition dipole moment orientation of a molecule was estimated. Among the materials used in this example, materials that are not described in Example 1 are represented by the following chemical formulae.

[Chemical Formula 2]

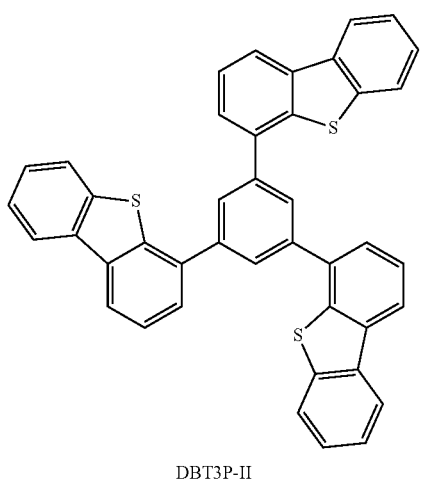

DBT3P-II

-continued

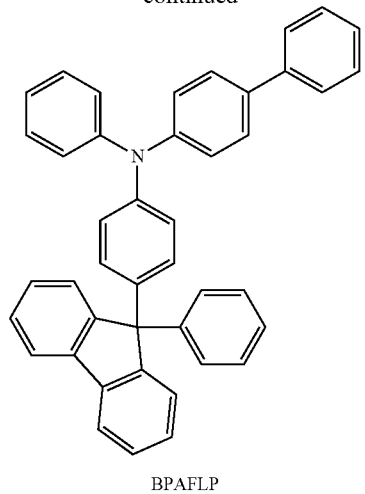

BPAFLP

<<Fabrication of Light-Emitting Element 9>>

Figure 18:
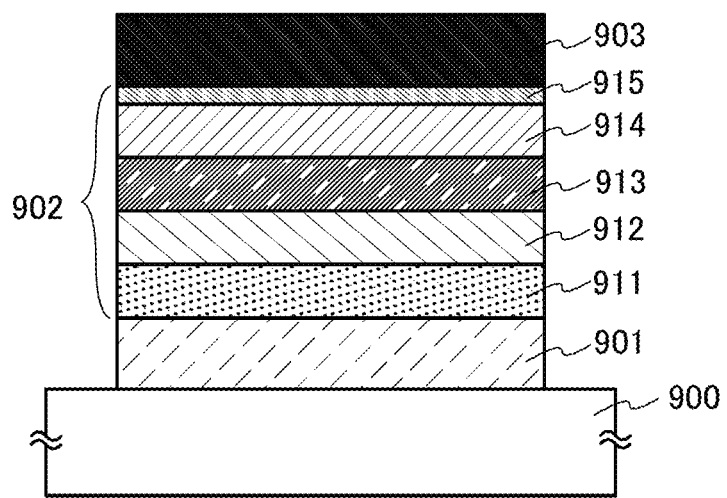
FIG. 18 illustrates a light-emitting element.

First, the fabrication of a light-emitting element 9 to be measured will be described with reference to FIG. 18. First, indium tin oxide (ITO) containing silicon oxide was deposited over the glass substrate 900 by a sputtering method, whereby the first electrode 901 functioning as an anode was formed. Note that the first electrode has a thickness of 70 nm and an area of 2 mm×2 mm.

Next, as pretreatment for forming the light-emitting element over the substrate 900, a surface of the substrate was washed with water and baking was performed at 200° C. for 1 hour; then, UV ozone treatment was performed for 370 seconds.

After that, the substrate was transferred into a vacuum evaporation apparatus where the pressure had been reduced to approximately 1×10⁻⁴ Pa, and was subjected to vacuum baking at 170° C. for 30 minutes in a heating chamber of the vacuum evaporation apparatus. Then, the substrate 900 was cooled down for approximately 30 minutes.

Next, the substrate 900 was fixed to a holder provided in the vacuum evaporation apparatus so that a surface of the substrate on which the first electrode 901 was formed faced downward. In this example, the hole-injection layer 911, the hole-transport layer 912, the light-emitting layer 913, the electron-transport layer 914, and the electron-injection layer 915, which are included in the EL layer 902, are sequentially formed by a vacuum evaporation method.

After the pressure in the vacuum evaporation apparatus was reduced to 1×10⁻⁴ Pa, 1,3,5-tri(dibenzothiophen-4-yl)benzene (abbreviation: DBT3P-II) and molybdenum oxide were deposited by co-evaporation with a weight ratio of DBT3P-II to molybdenum oxide being 2:1, so that the hole-injection layer 911 was formed on the first electrode 901. The thickness was set to 10 nm. Note that the co-evaporation is an evaporation method in which a plurality of different substances are concurrently vaporized from respective different evaporation sources.

Then, BPAFLP was deposited by evaporation to a thickness of 30 nm on the hole-injection layer 911, so that the hole-transport layer 912 was formed.

Then, on the hole-transport layer 912, 7-[4-(10-phenyl-9-anthryl)phenyl]-7H-dibenzo[c,g]carbazole (cgDBCzPA), and N,N'-bis(3-methylphenyl)-N,N'-bis[3-(9-phenyl-9H-fluoren-9-yl)phenyl]pyrene-1,6-diamine (1,6mMemFLPA-Prn) were deposited by co-evaporation with a weight ratio of cgDBCzPA to 1,6mMemFLPAPrn being 1:0.03, so that the light-emitting layer 913 was formed. Note that the thickness was set to 15 nm.

Next, 7-[4-(10-phenyl-9-anthryl)phenyl]-7H-dibenzo[c,g]carbazole (cgDBCzPA) was formed to a thickness of 20 nm on the light-emitting layer 913, and 2,9-bis(naphthalen-2-yl)-4,7-diphenyl-1,10-phenanthroline (abbreviation: NBPhen) was deposited by evaporation to a thickness of 15 nm thereon, so that the electron-transport layer 914 was formed.

Furthermore, lithium oxide was deposited by evaporation to a thickness of 0.1 nm on the electron-transport layer 914, copper phthalocyanine (CuPc) was then deposited by evaporation to a thickness of 2 nm, and 1,3,5-tri(dibenzothiophen-4-yl)benzene (abbreviation: DBT3P-II) and molybdenum oxide were deposited by co-evaporation to a thickness of 60 nm with a weight ratio of DBT3P-II to molybdenum oxide being 2:1, so that the electron-injection layer 915 was formed.

Finally, aluminum was deposited by evaporation to a thickness of 200 nm on the electron-injection layer 915, so that the second electrode 903 functioning as a cathode was formed. Thus, the light-emitting element 9 was fabricated. Note that in all the above evaporation steps, evaporation was performed by a resistance-heating method.

The thickness of each layer in the light-emitting element 9 was determined to obtain the minimum front luminance. This relatively increases the luminance derived from a transition dipole moment having a component in a direction perpendicular to the light-emitting layer 913, and facilitates the measurement of the light emission.

<<Polarization Measurement>>

Measurements will be described next. A multi-channel spectrometer (PMA-12 produced by Hamamatsu Photonics K.K.) was used as a detector. A polarizer produced by Edmund Optics Inc. was placed on the optical path from the light-emitting element 9 to the detector, so that only a component parallel to the observation direction reached the detector. The light that had passed through the polarizer was detected in PMA-12 (multi-channel spectrometer produced by Hamamatsu Photonics K.K.) and an emission spectrum was obtained. At this time, the substrate was rotated angle by angle from 0° to 80° with the front of the emission surface of the substrate set to 0°, the emission spectrum at each angle was measured, and the integrated intensity of the spectrum was plotted.

<<Calculation (Simulation)>>

Calculation will be described next. The calculation was performed using an organic device simulator "setfos" developed by Cybernet Systems Corporation. Fitting was performed while the stacked structure of an element, the film thickness, the refractive index n and extinction coefficient k of each layer, the emission position, and the emission spectrum were set as parameters and the degree of transition dipole moment orientation of a light-emitting molecule was set as a variable parameter (parameter a described later). Note that the emission position was assumed to be in the vicinity of the interface between the hole-transport layer and the light-emitting layer. The thickness of each layer was obtained from the value of a quartz oscillator (rate monitor) in an evaporation apparatus at the time of fabricating the samples, and the refractive index n and the extinction coefficient k were obtained from the analysis results of spectroscopic ellipsometry. The emission spectrum was obtained by photoluminescence (PL) measurement of a thin film.

The degree of transition dipole moment orientation is defined as the parameter a. That is, the parameter a indicates the proportion of a component perpendicular to a light-emitting layer in the transition dipole moment in the total components perpendicular and parallel to the light-emitting layer. The transition dipole moment includes only the component perpendicular to the light-emitting layer when a=1, whereas it includes only the component parallel to the light-emitting layer when a=0. The transition dipole moment of molecules isotropically oriented has the same component in the x direction, the y direction, and the z direction which are orthogonal to one another; in that case, a=0.33.

<<Fitting of Measured Results and Calculation (Simulation)>>

Figure 29:
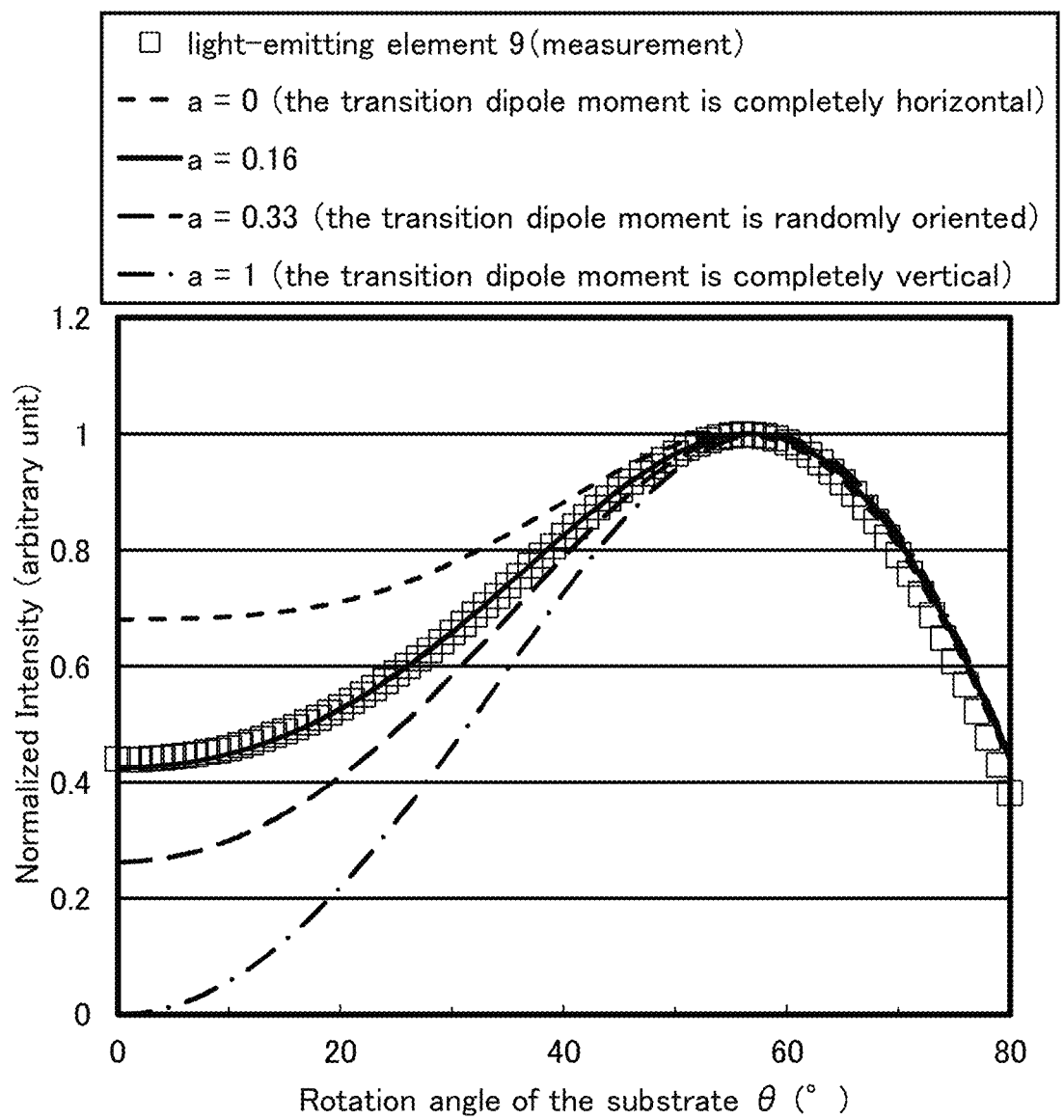
FIG. 29 shows the angular dependence of the light-emitting element 9 and the calculation result.

FIG. 29 shows the plotted values of measured angular dependence and the calculation results where a=0 (the transition dipole moment is completely horizontal), a=0.16, a=0.33 (the transition dipole moment is randomly oriented), and a=1 (the transition dipole moment is completely vertical). The calculation results where 84% of the transition dipole moment component is a component in a direction parallel to the light-emitting layer and 16% thereof is a component in a vertical direction (a=0.16) were almost equivalent to the plotted values of measured angular dependence. This leads to the assumption that 84% of the transition dipole moment component of emission molecules included in the light-emitting layer 913 of the light-emitting element 9 is in a direction parallel to the light-emitting layer 913, i.e., most of the transition dipole moment is deviated from the direction perpendicular to the light-emitting layer.

The above results show that the emission molecules in the light-emitting layer are oriented not randomly but strongly. These strongly oriented emission molecules probably cause a relatively high emission efficiency of the light-emitting element of one embodiment of the present invention. Hence, in the light-emitting element of one embodiment of the present invention, in the case where the transition dipole moment of the light-emitting material (the guest material in this example) is divided into a component parallel to the light-emitting layer and a component perpendicular to the light-emitting layer, the proportion of the component parallel to the light-emitting layer is preferably higher than or equal to 80% and lower than or equal to 100%.

This application is based on Japanese Patent Application serial No. 2015-234485 filed with Japan Patent Office on Dec. 1, 2015, and Japanese Patent Application serial No. 2016-051071 filed with Japan Patent Office on Mar. 15, 2016, the entire contents of which are hereby incorporated by reference.

EXPLANATION OF REFERENCE

100: EL layer 101: electrode 101a: conductive layer 101b: conductive layer 102: electrode 103: electrode 103a: conductive layer 103b: conductive layer 104: electrode 104a: conductive layer 104b: conductive layer 111: hole-injection layer 112: hole-transport layer 113: electron-transport layer 114: electron-injection layer 115: charge-generation layer 116: hole-injection layer 117: hole-transport layer 118: electron-transport layer 119: electron-injection layer 123B: light-emitting layer 123G: light-emitting layer 123R: light-emitting layer 130: light-emitting layer 131: host material 132: guest material 140: partition wall 150: light-emitting element 160: light-emitting layer 170: light-emitting layer 170b: light-emitting layer 180: observation direction of detector 181: transition dipole moment component 182: transition dipole moment component 183: transition dipole moment component 185: detector 200: substrate 220: substrate 221B: region 221G: region 221R: region 222B: region 222G: region 222R: region 223: light-blocking layer 224B: optical element 224G: optical element 224R: optical element 250: light-emitting element 252: light-emitting element 254: light-emitting element 400: EL layer 401: electrode 402: electrode 411: hole-injection layer 412: hole-transport layer 413: electron-transport layer 414: electron-injection layer 416: hole-injection layer 417: hole-transport layer 418: electron-transport layer 419: electron-injection layer 420: light-emitting layer 421: host material 422: guest material 430: light-emitting layer 431: host material 431_1: organic compound 431_2: organic compound 432: guest material 441: light-emitting unit 442: light-emitting unit 445: charge-generation layer 450: light-emitting element 452: light-emitting element 801: pixel circuit 802: pixel portion 804: driver circuit portion 804a: scan line driver circuit 804b: signal line driver circuit 806: protection circuit 807: terminal portion 852: transistor 854: transistor 862: capacitor 872: light-emitting element 900: substrate 901: first electrode 902: EL layer 903: second electrode 911: hole-injection layer 912: hole-transport layer 913: light-emitting layer 914: electron-transport layer 915: electron-injection layer 2000: touch panel 2001: touch panel 2501: display device 2502R: pixel 2502t: transistor 2503c: capacitor 2503g: scan line driver circuit 2503t: transistor 2509: FPC 2510: substrate 2510a: insulating layer 2510b: flexible substrate 2510c: adhesive layer 2511: wiring 2519: terminal 2521: insulating layer 2528: partition wall 2550R: light-emitting element 2560: sealing layer 2567BM: light-blocking layer 2567p: anti-reflective layer 2567R: coloring layer 2570: substrate 2570a: insulating layer 2570b: flexible substrate 2570c: adhesive layer 2580R: light-emitting module 2590: substrate 2591: electrode 2592: electrode 2593: insulating layer 2594: wiring 2595: touch sensor 2597: adhesive layer 2598: wiring 2599: adhesive layer 2601: pulse voltage output circuit 2602: current sensing circuit 2603: capacitor 2611: transistor 2612: transistor 2613: transistor 2621: electrode 2622: electrode 8000: display module 8001: upper cover 8002: lower cover 8003: FPC 8004: touch sensor 8005: FPC 8006: display device 8009: frame 8010: printed board 8011: battery 8501: lighting device 8502: lighting device 8503: lighting device 8504: lighting device 9000: housing 9001: display portion 9003: speaker 9005: operation key 9006: connection terminal 9007: sensor 9008: microphone 9050: operation button 9051: information 9052: information 9053: information 9054: information 9055: hinge 9100: portable information terminal 9101: portable information terminal 9102: portable information terminal 9200: portable information terminal 9201: portable information terminal

The invention claimed is:

1. A light-emitting element comprising:
an anode;
a cathode; and
an EL layer between the anode and the cathode,
wherein the EL layer includes a light-emitting layer and an electron-transport layer in contact with the light-emitting layer,
wherein the light-emitting layer includes a host material,
wherein the electron-transport layer includes a first material,
wherein a LUMO level of the first material is lower than a LUMO level of the host material, and
wherein a difference between an energy of a peak wavelength of a fluorescence of the host material and an energy of a peak wavelength of a phosphorescence of the host material is greater than 0.2 eV.

2. The light-emitting element according to claim 1, wherein the difference between the energy of the peak wavelength of the fluorescence of the host material and the energy of the peak wavelength of the phosphorescence of the host material is greater than or equal to 0.5 eV.

3. The light-emitting element according to claim 1, wherein the first material is a substance including a pyrazine skeleton or a pyrimidine skeleton.

4. The light-emitting element according to claim 1, further comprising a hole-transport layer in contact with the light-emitting layer,
wherein the hole-transport layer includes a second material, and
wherein a LUMO level of the second material is higher than the LUMO level of the host material.

5. The light-emitting element according to claim 1, further comprising a hole-transport layer in contact with the light-emitting layer,
wherein the hole-transport layer includes a second material, and
wherein a triplet excitation energy of the second material is higher than the triplet excitation energy of the substance that has the highest triplet excitation energy among the materials contained in the light-emitting layer by greater than or equal to 0.2 eV.

6. The light-emitting element according to claim 1, further comprising a fluorescent material.

7. The light-emitting element according to claim 6,
wherein a triplet excitation energy of the fluorescent material is higher than a triplet excitation energy of the host material.

8. The light-emitting element according to claim 6,
wherein a LUMO level of the fluorescent material is higher than or equal to the LUMO level of the host material.

9. The light-emitting element according to claim 1,
wherein the light-emitting layer emits blue light.

10. The light-emitting element according to claim 1,
wherein the LUMO level of the first material is lower than the LUMO level of the host material by greater than or equal to 0.05 eV.

11. The light-emitting element according to claim 1,
wherein the first material is a substance including a diazine skeleton or a triazine skeleton.

12. A light-emitting element comprising:
an anode;
a cathode; and
an EL layer between the anode and the cathode,
wherein the EL layer includes a light-emitting layer, an electron-transport layer in contact with the light-emitting layer, and a hole-injection layer,
wherein the light-emitting layer includes a host material,
wherein the electron-transport layer includes a first material,
wherein the hole-injection layer comprises a substance including a halogen group,
wherein a LUMO level of the first material is lower than a LUMO level of the host material, and
wherein a difference between a triplet excitation energy of the host material and a singlet excitation energy of the host material is greater than 0.2 eV.

13. The light-emitting element according to claim 12,
wherein the difference between the triplet excitation energy of the host material and the singlet excitation energy of the host material is greater than or equal to 0.5 eV.

14. The light-emitting element according to claim 12,
wherein the first material is a substance including a diazine skeleton or a triazine skeleton.

15. The light-emitting element according to claim 12,
wherein the first material is a substance including a pyrazine skeleton or a pyrimidine skeleton.

16. A light-emitting element comprising:
an anode;
a cathode; and
an EL layer between the anode and the cathode,
wherein the EL layer includes a light-emitting layer, an electron-transport layer in contact with the light-emitting layer, and a hole-injection layer,
wherein the light-emitting layer includes a host material,
wherein the electron-transport layer includes a first material,
wherein the hole-injection layer comprises a substance including a cyano group,
wherein a LUMO level of the first material is lower than a LUMO level of the host material, and
wherein a difference between a triplet excitation energy of the host material and a singlet excitation energy of the host material is greater than 0.2 eV.

17. The light-emitting element according to claim 16,
wherein the difference between the triplet excitation energy of the host material and the singlet excitation energy of the host material is greater than or equal to 0.5 eV.

18. The light-emitting element according to claim 16,
wherein the first material is a substance including a diazine skeleton or a triazine skeleton.

19. The light-emitting element according to claim 16,
wherein the first material is a substance including a pyrazine skeleton or a pyrimidine skeleton.

20. The light-emitting element according to claim 16,
wherein the first material is a substance including a diazine skeleton or a triazine skeleton.

* * * * *